(12) United States Patent
Lee et al.

(10) Patent No.: US 9,183,910 B2
(45) Date of Patent: Nov. 10, 2015

(54) SEMICONDUCTOR MEMORY DEVICES FOR ALTERNATELY SELECTING BIT LINES

(71) Applicants: Yun-Sang Lee, Yongin-si (KR); Dong-Seok Kang, Seoul (KR); Sang-Beom Kang, Hwaseong-si (KR); Chan-Kyung Kim, Hwaseong-si (KR); Chul-Woo Park, Yongin-si (KR); Dong-Hyun Sohn, Hwaseong-si (KR); Hyung-Rok Oh, Yongin-si (KR)

(72) Inventors: Yun-Sang Lee, Yongin-si (KR); Dong-Seok Kang, Seoul (KR); Sang-Beom Kang, Hwaseong-si (KR); Chan-Kyung Kim, Hwaseong-si (KR); Chul-Woo Park, Yongin-si (KR); Dong-Hyun Sohn, Hwaseong-si (KR); Hyung-Rok Oh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 179 days.

(21) Appl. No.: 13/907,223

(22) Filed: May 31, 2013

(65) Prior Publication Data

US 2013/0322162 A1 Dec. 5, 2013

(30) Foreign Application Priority Data

May 31, 2012 (KR) .................. 10-2012-0058810

(51) Int. Cl.
*G11C 11/16* (2006.01)
*G11C 7/12* (2006.01)

(52) U.S. Cl.
CPC .............. *G11C 11/1653* (2013.01); *G11C 7/12* (2013.01); *G11C 11/16* (2013.01)

(58) Field of Classification Search
CPC ........ G11C 11/1653; G11C 11/16; G11C 7/12
USPC ............................................ 365/158
See application file for complete search history.

(56) References Cited

U.S. PATENT DOCUMENTS

| | | | |
|---|---|---|---|
| 6,111,781 | A | 8/2000 | Naji |
| 6,625,081 | B2 | 9/2003 | Roohparvar et al. |
| 6,775,170 | B2 | 8/2004 | Lee et al. |
| 7,006,404 | B1 * | 2/2006 | Manapat et al. ......... 365/189.14 |
| 7,088,608 | B2 | 8/2006 | DeHerrera et al. |
| 7,190,632 | B2 | 3/2007 | Lee |
| 7,352,649 | B2 | 4/2008 | Vo et al. |
| 7,406,572 | B1 | 7/2008 | Nguyen |
| 7,480,202 | B2 | 1/2009 | Vo et al. |
| 7,518,897 | B2 | 4/2009 | Nozieres et al. |

(Continued)

FOREIGN PATENT DOCUMENTS

| | | |
|---|---|---|
| JP | 2004086952 | 3/2004 |
| JP | 2006004479 | 1/2006 |

(Continued)

*Primary Examiner* — Son Dinh
*Assistant Examiner* — Jerome Leboeuf
(74) *Attorney, Agent, or Firm* — Volentine & Whitt, PLLC

(57) ABSTRACT

A semiconductor memory device includes a cell array including one or more bank groups, where each of the one or more bank groups includes a plurality of banks and each of the plurality of banks includes a plurality of spin transfer torque magneto resistive random access memory (STT-MRAM) cells. The semiconductor memory device further includes a source voltage generating unit for applying a voltage to a source line connected to the each of the plurality of STT-MRAM cells, and a command decoder for decoding a command from an external source in order to perform read and write operations on the plurality of STT-MRAM cells. The command includes a combination of at least one signal of a row address strobe (RAS), a column address strobe (CAS), a chip selecting signal (CS), a write enable signal (WE), and a clock enable signal (CKE).

18 Claims, 62 Drawing Sheets

(56) References Cited

U.S. PATENT DOCUMENTS

| | | | |
|---|---|---|---|
| 7,616,504 B2 | 11/2009 | Vo et al. | |
| 7,646,628 B2 * | 1/2010 | Sakimura et al. | 365/158 |
| 7,663,959 B2 | 2/2010 | Tao et al. | |
| 7,716,411 B2 | 5/2010 | Panabaker et al. | |
| 2002/0129190 A1 | 9/2002 | Roohparvar | |
| 2004/0001351 A1 | 1/2004 | Subramanian et al. | |
| 2004/0004856 A1 * | 1/2004 | Sakimura et al. | 365/158 |
| 2004/0141364 A1 | 7/2004 | Perner et al. | |
| 2004/0160811 A1 | 8/2004 | Tsuchida | |
| 2004/0165447 A1 | 8/2004 | Roohparvar | |
| 2005/0002235 A1 | 1/2005 | Kaneda | |
| 2006/0083045 A1 * | 4/2006 | Kamoshida et al. | 365/63 |
| 2006/0289970 A1 | 12/2006 | Gogl et al. | |
| 2008/0126604 A1 * | 5/2008 | Kim et al. | 710/22 |
| 2009/0010044 A1 * | 1/2009 | Sakimura et al. | 365/158 |
| 2010/0034015 A1 | 2/2010 | Tsuji | |
| 2010/0064100 A1 | 3/2010 | Bains | |
| 2010/0070694 A1 | 3/2010 | Chin | |
| 2010/0077244 A1 | 3/2010 | Nowak et al. | |
| 2010/0157715 A1 | 6/2010 | Pyeon | |
| 2010/0161877 A1 | 6/2010 | Pyeon | |
| 2010/0177582 A1 | 7/2010 | Kim et al. | |
| 2010/0226162 A1 | 9/2010 | Madan et al. | |
| 2010/0251543 A1 | 10/2010 | Hoang | |
| 2011/0058440 A1 | 3/2011 | Smith et al. | |
| 2013/0148429 A1 * | 6/2013 | Kim et al. | 365/185.18 |

FOREIGN PATENT DOCUMENTS

| | | |
|---|---|---|
| JP | 2006019009 | 1/2006 |
| JP | 2007250101 | 9/2007 |
| KR | 1990086099 A | 12/1999 |
| KR | 20020006556 A | 1/2002 |
| KR | 0400120 | 9/2003 |
| KR | 20040054936 A | 6/2004 |
| KR | 2005009763 A | 1/2005 |
| KR | 20080049625 A | 6/2008 |
| KR | 20090027792 A | 3/2009 |
| KR | 20090070122 A | 7/2009 |
| KR | 20100005585 A | 1/2010 |
| KR | 20100022788 A | 3/2010 |

* cited by examiner

FIG. 24B
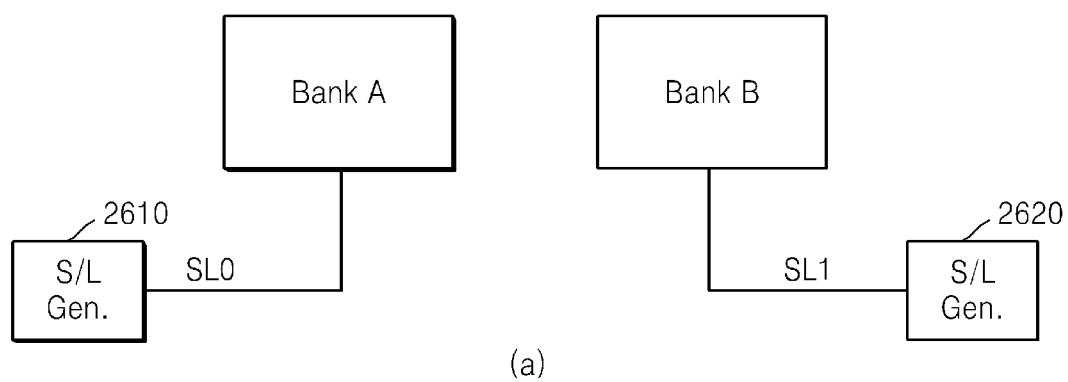
(a)
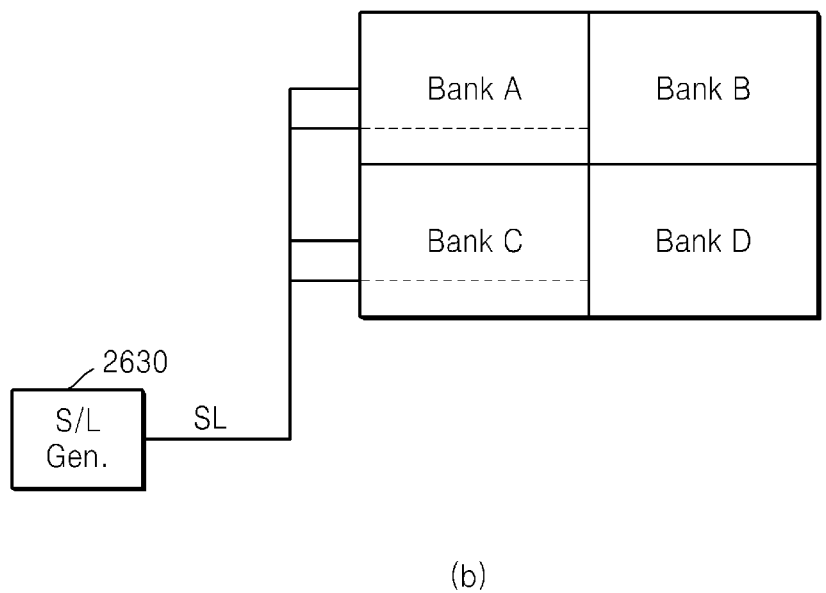
(b)

FIG. 49A
(×4/8)
|   | 1 | 2 | 3 | 4 | 5 | 6 | 7 | 8 | 9 |
|---|---|---|---|---|---|---|---|---|---|
| A | O | O | O | + | + | + | O | O | O |
| B | O | O | O | + | + | + | O | O | O |
| C | O | O | O | + | + | + | O | O | O |
| D | O | O | O | + | + | + | O | O | O |
| E | O | O | O | + | + | + | O | O | O |
| F | O | O | O | + | + | + | O | O | O |
| G | O | O | O | + | + | + | O | O | O |
| H | O | O | O | + | + | + | O | O | O |
| J | O | O | O | + | + | + | O | O | O |
| M | O | O | O | + | + | + | O | O | O |
| N | O | O | O | + | + | + | O | O | O |
 Populated ball
 Ball not populated

FIG. 49B (×16)

|   | 1 | 2 | 3 | 4 | 5 | 6 | 7 | 8 | 9 |
|---|---|---|---|---|---|---|---|---|---|
| A | ○ | ○ | ○ | + | + | + | ○ | ○ | ○ |
| B | ○ | ○ | ○ | + | + | + | ○ | ○ | ○ |
| C | ○ | ○ | ○ | + | + | + | ○ | ○ | ○ |
| D | ○ | ○ | ○ | + | + | + | ○ | ○ | ○ |
| E | ○ | ○ | ○ | + | + | + | ○ | ○ | ○ |
| F | ○ | ○ | ○ | + | + | + | ○ | ○ | ○ |
| G | ○ | ○ | ○ | + | + | + | ○ | ○ | ○ |
| H | ○ | ○ | ○ | + | + | + | ○ | ○ | ○ |
| J | ○ | ○ | ○ | + | + | + | ○ | ○ | ○ |
| K | ○ | ○ | ○ | + | + | + | ○ | ○ | ○ |
| L | ○ | ○ | ○ | + | + | + | ○ | ○ | ○ |
| M | ○ | ○ | ○ | + | + | + | ○ | ○ | ○ |
| N | ○ | ○ | ○ | + | + | + | ○ | ○ | ○ |
| P | ○ | ○ | ○ | + | + | + | ○ | ○ | ○ |
| R | ○ | ○ | ○ | + | + | + | ○ | ○ | ○ |
| T | ○ | ○ | ○ | + | + | + | ○ | ○ | ○ |

○ Populated ball

+ Ball not populated

FIG. 50

|   | 1 | 2 | 3 |
|---|---|---|---|
| A | VSS | VDD | NC |
| B | VSS | VSSQ | DQ0 |
| C | VDDQ | DQ2 | DQS |
| D | VSSQ | DQ6 | DQS# |
| E | VREFDQ | VDDQ | DQ4 |
| F | NC | VSS | RAS# |
| G | ODT | VDD | CAS# |
| H | NC | CS# | WE# |
| J | VSS | BA0 | BA2 |
| K | VDD | A3 | A0 |
| L | VSS | A5 | A2 |
| M | VDD | A7 | A9 |
| N | VSS | RESET# | A13 |

|   | 7 | 8 | 1 |
|---|---|---|---|
| A | NU, TDQS# | VSS | VDD |
| B | DM, TDQS | VSSQ | VDDQ |
| C | DQ1 | DQ3 | VSSQ |
| D | VDD | VSS | VSSQ |
| E | DQ7 | DQ5 | VDDQ |
| F | CK | VSS | NC |
| G | CK# | VDD | CKE |
| H | A10, AP | ZQ | NC |
| J | A15 | VREFCA | VSS |
| K | A12, BC# | BA1 | VDD |
| L | A1 | A4 | VSS |
| M | A11 | A6 | VDD |
| N | A14 | A8 | VSS |

FIG. 51

| | 1 | 2 | 3 | 4 | 5 | 6 | 7 | 8 | 1 | |
|---|---|---|---|---|---|---|---|---|---|---|
| A | VDD | VSSQ | NC | | | | DM_n, DB_n TDDQS_t² | VSSQ | VSS | A |
| B | VPP | VSSQ | DQS_c | | | | DQ1 | VDDQ | ZQ | B |
| C | VDDQ | DQ0 | DQS_t | | | | VSS | VSS | VDDQ | C |
| D | VSSQ | DQ4, NC² | DQ2 | | | | DQ3 | DQ5, NC² | VSSQ | D |
| E | VSS | VDDQ | DQ6, NC¹ | | | | DQ7, NC¹ | VDDQ | VSS | E |
| F | VDD | C2, ODT1 | ODT | | | | CK_t | CK_c | VDD | F |
| G | VSS | C0, CKE1 | CKE | | | | CS_n | C1, CS1_n | RFU | G |
| H | VDD | WE_n, A14 | ACT_n | | | | CAS_n, A15 | RAS_n, A16 | VSS | H |
| J | VREFCA | BG0 | A10, AP | | | | A12, BC_n | BG1 | VDD | J |
| K | VSS | BA0 | A4 | | | | A3 | BA1 | VSS | K |
| L | RESET_n | A6 | A0 | | | | A1 | A5 | ALERT_n | L |
| M | VDD | A8 | A2 | | | | A9 | A7 | VPP | M |
| N | VSS | A11 | PAR | | | | A17, NC⁴ | A13 | VDD | N |

SEMICONDUCTOR MEMORY DEVICES FOR ALTERNATELY SELECTING BIT LINES

CROSS-REFERENCE TO RELATED APPLICATIONS

A claim of priority is made to Korean Patent Application No. 10-2012-0058810, filed on May 31, 2012, in the Korean Intellectual Property Office, the disclosure of which is incorporated herein in its entirety by reference.

BACKGROUND

The inventive concept described herein generally relates to semiconductor memory devices, and to methods of operating semiconductor memory device. In some embodiments, the semiconductor memory devices include a spin transfer torque magneto resistive random access memory (STT-MRAM) cell.

A magneto resistive random access memory (MRAM), which relies on a change in polarity of a magnetic material to vary a memory cell resistance, has been proposed in effort to meet continuing demands for increased device integration and increased operating speeds.

SUMMARY

Some embodiments of the inventive concept provide a semiconductor memory device including a spin transfer torque magneto resistive random access memory (STT-MRAM) cell, in which read and write operations are performed in bank-group units and/or a pulse width of a column selecting signal is internally increased, thereby increasing a bandwidth of the semiconductor memory device.

According to an aspect of the inventive concept, a semiconductor memory device is provided which includes a cell array including one or more bank groups, where each of the one or more bank groups includes a plurality of banks and each of the plurality of banks includes a plurality of spin transfer torque magneto resistive random access memory (STT-MRAM) cells. The semiconductor memory device further includes a source voltage generating unit for applying a voltage to a source line connected to the each of the plurality of STT-MRAM cells, and a command decoder for decoding a command from an external source in order to perform read and write operations on the plurality of STT-MRAM cells. Each of the plurality of STT-MRAM cells includes a cell transistor and a magnetic tunnel junction (MTJ) device including a free layer, a tunnel layer, and a pinned layer, which are sequentially stacked with the tunnel layer between the free layer and the pinned layer. A gate of the cell transistor is connected to a word line, a first electrode of the cell transistor is connected to a bit line via the MTJ device, and a second electrode of the cell transistor is connected to the source line. The command includes a combination of at least one signal of a row address strobe (RAS), a column address strobe (CAS), a chip selecting signal (CS), a write enable signal (WE), and a clock enable signal (CKE).

According to another aspect of the inventive concept, a semiconductor memory device is provided which includes a cell array including one or more bank groups, where each of the one or more bank groups includes a plurality of banks and each of the plurality of banks includes a plurality of spin transfer torque magneto resistive random access memory (STT-MRAM) cells. The semiconductor memory device further includes a source voltage generating unit for applying a voltage to a source line connected to the each of the plurality of STT-MRAM cells, and a command decoder for decoding a command from an external source in order to perform read and write operations on the plurality of STT-MRAM cells. Each of the plurality of STT-MRAM cells includes a cell transistor and a magnetic tunnel junction (MTJ) device including a free layer, a tunnel layer, and a pinned layer, which are sequentially stacked with the tunnel layer between the free layer and the pinned layer. A gate of the cell transistor is connected to a word line, a first electrode of the cell transistor is connected to a bit line via the MTJ device, and a second electrode of the cell transistor is connected to the source line. The semiconductor memory device further includes a column decoder for selecting a column of the cell array, wherein the column decoder is divided for the respective bank groups.

According to still another aspect of the inventive concept, a semiconductor memory device is provided which includes a cell array comprising a plurality of non-volatile memory cells, a plurality of bit lines connected to the plurality of non-volatile memory cells, first and second column selectors that are connected to each of the plurality of bit lines and are respectively controlled by first and second column selecting signals, a first local input/output line that is electrically connected to the plurality of bit lines via the first column selector when the first column selecting signal is activated, and a second local input/output line that is electrically connected to the plurality of bit lines via the second column selector when the second selecting signal is activated. Whenever an external command is input, the first and second selectors are alternately selected.

According to yet another aspect of the inventive concept, a method of writing data is provided which includes, in response to an input of a write command, inputting data to be stored in a global write driver via a data input line, transmitting the data from the global write driver to first and second global input/output lines, selecting a first local write driver based on a write control signal, transmitting data to be written to a first local input/output line connected to the first local write driver, and storing the data transmitted to the first local input/output line in selected memory cells.

According to another aspect of the inventive concept, a method of reading data is provided which includes, in response to an input of a read command, selecting memory cells to be read, transmitting data stored in the memory cells to a first local input/output line, sensing data by a first read sense amplifier connected to the first input/output line, and, as the sensed data is converted into a digital signal, transmitting the digital signal to a first global input/output line.

BRIEF DESCRIPTION OF THE DRAWINGS

Exemplary embodiments of the inventive concept will become readily understood from the detailed description that follows, with reference to the accompanying drawings, in which:

FIGS. 18, 19, 20, 21, 22, 23, 24A, 24B, 25 and 26 are semiconductor chip layout diagrams showing examples of a semiconductor memory device that includes a plurality of banks, according to embodiments of the inventive concept;

FIGS. 49A and 49B show arrangements of a ball grid array (BGA) of a semiconductor memory device, according to embodiments of the inventive concept;

FIG. 50 shows signals assigned to a semiconductor memory device package;

FIG. 51 shows signals assigned to a semiconductor memory device package;

DETAILED DESCRIPTION OF THE EMBODIMENTS

Figure 1:
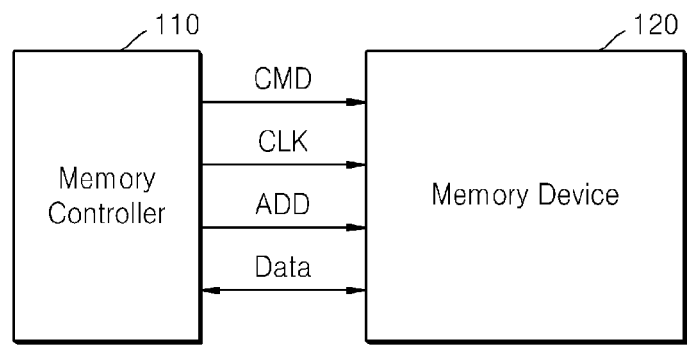
FIG. 1 is a block diagram of a semiconductor memory system according to an embodiment of the inventive concept.

The attached drawings for illustrating exemplary embodiments of the inventive concept are referred to in order to gain a sufficient understanding of the inventive concept, the merits thereof, and the objectives accomplished by the implementation of the inventive concept.

Hereinafter, the inventive concept will be described in detail by explaining exemplary embodiments of the invention with reference to the attached drawings. Like reference numerals in the drawings denote like elements. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a semiconductor memory system 100 according to an embodiment of the inventive concept. Referring to FIG. 1, the semiconductor memory system 100 includes a memory controller 110 and a semiconductor memory device 120. The memory controller 110 may transmit a command signal CMD, a clock signal CLK, and an address signal ADD to the semiconductor memory device 120 or may communicate with the semiconductor memory device 120 to transmit and receive data DATA. According to an embodiment of the inventive concept, the semiconductor memory device 120 may be a magneto resistive random access memory (MRAM) that is a non-volatile computer memory and includes a magnetic memory cell and may include a spin transfer torque magneto resistive random access memory (STT-MRAM) cell. The memory controller 110 may be a controller for controlling the MRAM and may be the same or similar as a dynamic random access memory (DRAM) controller for controlling a DRAM. In addition, the semiconductor memory system 100 may include the same or similar interface as a DRAM interface.

Figure 2:
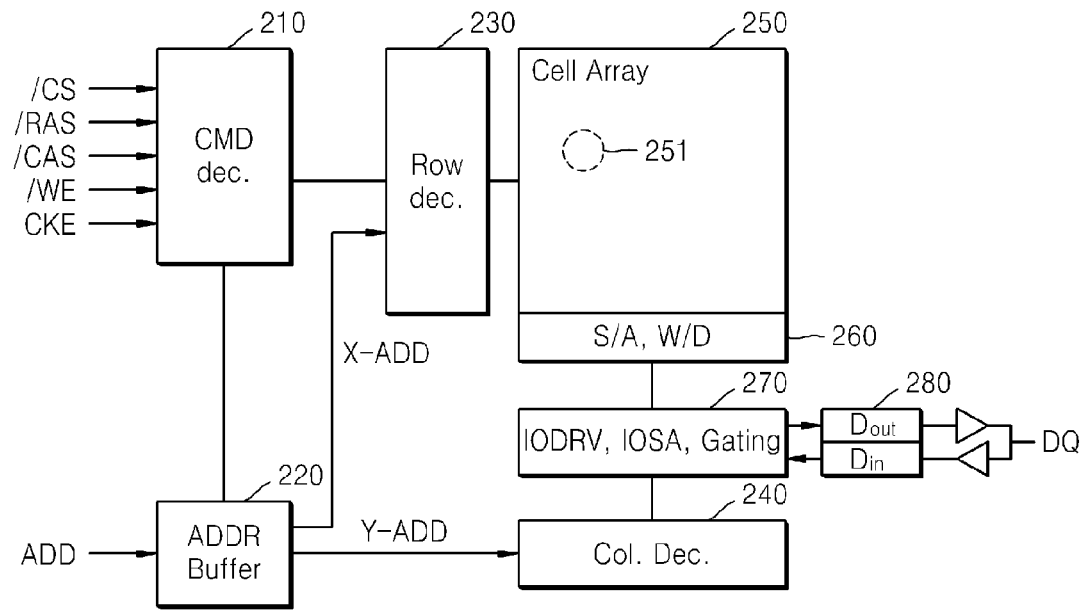
FIG. 2 is a block diagram of a semiconductor memory device according to another embodiment of the inventive concept.

FIG. 2 is a block diagram of the semiconductor memory device 120 according to another embodiment of the inventive concept. Referring to FIGS. 1 and 2, the semiconductor memory device 120 includes a command decoder 210, an address buffer 220, a row decoder 230, a column decoder 240, a cell array 250, write drive/sense amplifier 260, an input/output driver unit 270, and a data input/output unit 280.

The command decoder 210 may receive a chip select signal /CS, a row address strobe/RAS, a column address strobe/CAS, a write enable signal /WE, and a clock enable signal CKE from the memory controller 110 and may perform a decoding operation. When the decoding operation is completed, the semiconductor memory device 120 may be controlled to perform a command of the memory controller 110.

The address signal ADD transmitted from the memory controller 110 is stored in the address buffer 220. Then, the address buffer 220 transmits a row address X-ADD to the row decoder 230 and transmits a column address Y-ADD to the column decoder 240.

The row decoder 230 and the column decoder 240 may each include a plurality of switches. The row decoder 230 is switched in response to the row address X-ADD and selects a word line WL. The column decoder 240 is switched in response to the column address Y-ADD and selects a bit line BL. The cell array 250 includes memory cells 251 positioned at intersections between the word line WL and the bit line BL. For example, the memory cells 251 may each be an STT-MRAM cell (hereinafter, the memory cell 251 is referred to as the STT-MRAM cell 251).

The STT-MRAM cell 251 is a resistive memory cell having non-volatile properties. The STT-MRAM cell 251 has a relatively large resistance value or a relatively small resistance value according to written data therein.

When data is read, data voltages having different levels according to the resistance values are generated and are provided to the write drive/sense amplifier 260. The write drive/sense amplifier 260 includes a plurality of sense amplifier circuits for sensing/amplifying a data voltage and outputs a data signal of a digital level based on the data voltage. The data signal processed by the write drive/sense amplifier 260 is transmitted to the data input/output unit 280 through the input/output driver unit 270. The data input/output unit 280 outputs the transmitted data signal to the memory controller 110.

Figure 3:
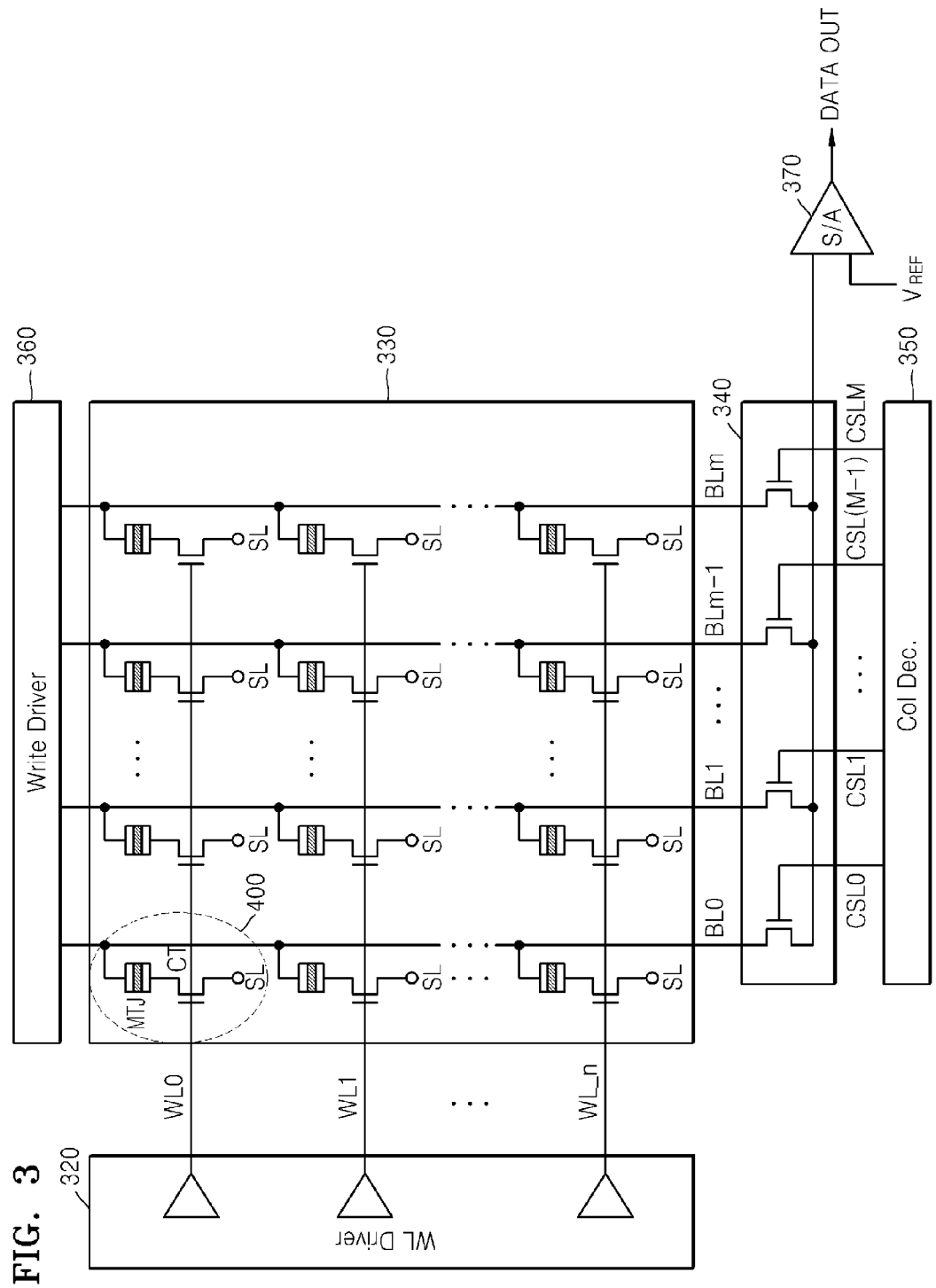
FIG. 3 is a more detailed circuit diagram of the semiconductor memory device of FIG. 2.

FIG. 3 is a detailed circuit diagram of the semiconductor memory device 120 of FIG. 2. Referring to FIG. 3, a cell array 330 includes a plurality of word lines WL0 to WLN (where N is a natural number that is equal to or greater than 1), a plurality of bit lines BL0 to BLM (where M is a natural number that is equal to or greater than 1), and a plurality of memory cells 400 disposed at intersections between the word lines WL0 to WLN and the bit lines BL0 to BLM. When the memory cells 400 are each embodied as an STT-MRAM cell, the memory cells 400 may each include a magnetic tunnel junction (MTJ) (hereinafter, referred to as an MTJ device).

The memory cells 400 may each include a cell transistor and a MTJ device. The cell transistor is switched in response to a signal output from a word line driver 320. The word line driver 320 may output a word line selection voltage for selecting one of the word lines WL0 to WLN. A unit for decoding a row address may be included in the word line driver 320, or alternatively, an address decoded by the row decoder 230 of FIG. 2 may be provided to the word line driver 320. The cell transistor and the MTJ device of each of the memory cells 400 are connected between the MTJ device and any one of the bit lines BL0 to BLM. Although not shown in FIG. 3, the memory cells 400 may be connected to a common source line SL. Alternatively, the cell array 330 may be divided into at least two cell regions and different source lines SLs may be connected to the cell regions, respectively.

The MTJ device may be replaced with a resistive device, such as a phase change random access memory (PRAM) using a phase change material, a resistive random access memory (RRAM) using a variable resistance material, such as a complex metal oxide, or a magnetic random access memory (MRAM) using a magnetic material. A resistance value of materials forming the resistive devices change according to size and/or direction of a current or voltage, and the materials have non-volatile characteristics of maintaining the resistance value even when the current or voltage is blocked.

The bit lines BL0 to BLM are connected to a write driver 360. The write driver 360 may supply a current for performing a write operation on the memory cells 400 in response to an external command.

A column decoder 350 may generate column selection signals CSL0 to CSLM and may select any one of the column selection signals CSL0 to CSLM. For example, the semiconductor memory device 120 may include a switch unit 340 including switches connected to the bit lines BL0 to BLM, respectively, and the column decoder 350 may provide the column selection signals CSL0 to CSLM to the switch unit 340. When data is read, data voltages affected by resistance values of the memory cells 400 are transmitted to a sense amplifier 370 through the bit lines BL0 to BLM. The sense amplifier 370 may sense and amplify a difference with the data voltages based on a reference voltage $V_{REF}$ and may output a digital signal DATA OUT.

Figure 4:
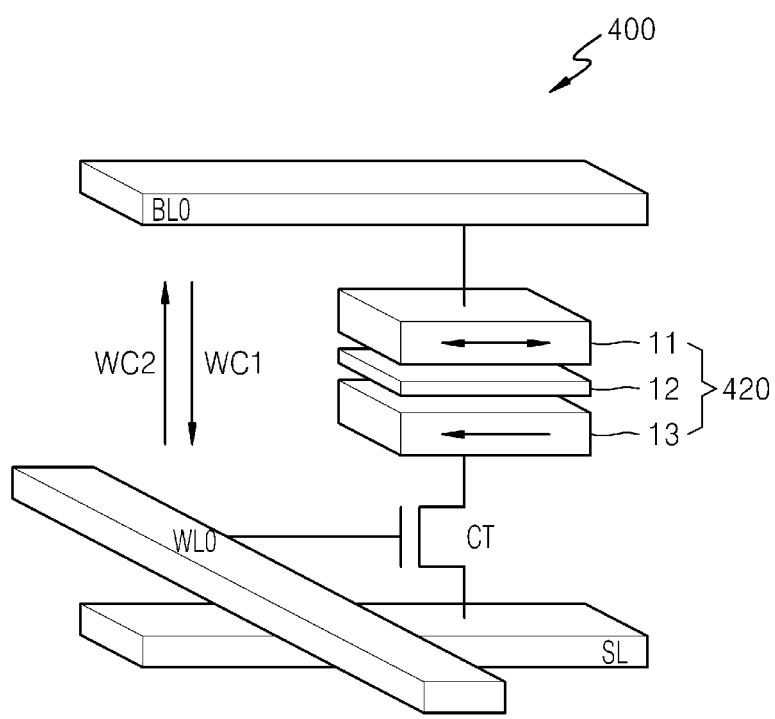
FIG. 4 is a perspective view of an example of a spin transfer torque magneto resistive random access memory (STT-MRAM) cell.

FIG. 4 is a perspective view of an example of the memory cell 400 (hereinafter, referred to as the STT_MRAM cell 400) that is a non-volatile memory cell and an STT-MRAM cell. The STT_MRAM cell 400 may include an MTJ device 420 and a cell transistor CT. A gate of the cell transistor CT may be connected to a word line, for example, a first word line WL0, and one electrode of the cell transistor CT may be connected to a bit line, for example, a first bit line BL0, through the MTJ device 420. In addition, the other electrode of the cell transistor CT is connected to the source line SL.

The MTJ device 420 may include a pinned layer 13, a free layer 11, and a tunnel layer 12 therebetween. A magnetization direction of the pinned layer 13 is fixed, and a magnetization direction of the free layer 11 may be selectively conditioned to be parallel to or anti-parallel to the magnetization direction of the pinned layer 13. In order to fix the magnetization direction of the pinned layer 13, for example, an anti-ferromagnetic layer (not shown) may be further included.

In order to perform a write operation of the STT-MRAM cell 400, a logic high voltage is applied to the word line WL0 to turn on the cell transistor CT, and write currents WC1 and WC2 are supplied between the bit line BL0 and the source line SL.

In order to perform a read operation of the STT-MRAM cell 400, a logic high voltage is applied to the word line WL0 to turn on the cell transistor CT, and a read current is supplied from the bit line BL0 toward the source line SL0 to determine data stored in the MTJ device 420 according to a measured resistance value.

Figure 5A:
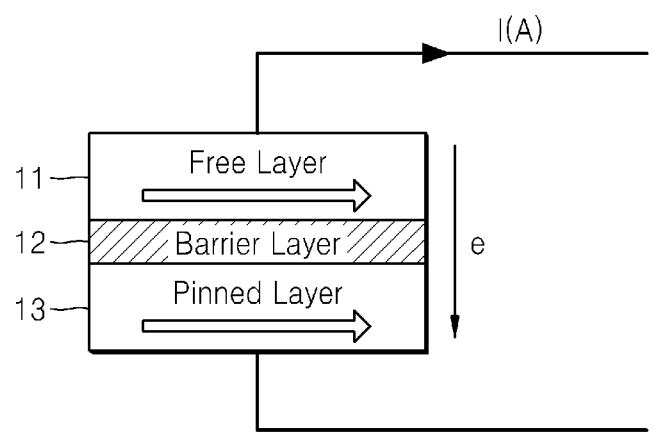
FIGS. 5A and 5B are diagrams for describing a magnetization direction and a read operation of a magnetic tunnel junction (MTJ) device, according to an embodiment of the inventive concept.
Figure 5B:
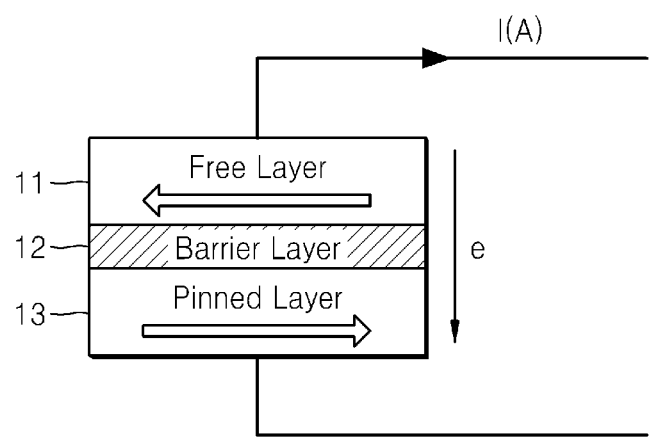

FIGS. 5A and 5B are diagrams for describing a magnetization direction and a read operation of an MTJ device, according to an embodiment of the inventive concept. A resistance value of the MTJ device varies according to the magnetization direction of the free layer 11. When a read current I(A) is supplied to the MTJ device, a data voltage according to the resistance value of the MTJ device is output. Since an intensity of the read current IA is much smaller than an intensity of each of write currents WC1 and WC2, the magnetization direction of the free layer 11 is not changed by the read current I(A).

Referring to FIG. 5A, the magnetization direction of the free layer 11 and the magnetization direction of the pinned layer 13 are parallel in the MTJ device. Thus, the MTJ device has a low resistance value. Here, data "0" may be read by supplying the read current I(A).

Referring to FIG. 5B, the magnetization direction of the free layer 11 is anti-parallel to the magnetization direction of the pinned layer 13 in the MTJ device. Here, the MTJ device has a high resistance value. In this case, data "1" may be read by supplying the read current I(A).

In FIGS. 5A and 5B, the free and pinned layers 11 and 13 of the MTJ cell 10 are shown as horizontal magnetic devices, but alternatively, the free and pinned layers 11 and 13 may be vertical magnetic devices.

Figure 6:
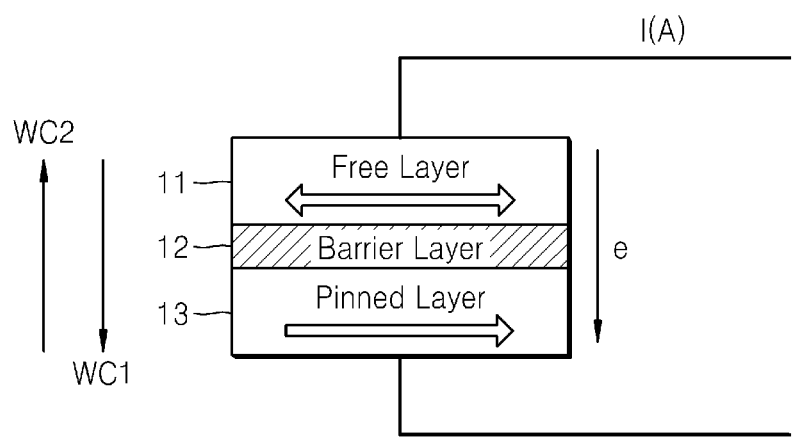
FIG. 6 is a diagram for describing a write operation of an STT-MRAM cell, according to an embodiment of the inventive concept.

FIG. 6 is a diagram for describing a write operation of an STT-MRAM cell, according to an embodiment of the inventive concept. Referring to FIG. 6, the magnetization direction of the free layer 11 may be determined according to directions of first and second write currents WC1 and WC2 flowing through the MTJ device. For example, when the first write current WC1 is supplied, free electrons having the same spin direction as the pinned layer 13 apply a torque on the free layer 11. Thus, the free layer 11 is magnetized parallel to the pinned layer 13. When the second write current WC2 is supplied, electrons having a spin opposite to the pinned layer 13 return back to the free layer 11 and apply a torque. Accordingly, the free layer 11 is magnetized anti-parallel to the pinned layer 13. In other words, the magnetization direction of the free layer 11 in the MTJ device may be changed by spin transfer torque (STT).

Figure 7A:
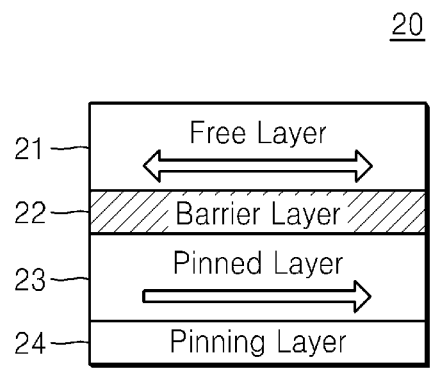
FIGS. 7A and 7B are diagrams for describing MTJ devices in an STT-MRAM, according to embodiments of the inventive concept.
Figure 7B:
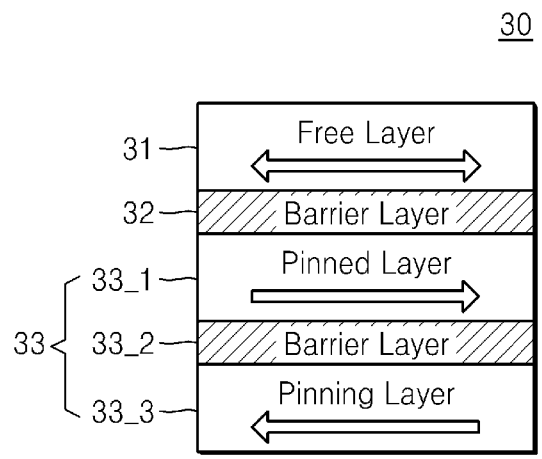

FIGS. 7A and 7B are diagrams for describing MTJ devices 20 and 30 in an STT-MRAM cell, according to embodiments of the inventive concept. An MTJ device having a horizontal magnetization direction corresponds to a case where a moving direction of a current and a magnetization easy axis are substantially perpendicular to each other.

Referring to FIG. 7A, the MTJ device 20 may include a free layer 21, a tunnel layer 22, a pinned layer 23, and a pinning layer 24.

The free layer 21 may include a material having a variable magnetization direction. The magnetization direction of the free layer 21 may change according to electric/magnetic factors provided outside and/or inside of a memory cell. The free layer 21 may include a ferromagnetic material including at least one of cobalt (Co), iron (Fe), and nickel (Ni). For example, the free layer 21 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel layer 22 may have a thickness that is smaller than a spin diffusion distance. The tunnel layer 22 may include a non-magnetic material. For example, the tunnel layer 22 may include at least one selected from the group consisting of magnesium (Mg), titanium (Ti), aluminum (Al), magnesium-zinc (MgZn), a magnesium-boron (MgB) oxide, a Ti nitride, and a vanadium (V) nitride.

The pinned layer 23 may have a magnetization direction fixed by the pinning layer 24. Also, the pinned layer 23 may include a ferromagnetic material. For example, the pinned layer 23 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The pinning layer 24 may include an anti-ferromagnetic material. For example, the pinning layer 24 may include at least one selected from the group consisting of PtMn, IrMn, MnO, MnS, MnTe, $MnF_2$, $FeCl_2$, FeO, $CoCl_2$, CoO, $NiCl_2$, NiO, and Cr.

According to another embodiment of the inventive concept, since the free layer 21 and the pinned layer 23 of the MTJ device 20 are each formed of a ferromagnetic material, a stray field may be generated at an edge of the ferromagnetic material. The stray field may decrease magnetoresistance or increase resistance magnetism of the free layer 21. Moreover, the stray field affects a switching characteristic, thereby forming asymmetrical switching. Accordingly, a unit for decreasing or controlling a stray field generated by the ferromagnetic material in the MTJ device 20 is required.

Referring to FIG. 7B, a pinned layer 33 of the MTJ device 30 may be formed of a synthetic anti-ferromagnetic (SAF) material. The pinned layer 33 may include a first ferromagnetic layer 33_1, a barrier layer 33_2, and a second ferromagnetic layer 33_3. The first and second ferromagnetic layers 33_1 and 33_3 may each include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. Here, a magnetization direction of the first ferromagnetic layer 33_1 and a magnetization direction of the second ferromagnetic layer 33_3 are different from each other, and are fixed. The barrier layer 33_2 may include ruthenium (Ru).

Figure 8:
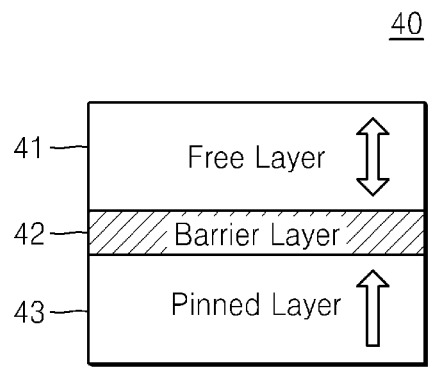
FIG. 8 is a diagram for describing an MTJ device in an STT-MRAM cell, according to another embodiment of the inventive concept.

FIG. 8 is a diagram for describing an MTJ device 40 in an STT-MRAM cell, according to another embodiment of the inventive concept. An MTJ device having a vertical magnetization direction corresponds to a case where a moving direction of a current and a magnetization easy axis are substantially parallel to each other. Referring to FIG. 8, the MTJ device 40 includes a free layer 41, a pinned layer 43, and a tunnel layer 42.

A resistance value is small when the magnetization directions of the free layer 41 and the pinned layer 43 are parallel, and is high when the magnetization directions of the free layer 41 and the pinned layer 43 are anti-parallel. Data may be stored in the MTJ device 40 according to such a resistance value.

In order to realize the MTJ device 40 having a vertical magnetization direction, the free layer 41 and the pinned layer 43 may be formed of a material having high magnetic anisotropy energy. Examples of the material having high magnetic anisotropy energy include an amorphous rear earth raw material alloy, a thin film such as (Co/Pt)n or (Fe/Pt)n, and a superlattice material having an L10 crystal structure. For example, the free layer 41 may be an ordered alloy, and may include at least any one of Fe, Co. Ni, palladium (Pa), and platinum (Pt). Alternatively, the free layer 41 may include at least any one of an Fe—Pt alloy, an Fe—Pd alloy, a Co—Pd alloy, a Co—Pt alloy, an Fe—Ni—Pt alloy, a Co—Fe—Pt alloy, and a Co—Ni—Pt alloy. The alloys above may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in terms of quantitative chemistry.

The pinned layer 43 may be an ordered alloy, and may include at least any one of Fe, Co, Ni, Pa, and Pt. For example, the pinned layer 43 may include at least any one of an Fe—Pt alloy, an Fe—Pd alloy, a Co—Pd alloy, a Co—Pt alloy, an Fe—Ni—Pt alloy, a Co—Fe—Pt alloy, and a Co—Ni—Pt alloy. These alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in terms of quantitative chemistry.

Figure 9A:
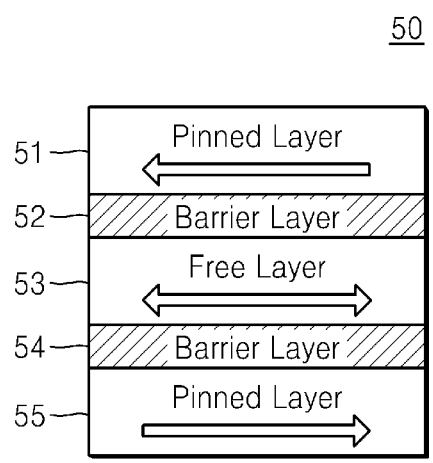
FIGS. 9A and 9B are diagrams for describing dual MTJ devices in an STT-MRAM cell, according to other embodiments of the inventive concept
Figure 9B:
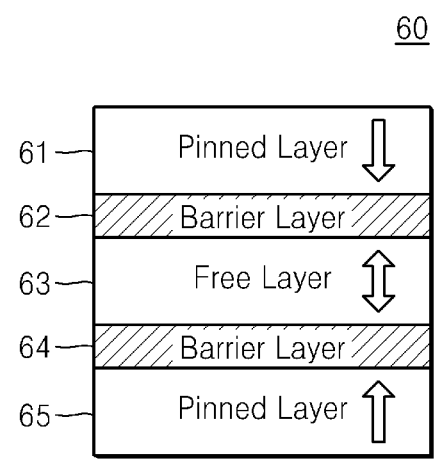

FIGS. 9A and 9B are diagrams for describing dual MTJ devices 50 and 60 in an STT-MRAM cell, according to other embodiments of the inventive concept. A dual MTJ device has a structure in which a tunnel layer and a pinned layer are disposed at two ends relative to a free layer Referring to FIG. 9A, the dual MTJ device 50 forming horizontal magnetism may include a first pinned layer 51, a first tunnel layer 52, a free layer 53, a second tunnel layer 54, and a second pinned layer 55. Materials of the first pinned layer 51, the first tunnel layer 52, the free layer 53, the second tunnel layer 54, and the second pinned layer 55 may be the same or similar as those of the free layer 21, the tunnel layer 22, and the pinned layer 23 of FIG. 7A.

In this case, when magnetization directions of the first pinned layer 51 and the second pinned layer 55 are fixed in opposite directions, magnetic forces by the first and second pinned layers 51 and 55 substantially counterbalance. Thus, the dual MTJ device 50 may perform a write operation by using a smaller current than a general MTJ device.

In addition, since the dual MTJ device 50 provides higher resistance during a read operation due to the second tunnel layer 54, an accurate data value may be obtained.

Referring to FIG. 9B, the dual MTJ device 60 forming vertical magnetism may include a first pinned layer 61, a first tunnel layer 62, a free layer 63, a second tunnel layer 64, and a second pinned layer 65. Materials of the first pinned layer 61, the first tunnel layer 62, the free layer 63, the second tunnel layer 64, and the second pinned layer 65 may be the same or similar as those of the free layer 41, the tunnel layer 42, and the pinned layer 43 of FIG. 8.

In this case, when magnetization directions of the first pinned layer 61 and the second pinned layer 65 are fixed in opposite directions, magnetic forces by the first and second pinned layers 61 and 65 substantially counterbalance. Thus, the dual MTJ device 60 may perform a write operation by using a smaller current than a general MTJ device.

FIGS. 10 through 17 are diagrams for describing examples where a bank group function is used in a semiconductor memory device including an STT-MRAM cell, according to embodiments of the inventive concept. In the semiconductor memory device, two or more banks are grouped and operations may be performed in group units. In this case, since each bank group operates as a separate memory device, a write operation and a read operation may be performed at a high speed.

In order to overcome the limitation of an access speed of an STT-MRAM cell and to overcome a bandwidth of data transmitted out of the semiconductor memory device, the semiconductor memory device may adopt a bank group function.

Figure 10A:
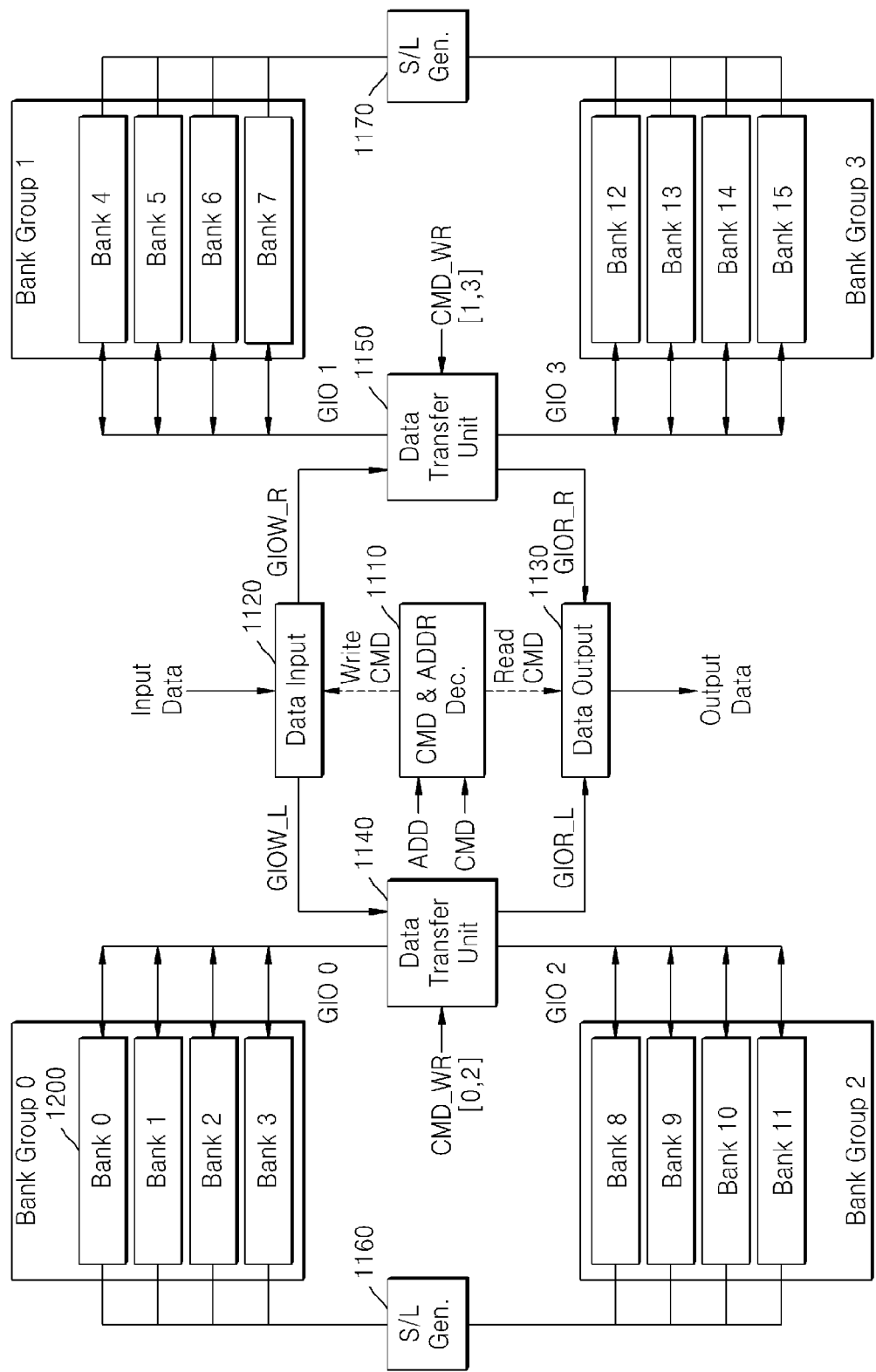
FIGS. 10A and 10B are block diagrams of a semiconductor memory device according to another embodiment of the inventive concept.

FIG. 10A is a block diagram of a semiconductor memory device 1100 according to an embodiment of the inventive concept. Referring to FIG. 10A, the semiconductor memory device 1100 includes a plurality of bank groups Bank Group 0 to Bank Group 3, a command/address decoder 1110, a data input unit 1120, a data output unit 1130, first and second data transfer units 1140 and 1150, and source voltage generating units 1160 and 1170.

The first bank group Bank Group 0 includes first through fourth banks Bank 0 to Bank 3, the second bank group Bank Group 1 includes fifth through eighth banks Bank 4 to Bank 7, the third bank group Bank Group 2 includes ninth through twelfth Bank 8 to Bank 11, and the fourth bank group Bank Group 3 includes thirteenth through sixteenth banks Bank 12 through Bank 15.

One or more banks may be defined as a single bank group. For example, banks that share a column decoder may be defined as a single bank group. In addition, banks belonging to a single bank group may share a data input/output line. As shown in FIG. 10A, a plurality of banks included in a single bank group may share a global line for inputting and outputting data. Global lines GIO 0 to GIO 3 are connected to the bank groups Bank Group 0 to Bank Group 3, respectively.

The command/address decoder 1110 may perform a read operation for each respective bank group in response to a read command Read CMD received from an external source. In this case, the first and second data transferring units 1140 and 1150 may receive data from global lines, respectively, and may transmit the data to the data output unit 1130 through data output global lines GIOR_L and GIOR_R, respectively. The data output unit 1130 may output the data to the outside.

In addition, the command/address decoder 1110 may perform a write operation for each respective bank group in response to a write command Write CMD received from an external source. When data is input to the data input unit 1120, the data is transmitted to the data transferring units 1140 and 1150 through data input global lines GIOW_L and GIOR_R, respectively. Then, the data transferring units 1140 and 1150 transmit the data to a global line connected to a bank group that is subject to a write operation.

The data transferring units 1140 and 1150 may control the read operation or the write operation and, in particular, may control transmission of data for each respective bank group. For example, the first data transferring unit 1140 may control transmission of data in response to a read/write command CMD_WR[0,2] that is related to the first and third bank groups Bank Group 0 and Bank Group 2. In addition, the data transferring unit 1150 controls transmission of data in response to a read/write command CMD_WR[1,3] that is related to the second and fourth bank groups Bank Group 1 and Bank Group 3.

The source voltage generating units 1160 and 1170 apply a voltage to a source line of a plurality of STT-MRAM cells included in each bank. Although not shown in FIG. 10A, a source line may be shared by a plurality of cells or a plurality of banks, or may be shared by a plurality of bank groups. Alternatively, a plurality of source lines may be electrically disconnected from each other and may be connected to different banks or different bank groups, respectively.

Each of the source voltage generating units 1160 and 1170 applies a source voltage to one or more bank groups. FIG. 10A illustrates a case where a source voltage is generated by the source voltage generating units 1160 and 1170 included in the semiconductor memory device 1100. Alternatively, the source voltage may be applied from an external source through a separate power pad PAD.

In FIG. 10A, a bank group including one or more banks is defined. However, the inventive concept is not limited thereto. For example, the semiconductor memory device 1100 may include one or more MRAM chips and may use a rank RANK that is a combination of MRAM chips to which the same command, the same bank address, and the same address are input. The rank (RANK) may be classified based on a chip selection signal CS. In addition, a single MRAM chip may be defined as two or more ranks RANK.

Figure 10B:
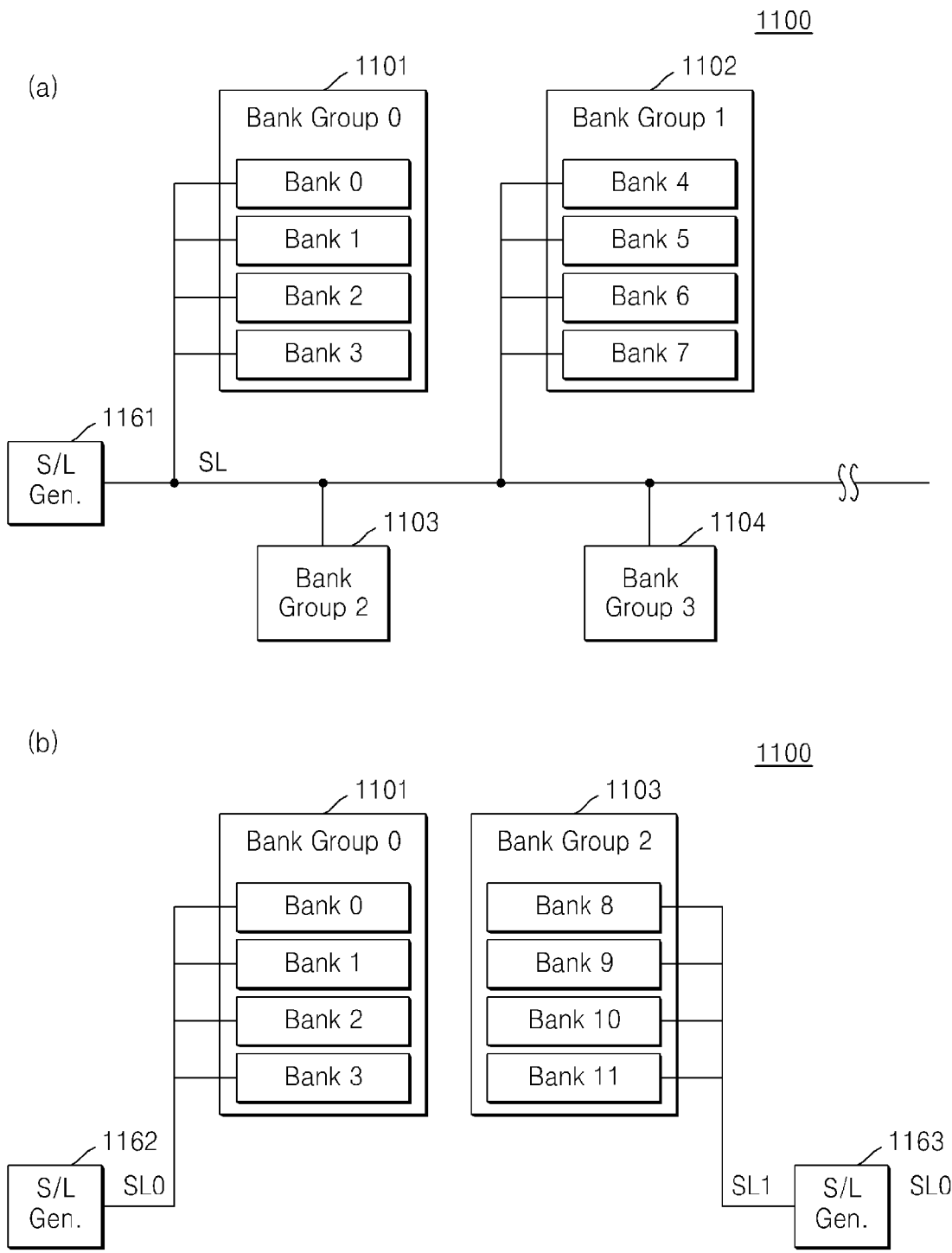

FIG. 10B shows arrangements of bank groups and source lines, according to various embodiments of the inventive concept. As shown in diagram (a) of FIG. 10B, the semiconductor memory device 1100 includes a plurality of bank groups 1101 to 1104 that are connected to a common source line SL and receive a source voltage. The semiconductor memory device 1100 may include a source voltage generating unit 1161 that is shared by the bank groups 1101 to 1104.

Diagram (b) of FIG. 10B shows a case where first and third bank groups 1101 and 1102 are connected to first and second source lines SL0 and SL1, respectively. For example, the first bank group 1101 is connected to the first source line SL0, and the third bank group 1102 is connected to the second source line SL1. When the first and second source lines SL0 and SL1 are separated from each other, source voltage generating units for applying source lines may be separately arranged. For example, as shown in diagram (b) of FIG. 10B, source voltages may be applied from first and second source voltage generating units 1162 and 1163 to the first and second source lines SL0 and SL1, respectively.

Figure 11:
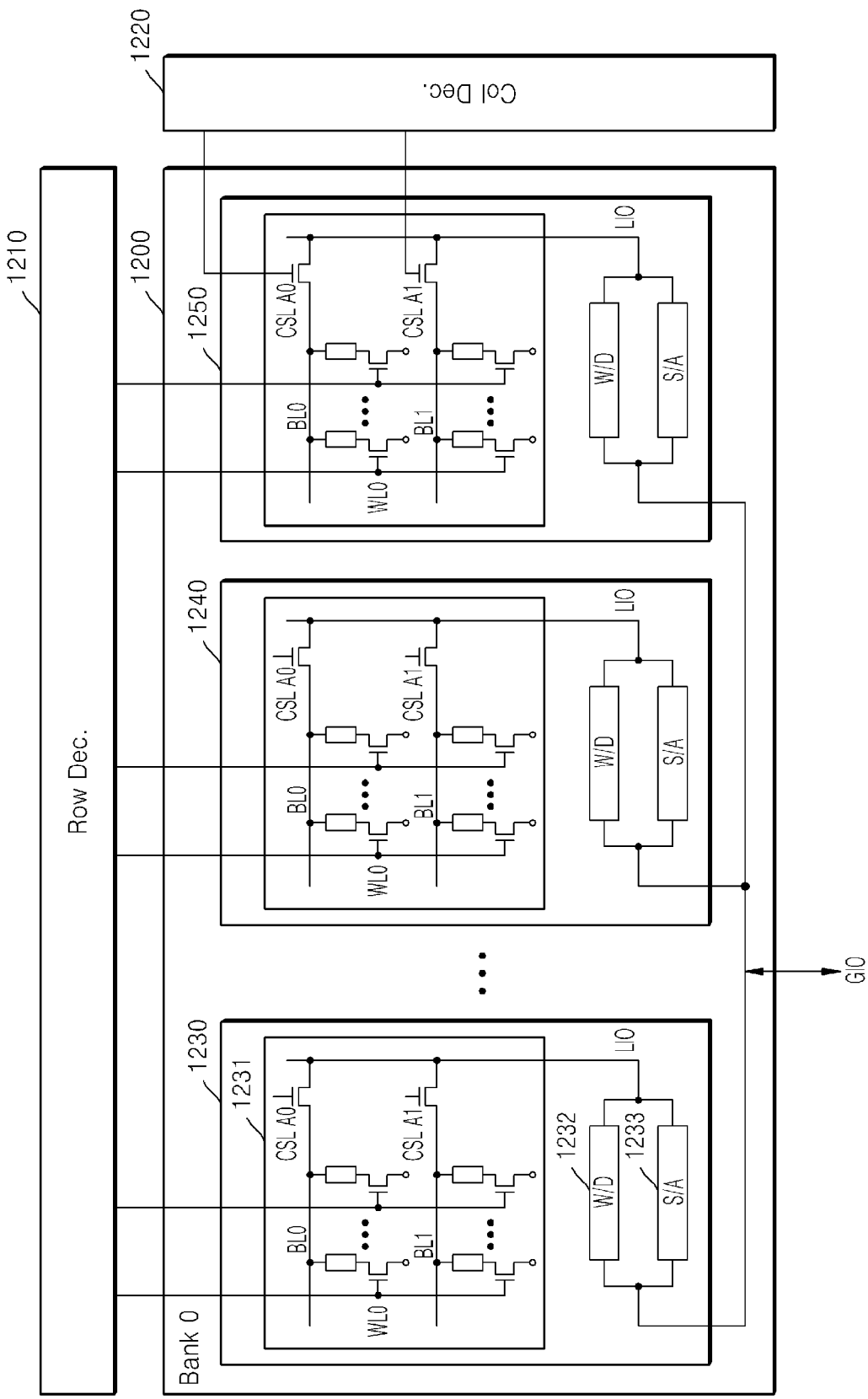
FIG. 11 is a block diagram showing an example of a bank of FIG. 10A, according to an embodiment of the inventive concept.

FIG. 11 is a block diagram of a bank 1200 that is an example of a bank of FIG. 10A, according to an embodiment of the inventive concept. A bank refers to a group of memory cells that independently operate in order for a semiconductor memory device to perform an operation at a high speed. Memory cells in a single bank may share a data bus and/or may share an address and a control signal line. In addition, the bank may include one or more memory blocks.

Referring to FIG. 11, memory cells in the bank 1200 may be selected by a row decoder 1210 for selecting a word line and a column decoder 1220 for selecting a bit line. The bank 1200 may include a plurality of memory blocks, for example, first, second, and third memory blocks 1230, 1240, and 1250. Each memory block, for example, the first memory block 1230, may include a cell array 1231 including STT-MRAM cells, a local write driver 1232 for writing data on an STT-MRAM cell in response to a write command, and a local sense amplifier 1233 for sensing/detecting data stored in the STT-MRAM cell in response to a read command. The local write driver 1232 and the local sense amplifier 1233 are connected between a local input/output line LIO and a global input/output line GIO.

The row decoder 1210 and the column decoder 1220 may be arranged to correspond to respective banks or may be arranged respectively in bank groups shown in FIG. 10A. For example, the row decoder 1210 may be arranged to correspond to a plurality of banks included in a single bank group, and the column decoder 1220 may be shared by a plurality of banks included in a single bank group.

Figure 12:
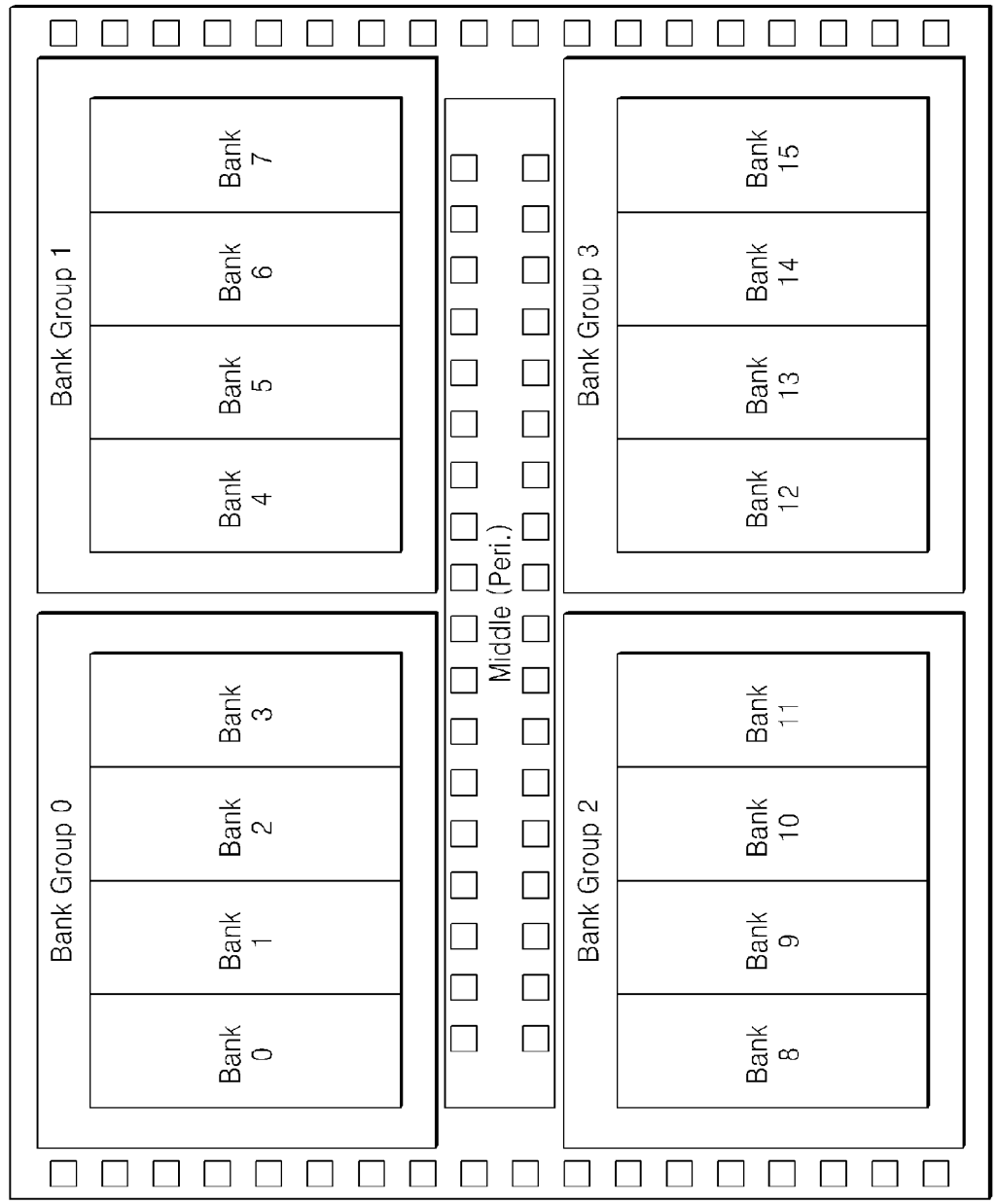
FIG. 12 is a layout diagram of a semiconductor chip of the semiconductor memory device of FIG. 10A, according to an embodiment of the inventive concept.

FIG. 12 is a block diagram of a semiconductor chip 1300 of the semiconductor memory device 1100 of FIG. 10A, according to an embodiment of the inventive concept. Referring to FIG. 12, the semiconductor chip 1300 includes 16 banks Bank 0 to Bank 15. Each of the 16 banks Bank 0 to Bank 15 includes a cell array (not shown) including a plurality of STT-MRAM cells.

Four banks that share a global line are included in a single bank group. For example, the first bank group Bank Group 0 includes the first through fourth banks Bank 0 to Bank 3, the second bank group Bank Group 1 includes the fifth through eighth banks Bank 4 to Bank 7, the third bank group Bank Group 2 includes the ninth through twelfth banks Bank 8 to Bank 11, and the fourth bank group Bank Group 3 includes thirteenth through sixteenth banks Bank 12 through Bank 15.

The bank groups Bank Group 0 to Bank Group 3 may operate as separate memory devices. Thus, data input/output circuits, control circuits, or the like may be arranged for the bank groups Bank Group 0 to Bank Group 3, respectively.

A peripheral region Peripherals is positioned in a long-side direction in a middle portion of the semiconductor chip 1300. A plurality of pads for inputting and outputting signals for performing a memory operation on the banks Bank 0 to Bank 15 are arranged in the peripheral region Peripherals. The pads are channels for transferring a control signal and input and output data between the semiconductor memory device 1100 and an external controller. A plurality of pads may be arranged on an edge region of the semiconductor chip 1300. In FIG. 12, the pads of the peripheral region Peripherals and the pads of the edge region are arranged perpendicular to each other. However, the embodiment of the inventive concept is not limited thereto, and the arrangement of the pads may be changed in a variety of different ways.

Figure 13:
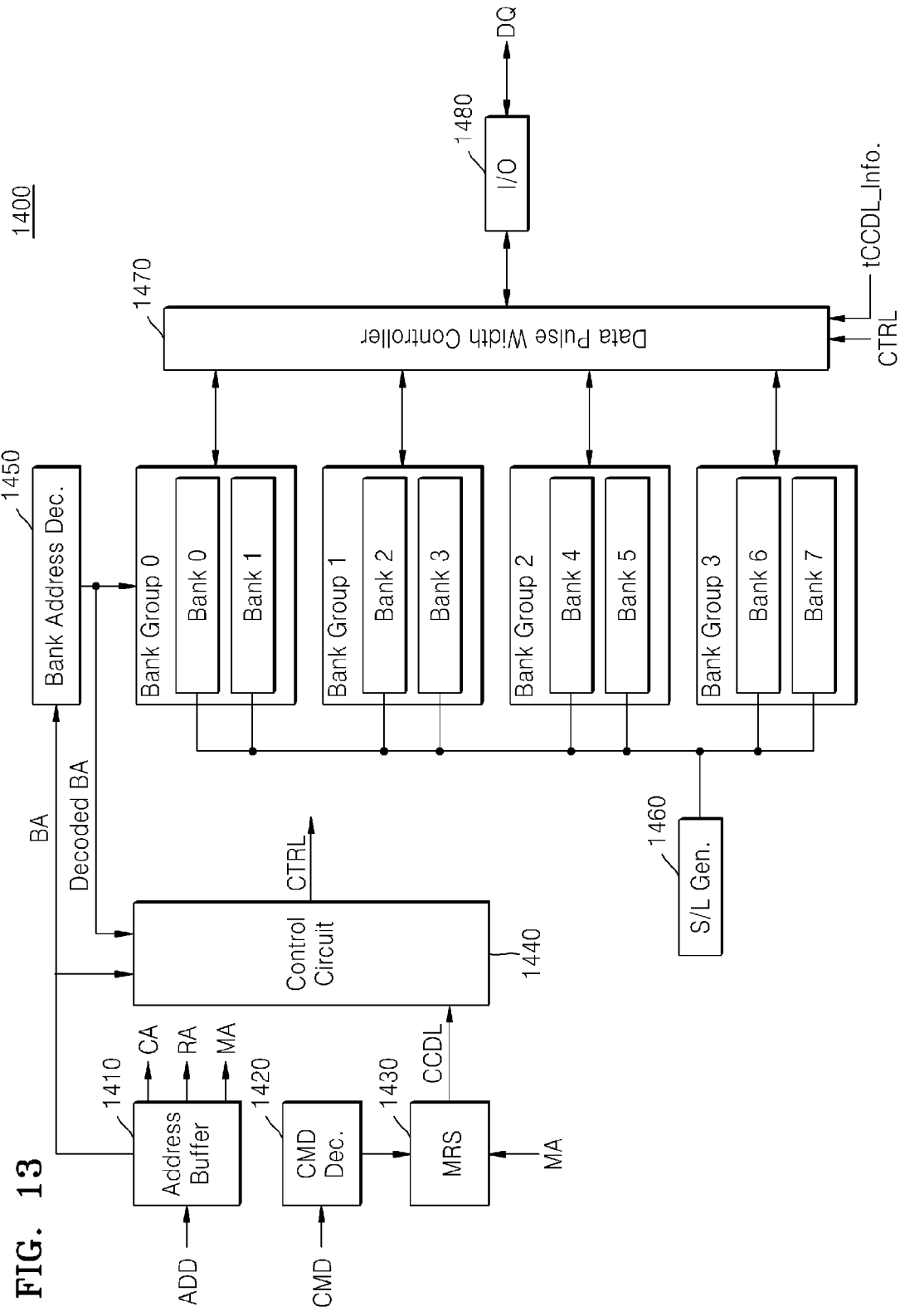
FIG. 13 is a block diagram of a semiconductor memory device according to another embodiment of the inventive concept.

FIG. 13 is a block diagram of a semiconductor memory device 1400 according to another embodiment of the inventive concept. Referring to FIG. 13, the semiconductor memory device 1400 includes an address buffer 1410, a command decoder 1420, a mode register set 1430, a control circuit

1440, a bank decoder 1450, a source voltage generating unit 1460, a plurality of bank groups Bank Group 0 to Bank Group 3, a data pulse controller 1470, and a data input/output unit 1480.

An access operation of the bank groups Bank Group 0 to Bank Group 3 has a Column address to Column address delay (tCCD) that is a delay time after a column address is applied. For example, when tCCD is set to two clocks (2CK), a command for an access to a bank group is transmitted and then a command for an access to a next bank group is transmitted after two clocks (2CK). That is, the semiconductor memory device 1400 is set to process input commands CMDs at a frequency corresponding to two clocks (2CK). After a command for an access to a bank group is transmitted, an access to a selected bank is performed. A data signal DQ has a pulse of two clocks (2CK). After a selected bank is accessed, the same bank group or a different bank group may be accessed.

In this case, tCCD is classified into tCCDL for an access to a selected bank group and then an access to the same bank group and tCCDS for an access to a selected bank group and a next access to a different bank group. tCCDL is greater than or equal to tCCDS. tCCDL varies according to a frequency and tCCDS is not changed. As an operation frequency is increased, tCCDL may be increased. A command for an access to a bank may be input at a clock period having tCCDL or tCCDS. In this case, tCCDL and tCCDS may be set differently according to values of the mode register set 1430.

The mode register set 1430 includes a mode register for storing mode data about a memory operation. The mode register set 1430 transmits a mode control signal CCDL to the control circuit 1440 in response to a mode address MA received from the address buffer 1410 and a command signal CMD received from the command decoder 1420. The control circuit 1440 generates a tCCDL control signal CTRL by using the mode control signal CCDL, a bank address (or a bank group address), and a decoded bank address (BA) and provides the tCCDL control signal CTRL to the data pulse controller 1470.

The data pulse controller 1470 generates a pulse width control signal in response to at least one of the tCCDL control signal CTRL and tCCDL information tCCDL_info. The tCCDL information tCCDL_info may be provided from the mode register set 1430. The pulse width control signal is provided to the data input/output unit 1480 and controls the time for activating data transmission of the data input/output unit 1480. That is, an interval for an access to banks in the same bank group may be adjusted by adjusting a point in time for activating data transmission of the data input/output unit 1480 by the pulse width control signal from the data pulse controller 1470.

Figure 14:
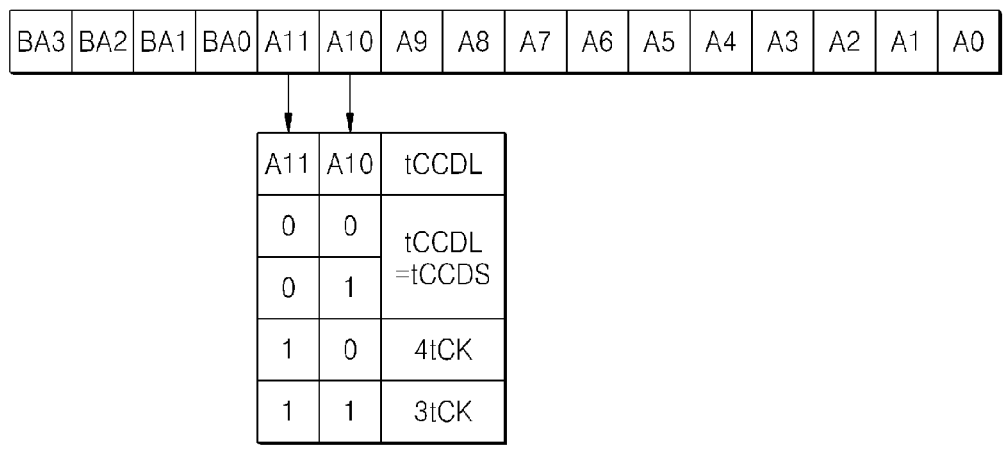
FIG. 14 is a diagram of a mode register set shown in FIG. 13, according to an embodiment of the inventive concept.

FIG. 14 is a diagram of the mode register set 1430 shown in FIG. 13, according to an embodiment of the inventive concept.

Referring to FIG. 14, the mode register set 1430 includes a mode register corresponding to an address. The mode register set 1430 stores mode data for setting a mode related to a memory operation.

The mode register set 1430 corresponding to mode addresses A11 and A10 stores information about an access interval between banks in the same bank group. The access interval between bank groups may be previously set and an input period of a command may be set to be equal to the access interval between the bank groups. That is, the input period of the command is set to a minimum value tCK, and an access interval tCCDL between banks in a bank group is changed so as to prevent a reduction in access performance.

As shown in FIG. 14, mode data stored in the mode register set 1430 corresponding to the mode addresses A11 and A10 is '00' and '01', tCCDL is the same as tCCDS. When tCCDS is fixed to two clocks (2CK), tCCDL has a value corresponding to two clocks (2CK). In this case, a command for an access to the same bank group provided from an external source may be input at a frequency corresponding to two clocks (2CK).

When mode data stored in the mode register set 1430 corresponding to the mode addresses A11 and A10 is '10', tCCDL has a value corresponding to four clocks (4CK). Here, a command for an access to the same bank group provided from an external source may be input at a frequency corresponding to four clocks (4CK). In this case, before a command for an access to the same bank group is input, a command for an access to a different bank group may be input at a frequency corresponding two clocks (2CK).

When mode data stored in the mode register set 1430 corresponding to the mode addresses A11 and A10 is '11', tCCDL has a value corresponding to three clocks (3CK). Here, a command for an access to the same bank group provided from an external source may be input at a frequency corresponding to three clocks (3CK). In this case, before a command for an access to the same bank group is input, a command for an access to a different bank group may be input at a frequency corresponding to two clocks (2CK).

Mode data stored in the mode register set 1430 corresponding to the mode addresses A11 and A10 may be set to different values. The mode data stored in the mode register set 1430 corresponding to the mode addresses A11 and A10 may be provided to the control circuit 1440.

Figure 15:
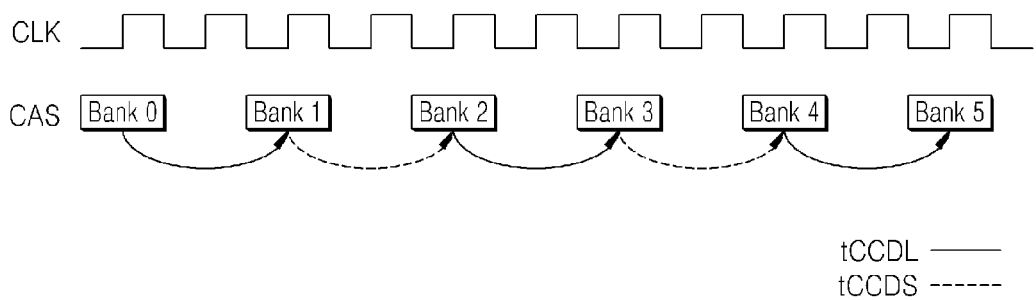
FIGS. 15, 16 and 17 are timing diagrams of a command input to a bank according to a set value of tCCDL of FIG. 13, according to embodiments of the inventive concept
Figure 16:
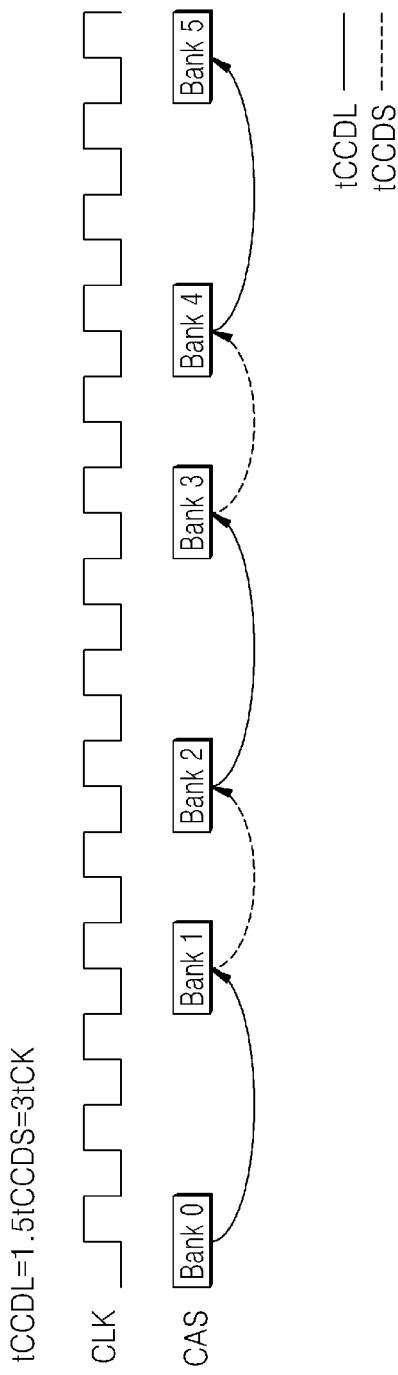
Figure 17:
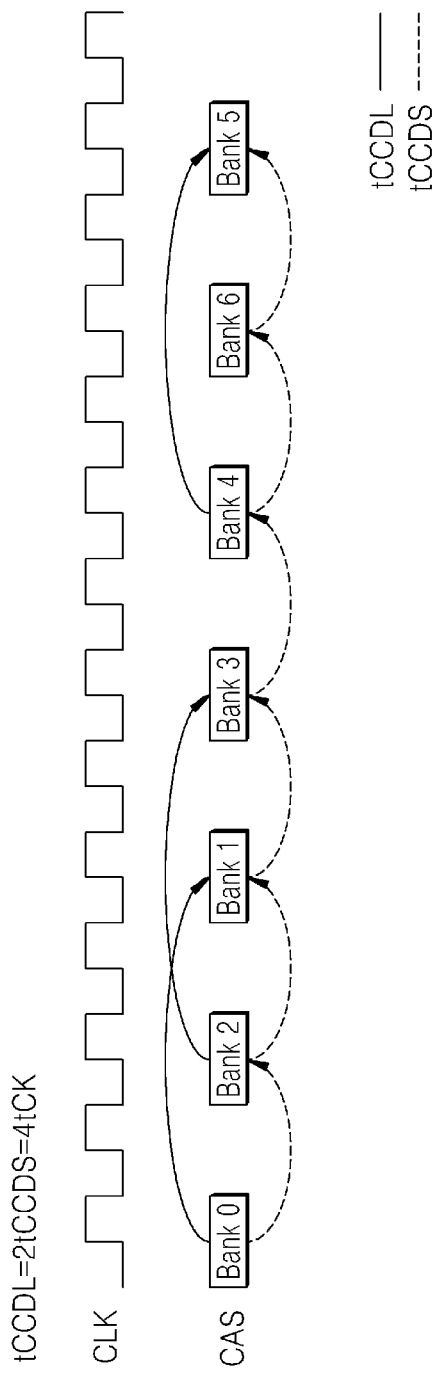

FIGS. 15 through 17 are timing diagrams of a command input to a bank according to a set value of tCCDL of FIG. 13, according to embodiments of the inventive concept. In this case, it is assumed that a semiconductor memory device includes first through fourth bank groups Bank Group 0 to Bank Group 3, the first bank group Bank Group 0 includes first and second banks Bank 0 and Bank 1, the second bank group Bank Group 1 includes third and fourth banks Bank 2 and Bank 3, the third bank group Bank Group 2 includes fifth and sixth banks Bank 4 and Bank 5, and the fourth bank group Bank Group 3 includes seventh and eighth banks Bank 6 and Bank 7.

tCCDL varies from two clocks (2 CK) to four clocks (4 CK) and may be set to be increased as an operation frequency is increased. tCCDS may be fixed to two clocks (2CK). This condition is just an example, and thus, tCCDL and tCCDS may be set in a variety of different ways. For example, a bank group may include four or more banks and tCCDL may vary within a wider range.

FIG. 15 shows a case where tCCDL is two clocks (2CK). When tCCDL is two clocks (2CK), a command for an access to the same bank group may be input at a frequency corresponding to two clocks (2CK). FIG. 16 shows a case where tCCDL is three clocks (3CK). When tCCDL is three clocks (3CK), a command for an access to the same bank group may be input at a frequency corresponding to three clocks (3CK). FIG. 17 shows a case where tCCDL is four clocks (4CK). When tCCDL is four clocks (4CK), a command for an access to the same bank group may be input at a frequency corresponding to four clocks (4CK). The commands shown by way of example in FIGS. 15 through 17 are each a column address strobe (CAS) signal.

Referring to FIG. 15, a command for an access to the first bank Bank 0 of the first bank group Bank Group 0 is input. An access to the first bank Bank 0 of the first bank group Bank Group 0 is performed, and, after two clocks (2CK) elapse, a command for performing an access to the second bank Bank 1 of the same bank group, that is, the first bank group Bank Group 0, is input. That is, a command for an access to the same bank group is input at a frequency corresponding to two clocks (2CK).

An access to the second bank Bank 1 of the first bank group Bank Group 0 is performed, and after two clocks (2CK) elapse, a command for an access to the third bank Bank 2 of a different bank group, that is, the second bank group Bank Group 1, is input. That is, a command for an access to a different bank group is input at a frequency corresponding to two clocks (2CK).

Referring to FIG. 16, a command for an access to the first bank Bank 0 of the first bank group Bank Group 0 is input. An access to the first bank Bank 0 of the first bank group Bank Group 0 is performed, and after three clocks (3CK) elapse, a command for an access to the second bank Bank 1 of the same bank group, that is, the first bank group Bank Group 0, is input. Then, a command for an access to a different bank group is input. tCCDS is fixed to two clocks (2CK). Thus, an access to the first bank group Bank Group 0 is performed, and after two clocks (2CK) elapse, a command for an access to the third bank Bank 2 of a different bank group, that is, the second bank group (Bank Group 1), is input. Then, a command for the same bank group may be input at a frequency corresponding to three clocks (3CK) and a command for a different bank group may be input at a frequency corresponding to two clocks (2CK).

Referring to FIG. 17, tCCDL is four clocks (4CK) and tCCDS is two clocks (2CK). That is, tCCDL is two times greater than tCCDS. In this case, after a command for an access to the first bank Bank 0 of the first bank group Bank Group 0 is input, before a command for an access to the second bank Bank 1 of the same bank group, that is, the first bank group Bank Group 0, is input, a command for an access to the third bank Bank 2 of a different bank group, that is, the second bank group Bank Group 1, may be input. Since tCCDS is two clocks (2CK), a command for an access to the third bank Bank 2 of the second bank group Bank Group 1 is input at a frequency corresponding to two clocks (2CK).

Then, a command for an access to the same bank group is input at a frequency corresponding to four clocks (4CK) and a command for an access to a different bank group is input at a frequency corresponding to two clocks (2CK). In addition, before a command for an access to the same bank group is input, a command for an access to a different bank group may be input.

Figure 18:
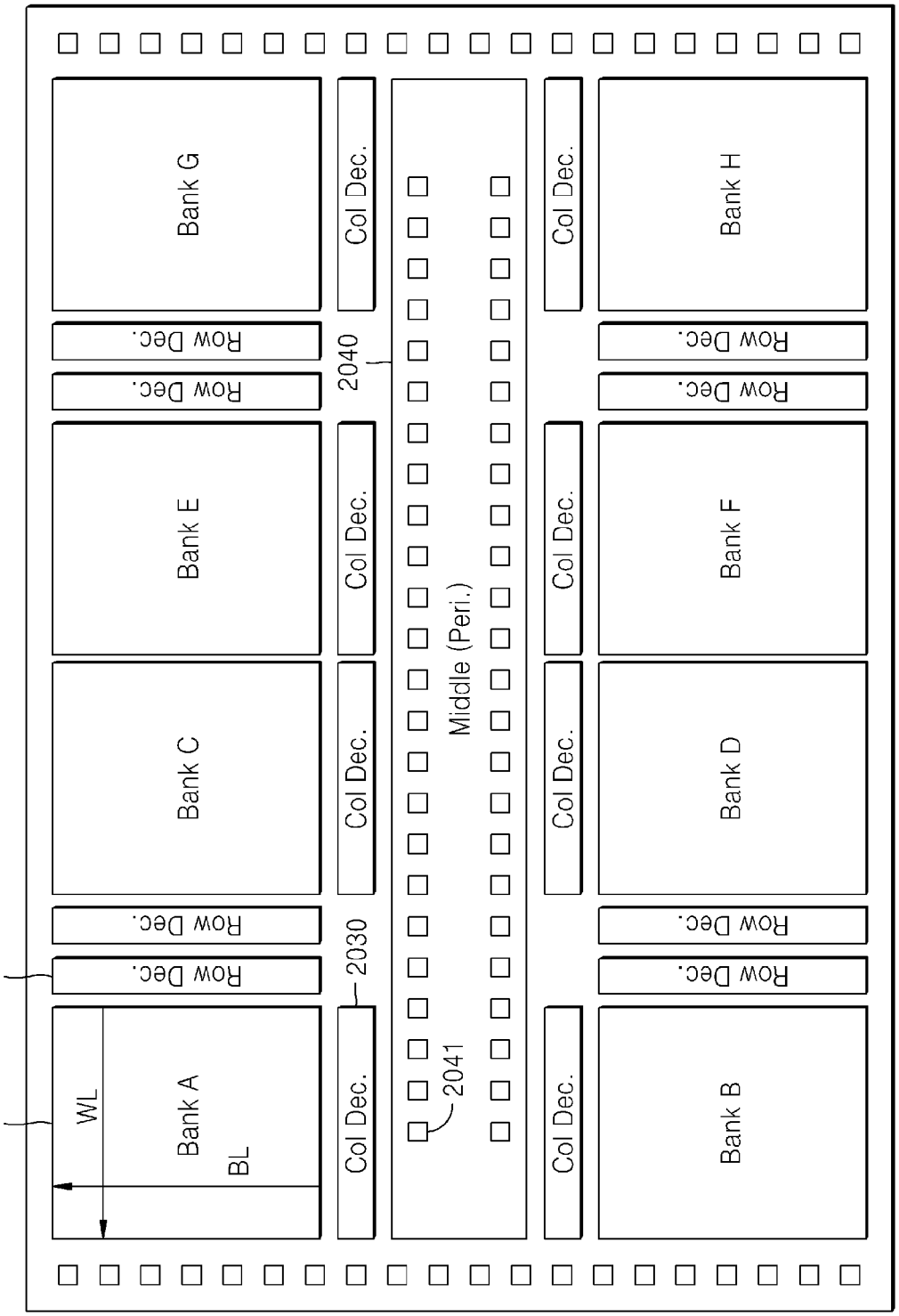
Figure 19:
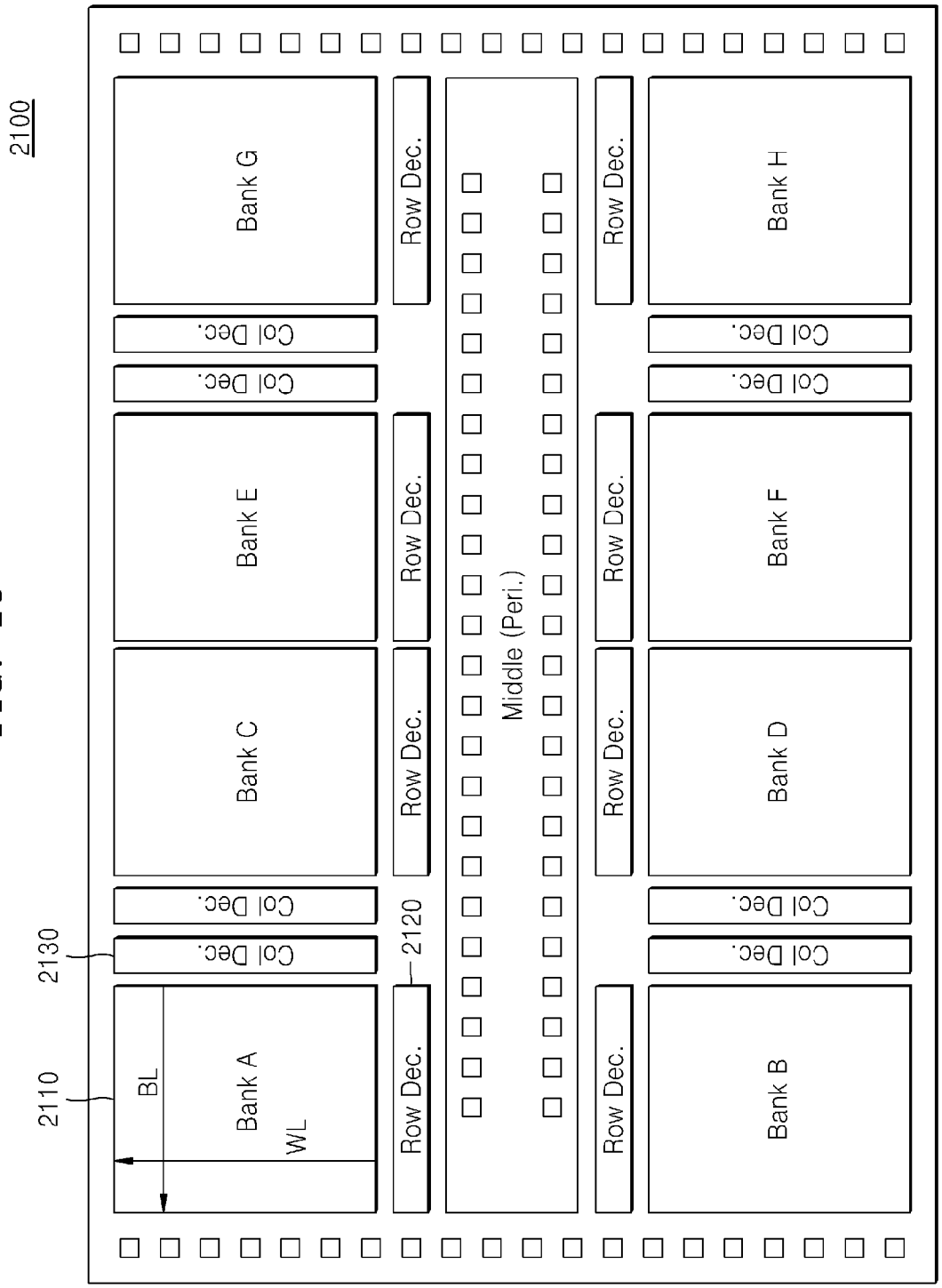
Figure 20:
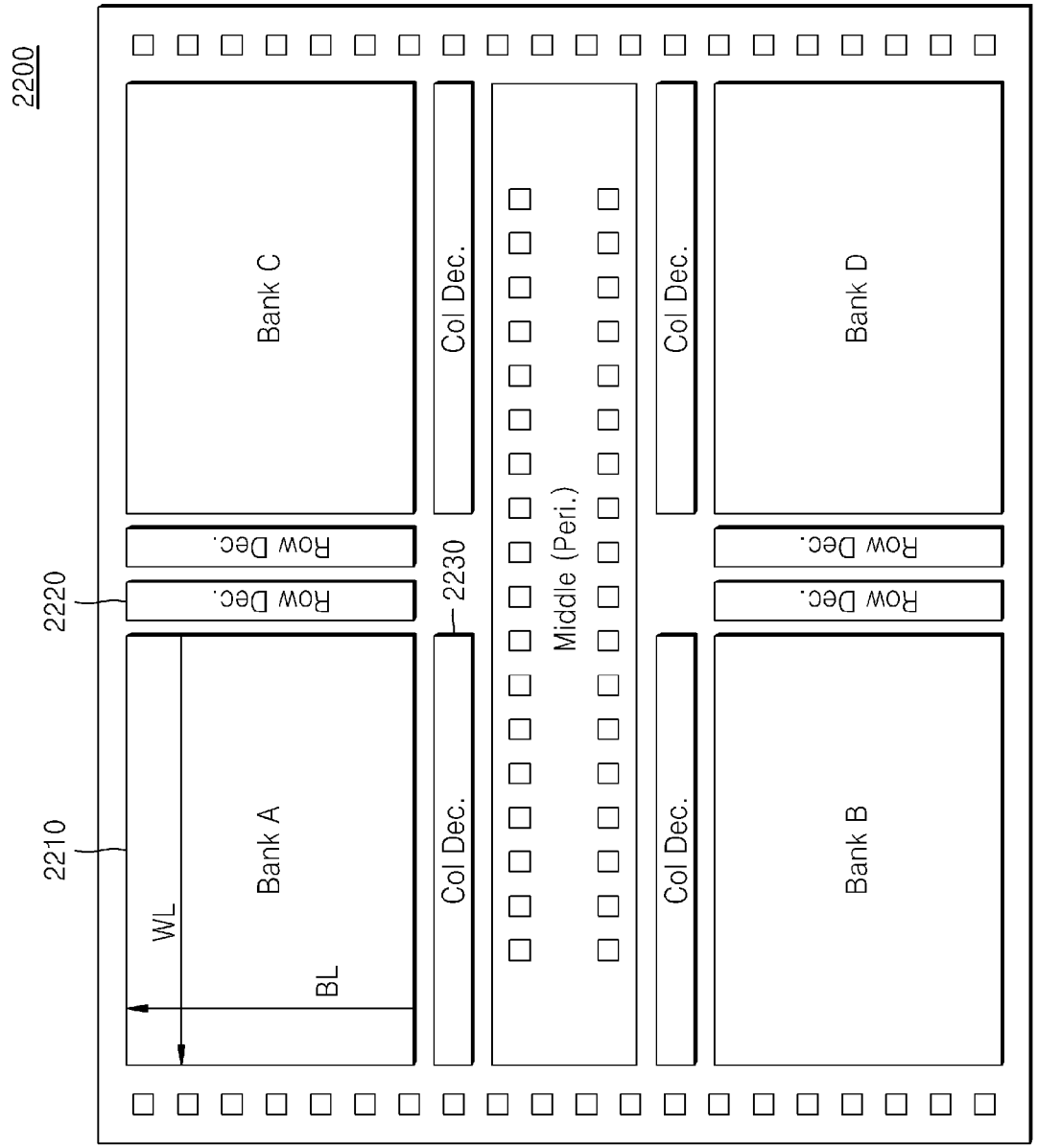
Figure 24A:
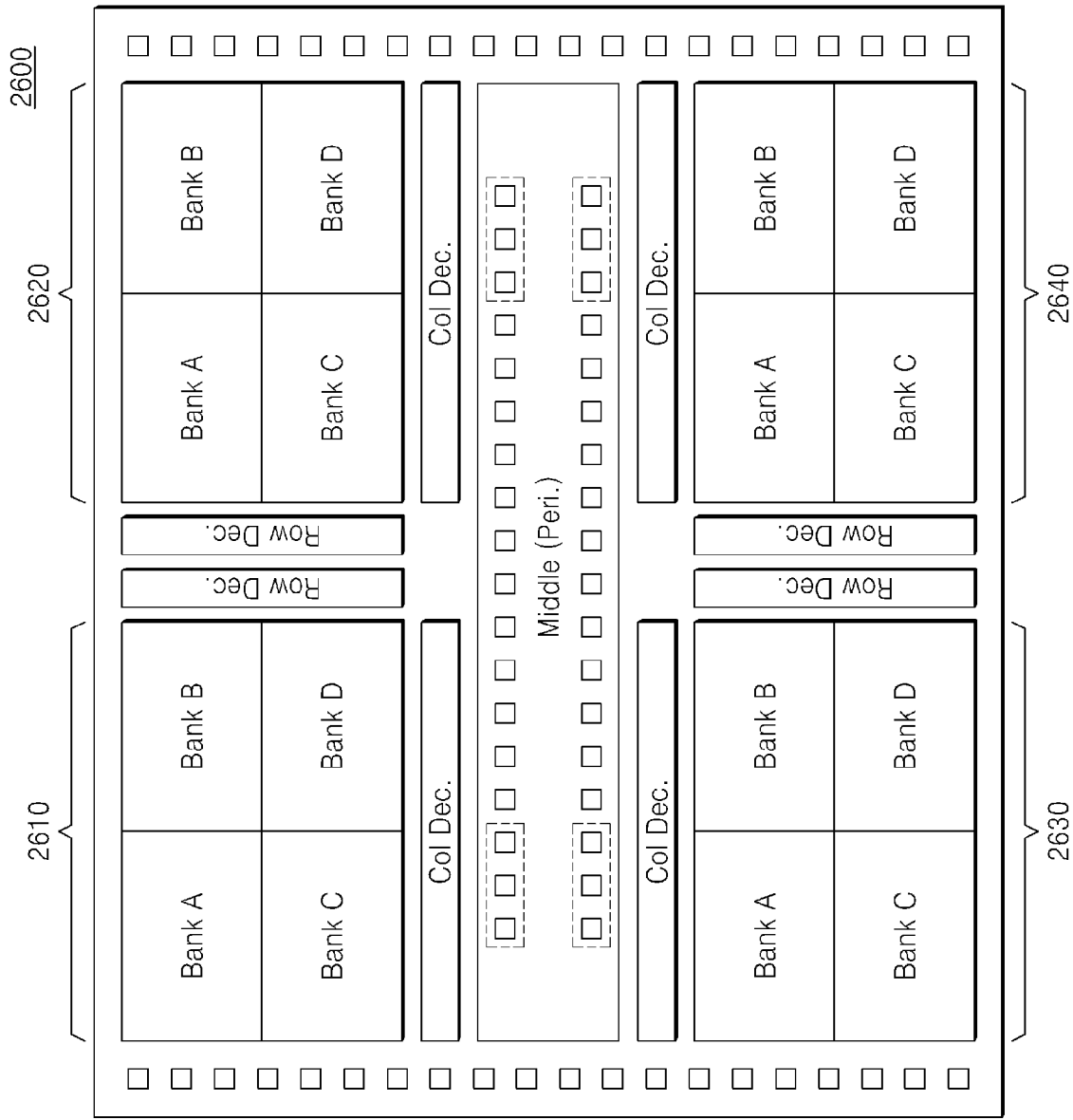
Figure 25:
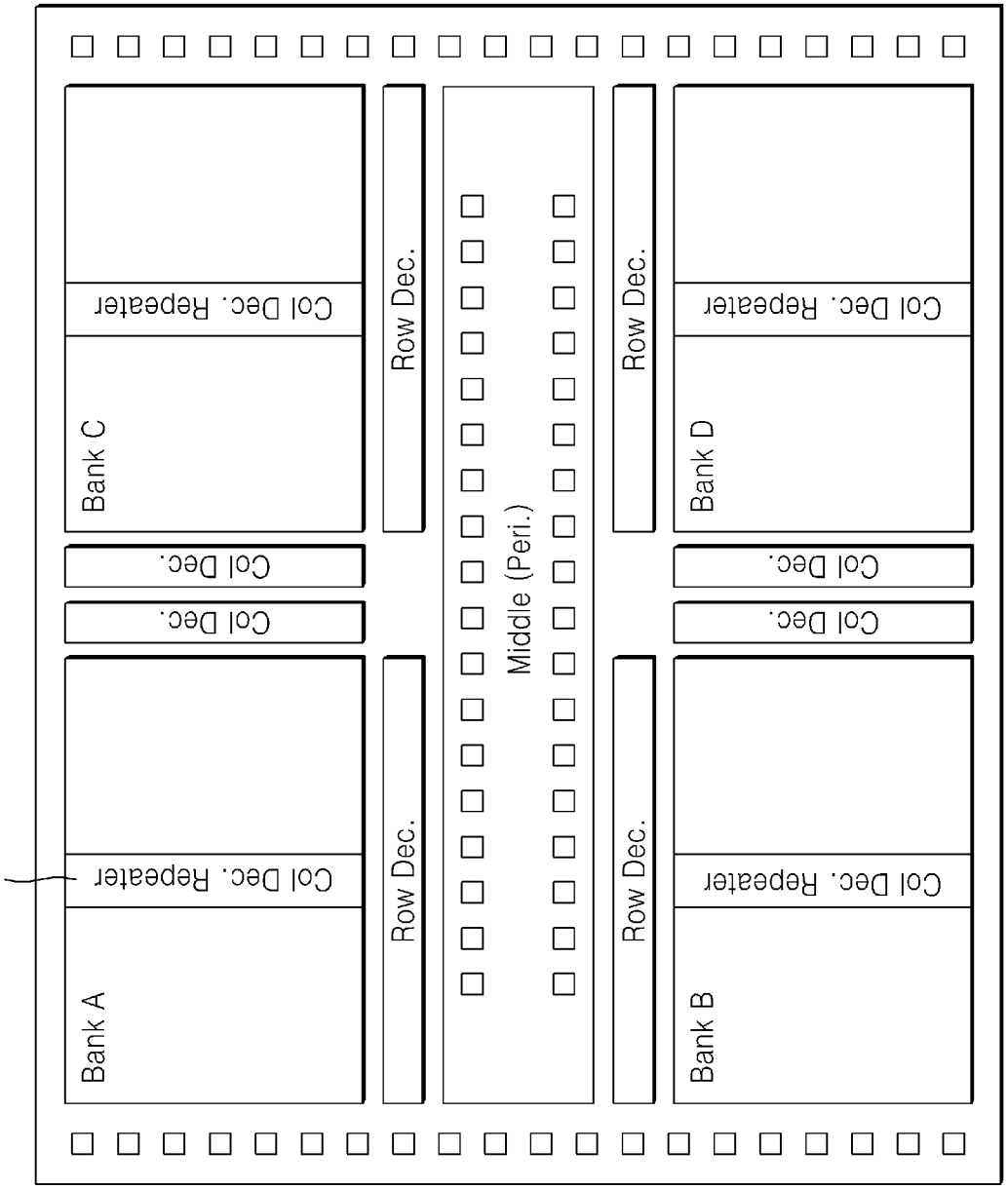
Figure 26:
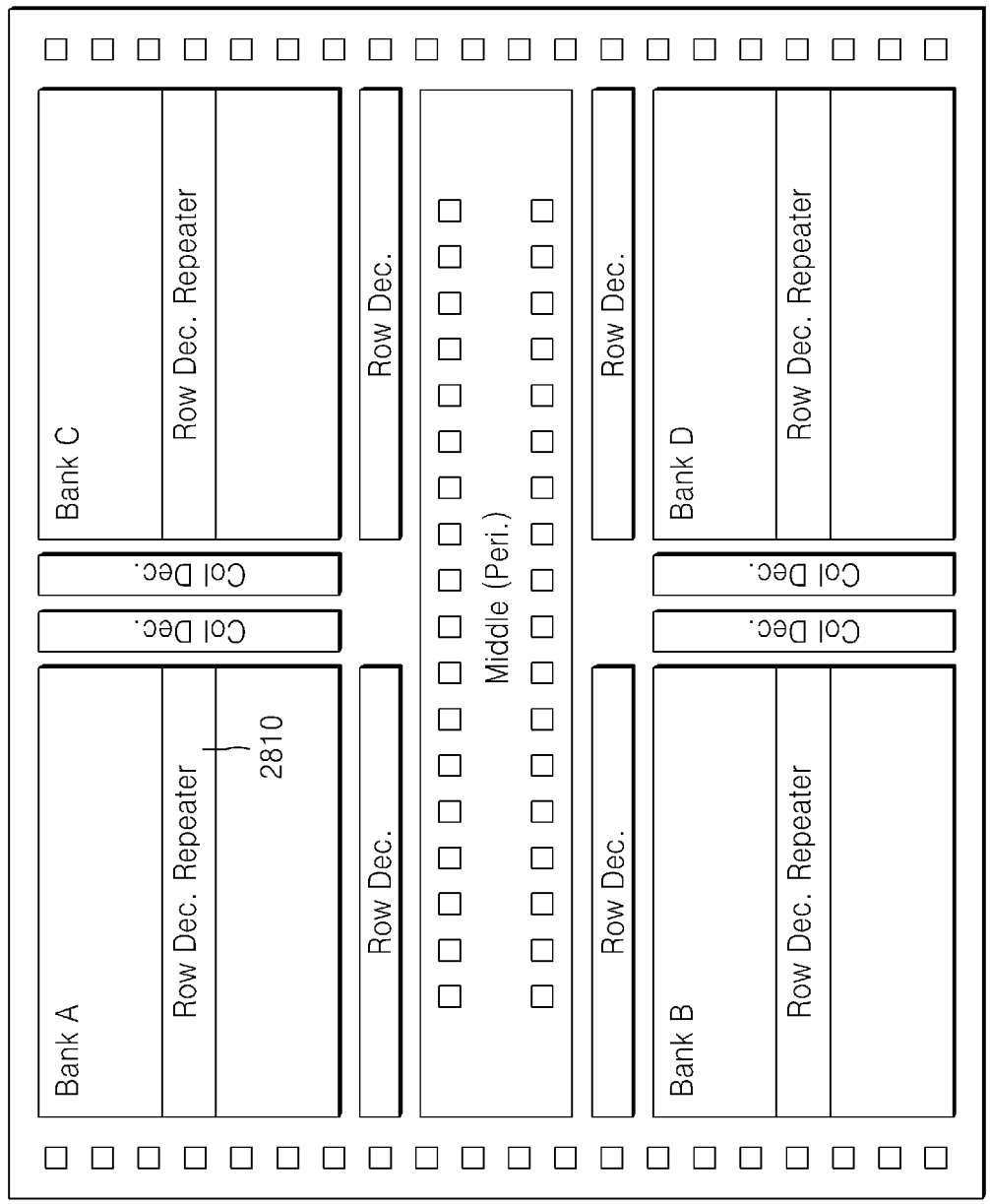

FIGS. 18 through 26 are plan views of examples where a semiconductor memory device includes a plurality of banks, according to embodiments of the inventive concept. FIGS. 18 through 20 show various bank arrangements according to the number of banks, and directions of row and column decoders. FIGS. 21 through 24 show various bank arrangements based on a split bank structure. FIGS. 25 and 26 show cases where a decoder repeater is used in a bank.

Referring to FIG. 18, a semiconductor chip 2000 includes eight banks Bank A through Bank H. Each of the eight banks Bank A through Bank H includes a cell array (not shown) including a plurality of STT-MRAM cells. Row decoders 2020 and column decoders 2030 are arranged adjacent to the eight banks Bank A to Bank H, respectively.

The row decoders 2020 may be arranged in a short-side direction of the semiconductor chip 200, and the column decoders 2030 may be arranged in a long-side direction of the semiconductor chip 200. In addition, two of the row decoders 2020, which are respectively assigned to two adjacent banks, may be disposed adjacent to each other so as to share a control line (not shown).

A peripheral region 2040 is positioned in a long-side direction in a middle portion of the semiconductor chip 2000. A plurality of pads 2041 for inputting and outputting signals for performing a memory operation on the banks Bank A to Bank H are disposed in the peripheral region 2040. The pads 2041 are channels for transferring a control signal, and input and output data between the semiconductor chip 2000 and an external controller. In addition, a plurality of pads may be arranged on an edge region of the semiconductor chip 2000. In FIG. 18, the pads of the peripheral region 2040 and the pads of the edge region are arranged perpendicular to each other. However, the arrangement of the pads may be changed in a variety of different ways.

Referring to FIG. 19, a semiconductor chip 2100 has a structure similar to that of the semiconductor chip 2000 of FIG. 18. However, in FIG. 19, row decoders 2120 are arranged in a long-side direction of the semiconductor chip 2100, and column decoders 2130 are arranged in a short-side direction of the semiconductor chip 2100. In addition, two of the column decoders 2130, which are respectively assigned to two adjacent banks, may be disposed adjacent to each other so as to share a control line (not shown).

Referring to FIG. 20, a semiconductor chip 2200 includes four banks Bank A to Bank D. Each of the four banks Bank A to Bank D includes a cell array (not shown) including a plurality of STT-MRAM cells. Row decoders 2220 and column decoders 2230 are arranged adjacent to the four banks Bank A to Bank D, respectively.

The row decoders 2220 may be arranged in a short-side direction of the semiconductor chip 2200, and the column decoders 2230 may be arranged in a long-side direction of the semiconductor chip 2200. In addition, two of the row decoders 2220, which are respectively assigned to two adjacent banks, may be disposed adjacent to each other so as to share a control line (not shown).

Although not shown, the number of memory banks of a semiconductor chip may be 10 or more as well as four and eight.

FIGS. 21 through 24B show various bank arrangements based on a split bank structure. With an increase of the integration of a memory, the number of memory cells included in a single bank is increased. Thus, even in a single bank, a time difference between input and output may be generated according to a distance between a memory cell and an input/output (DQ) pad. To overcome this, in the split bank structure, a single bank is split into groups and the groups are dispersed. That is, a single bank is split into DQ groups, and the groups are dispersed and arranged in various regions. In this case, the number of banks included in a semiconductor chip may be 4, 8, 16, or the like.

Figure 21:
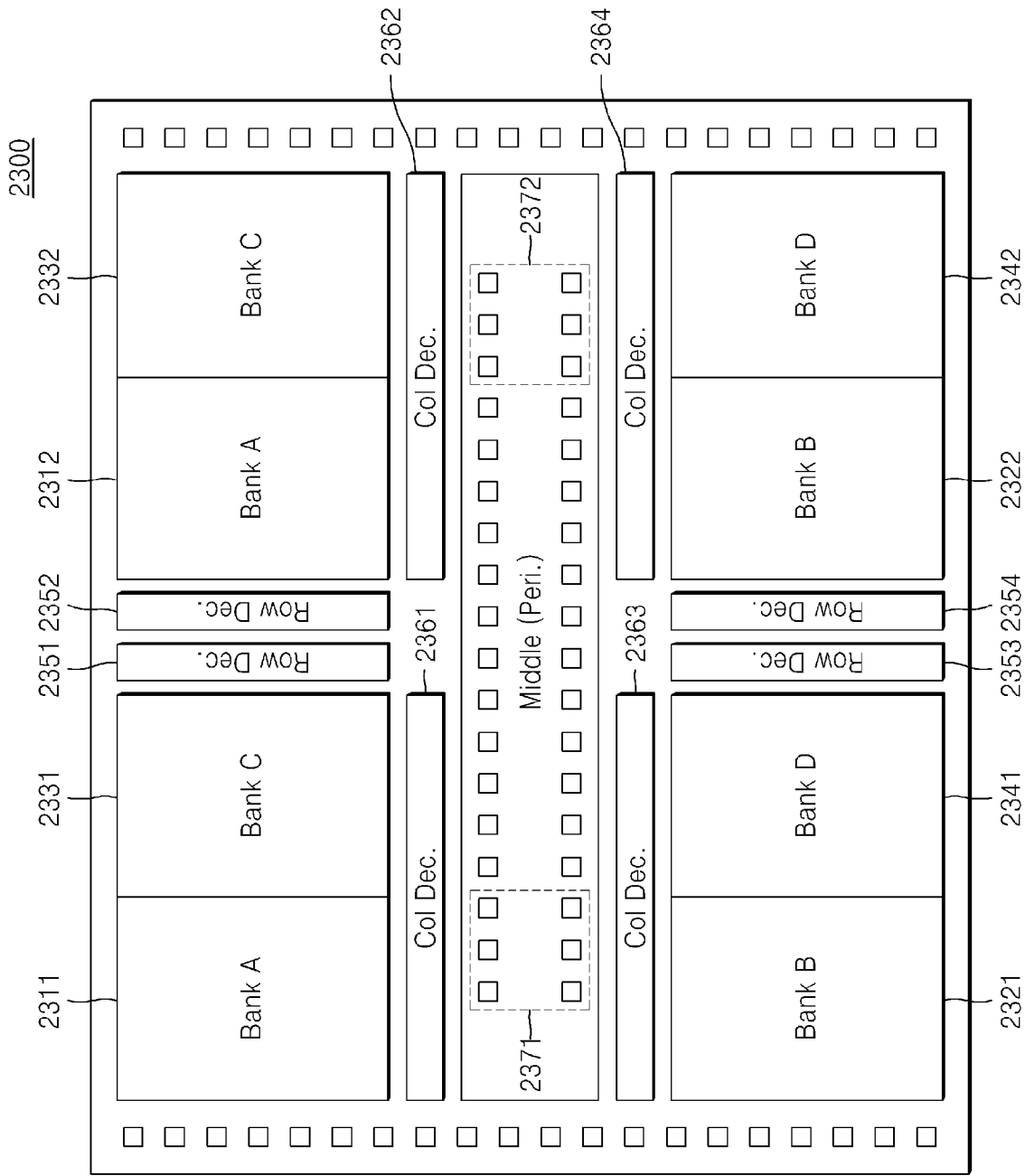

Referring to FIG. 21, a semiconductor chip 2300 may include four banks Bank A to Bank D. Each of the four banks Bank A to Bank D is split into two groups. For example, the bank Bank A is split into two groups 2311 and 2312, the bank Bank C is split into two groups 2331 and 2332, the group 2311 of the bank Bank A and the group 2331 of the bank Bank C are disposed in a region (e.g., a first region), and the group 2312 of the bank Bank A and the group 2332 of the bank Bank C are disposed in another region (e.g., a second region).

Data may be input and output to and from the groups 2311 and 2331 positioned in the first region through a first DQ group 2371. In addition, data may be input and output to and from the groups 2312 and 2332 positioned in the second region through a second DQ group 2372. According to the present embodiment, a row decoder 2351 is shared by at least two banks (e.g., Bank A and Bank C) and a column decoder 2361 is shared by at least two banks (for example, Bank A and Bank C).

Similarly, a group 2321 split from the bank Bank B and a group 2341 split from the bank Bank D are disposed in a third region that is a lower left region of FIG. 21, and another group 2322 split from the bank Bank B and another group 2342 split from the bank Bank D are disposed in a fourth region that is a lower right region of FIG. 21. Data may be input and output to and from the groups 2321 and 2341 positioned in the third region through the first DQ group 2371. In addition, data may be input and output to and from the groups 2321 and 2341 positioned in the fourth region through the second DQ group 2372.

Row decoders 2351, 2352, 2353, and 2354 of the banks Bank A to Bank D are arranged in a short-side direction of the semiconductor chip 2300. Column decoders of 2361, 2362, 2363, and 2364 of the banks Bank A to Bank D are arranged in a long-side direction of the semiconductor chip 2300.

When the banks Bank A to Bank D are split into first and second DQ groups and data is input and output to and from the banks Bank A to Bank D, a problem in terms of an unstable voltage level of a source line (SL) of an STT-MRAM cell, which may occur due to a write current during a write operation, may be resolved.

Figure 22:
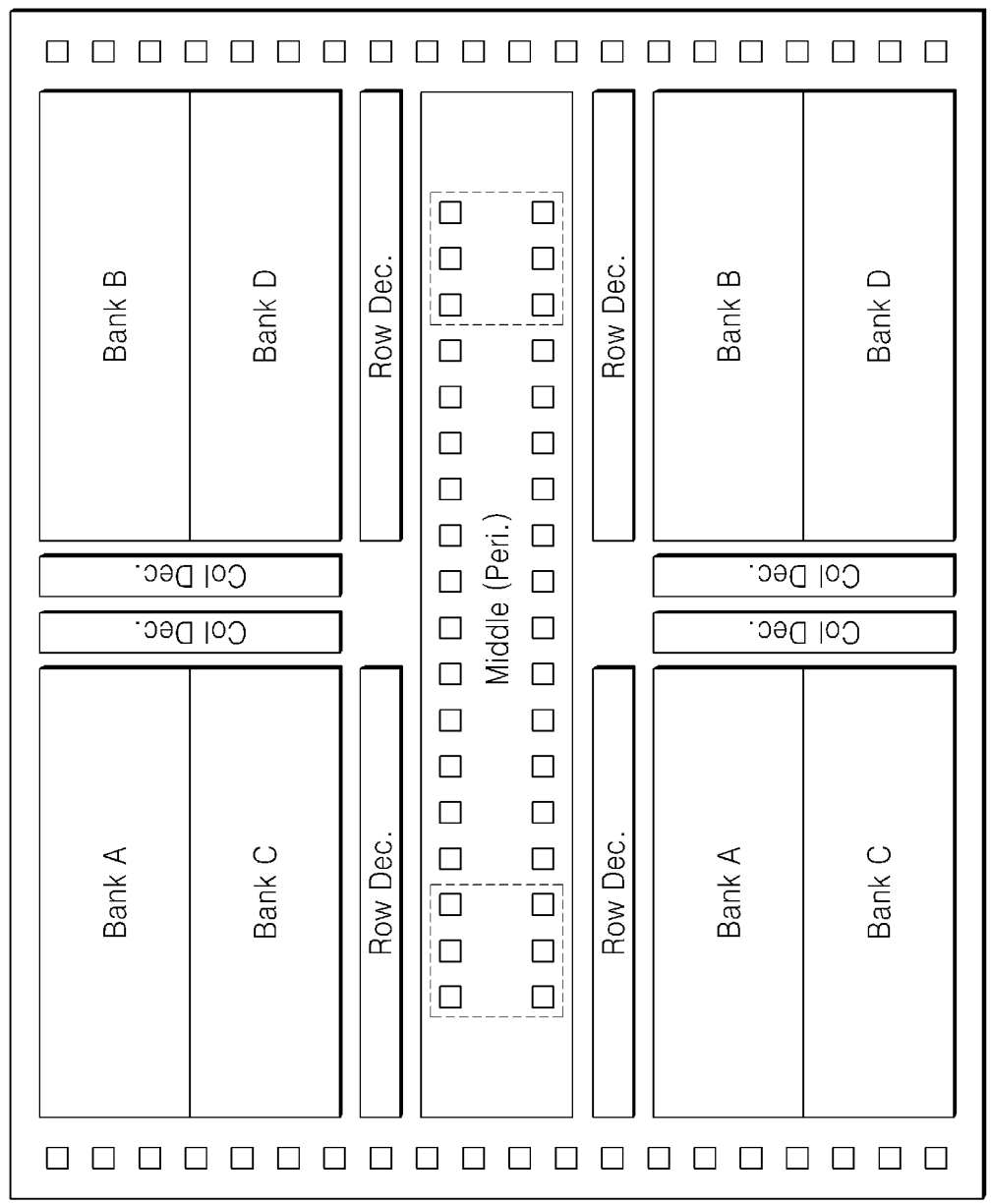

A semiconductor chip 2400 of FIG. 22 is similar to the semiconductor chip 2300 of FIG. 21. However, unlike with the example of semiconductor chip 2300 of FIG. 21, row decoders Row Dec. may be arranged in a long-side direction of the semiconductor chip 2400 and column decoders Col Dec. may be arranged in a short-side direction of the semiconductor chip 2400. In addition, a bank may be split into two or more groups, and in particular, may be split and disposed in a horizontal direction.

Figure 23:
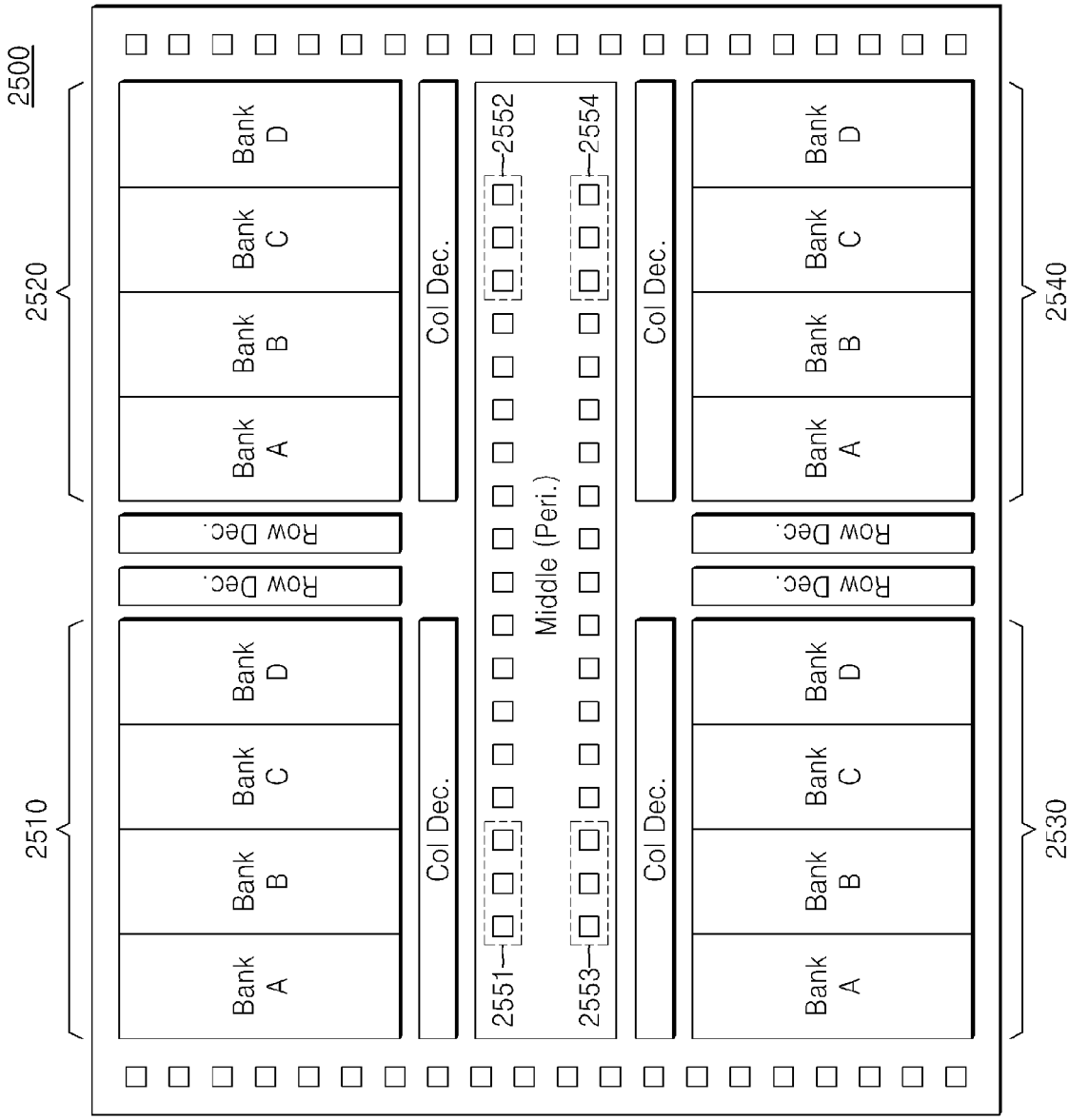

Referring to FIG. 23, a semiconductor chip 2500 includes four banks Bank A to Bank D. Each of the four banks Bank A to Bank D may be split into a plurality of groups. FIG. 23 shows a case where each of the four banks Bank A to Bank D is split into four groups in a vertical direction. In detail, groups split from the banks Bank A to Bank D may be arranged in upper left, upper right, lower right, and lower left regions (a first region 2510, a second region 2520, a third region 2530, and a fourth region 2540) of the semiconductor chip 2500. In addition, DQ pads may be split and arranged into four groups as described below.

Each of the four banks Bank A to Bank D may be split into four groups, and the split groups may be arranged in the first through fourth regions 2510 to 2540. Thus, all groups of the banks Bank A to Bank D may be arranged in the first through fourth regions 2510 to 2540. A plurality of pads disposed in a peripheral region may include first through fourth DQ groups 2551 to 2554 for inputting and outputting data to and from the first through fourth regions 2510 to 2540. That is, data of each of the four banks Bank A to Bank D may be dispersed, and may be output and input through a plurality of DQ groups.

Referring to FIG. 24A, each bank of a semiconductor chip 2600 is split into four groups. For example, each bank may be halved in horizontal and vertical directions, and thus, may be split into four groups. The split groups may be arranged in first through fourth regions 2610 and 2640. For example, in upper left, upper right, lower right, and lower left regions of the first region 2610, groups of the banks Bank A to Bank D may be disposed.

FIG. 24B shows an example of an arrangement of banks and source lines. As shown in diagram (a) of FIG. 24B, a plurality of banks may be connected to different source lines, respectively. For example, a bank Bank A may be connected to the first source line SL0 and may receive a source voltage, and a bank Bank B may be connected to the second source line SL1 and may receive a source voltage. When source lines are separately disposed, separate source voltage generating units may be used. For example, a first source voltage generating unit 2610 may provide a first source voltage to the first source line SL0, and a second source voltage generating unit 2620 may provide a second source voltage to the second source line SL1. Thus, the first and second source lines SL0 and SL1 may be separately controlled.

Diagram (b) of FIG. 24B shows a case where a plurality of banks (in detail, groups split from a plurality of banks) are disposed in a single region and a single source line SL is shared by the banks. As shown in diagram (b) of FIG. 24B, a source voltage generating unit 2630 is disposed to correspond to a predetermined region and provides a source voltage to banks Bank A to Bank D through the common source line SL. Although not shown, a plurality of cell regions may be connected to a common source line or may be connected to separate source lines, respectively.

FIGS. 25 and 26 are diagrams of examples where a decoder repeater is used in a bank, according to embodiments of the inventive concept. With an increase in the integration of a memory, the number of memory cells included in a single bank is increased. In this case, an output signal of a decoder may weaken. Accordingly, a decoder repeater for reinforcing the decoding signal may be disposed in the middle of a bank.

For example, referring to FIG. 25, column decoder repeaters 2710 may be respectively arranged in the middle of banks Bank A to Bank D included in a semiconductor chip 2700 in a long-side direction of the semiconductor chip 2700. Referring to FIG. 26, row decoder repeaters 2810 may be respectively arranged in the middle of banks Bank A to Bank D included in a semiconductor chip 2800 in a short-side direction of the semiconductor chip 2800. Although not shown, when positions of a row decoder and a column decoder are reversed, the long-side direction and the short-side direction of the row decoder repeaters 2810 and the column decoder repeaters 2710 may be reversed.

FIGS. 27 through 34 are diagrams of semiconductor memory devices in which two or more column selectors are connected to each respective bit line.

To obtain a high operating speed of a semiconductor memory device, a 4-bit pre-fetch method as well as a 2 bit pre-fetch method may be used, or CAS latency may be increased. In this case, as a unit of a clock cycle, tCK is used. In general, a memory using the 4-bit pre-fetch method inputs or outputs four pieces of data through a single data input/output pin during two clocks (2tCK). In addition, in the 4-bit pre-fetch method, since a column selection signal CSL is activated over two clocks (2tCK), a command may be transmitted once during two clocks (2tCK). Thus, a minimum time interval (which is referred to as tCCD) between commands is two clocks (2tCK). However, in consideration of a pre-charge period of memory cells, a maximum value of a pulse width may be 1tCK. To overcome this, two or more column selectors may be connected to each respective bit line so as to internally increase a pulse width of a column selection signal.

Figure 27:
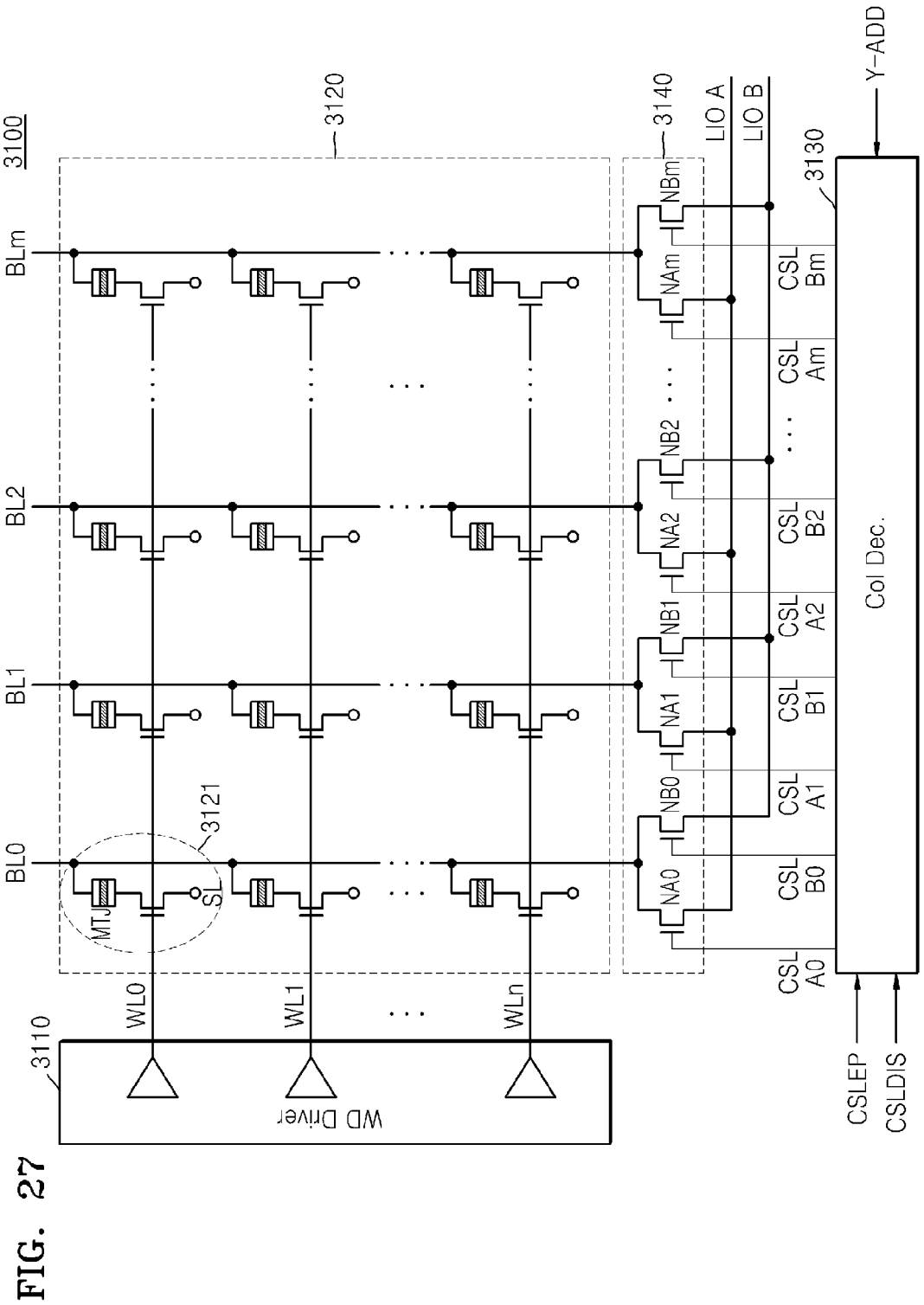
FIG. 27 is a circuit diagram of a semiconductor memory device according to an embodiment of the inventive concept.

FIG. 27 is a circuit diagram of a semiconductor memory device 3100 according to an embodiment of the inventive concept. Referring to FIG. 27, the semiconductor memory device 3100 includes a word line driver 3110, a cell array 3120, a column decoder 3130, a bit line selector 3140, and first and second local input/output lines LIO A and LIO B.

The cell array 3120 includes a plurality of memory cells 3121. The memory cells 3121 are positioned at intersections between a plurality of word lines WL0 to WLn and a plurality of bit lines BL0 to BLm, respectively. The memory cells 3121 may be an STT-MRAM cell.

The word line driver 3110 outputs a word line voltage to select any one of the word lines WL0 to WLn. The column decoder 3130 transmits a column selection signal CSL in response to a CSL enable signal CSLEP, a CSL disable signal CSLDIS, and a column address signal Y-ADD, which are input from a command decoder. Based on the column selection signal CSL, one or more bit lines are selected from among the bit lines BL0 to BLm. Data is input and output to and from the memory cells 3121 positioned at intersections between the selected word line from among the word lines WL0 to WLn and the selected bit line from among the bit lines BL0 to BLm.

Bit lines (e.g., a first bit line BL0) connected to the memory cells 3121 are electrically connected to column selectors (e.g., a first column selector NA0 and a second column selector NB0) included in the bit line selector 3140. The first and second column selectors NA0 to NAm and NB0 to NBm may each be embodied as a transistor. Further, on/off of the first and second column selectors NA0 to NAm and NB0 to NBm is controlled by the column selecting signal CSL applied to a gate. For example, on/off of the first column selector NA0 may be controlled by a first column selecting signal CSL A0 transmitted from a column decoder 3130, and on/off of the second column selector NB0 may be controlled by a second column selecting signal CSL B0 transmitted from the column decoder 3130.

The first and second column selectors NA0 to NAm and NB0 to NBm are connected to the first and second local input/output lines LIO A and LIO B, respectively, to control input/output of data. For example, when a read command Read CMD or a write command CMD is input to the semiconductor memory device 3100 and the memory cell 3121 connected to the first bit line BL0 is selected, write data may be input or read data may be output through at least one of the first and second selectors NA0 and NB0 connected to the first bit line BL0.

When an interval at which a command is input is defined as tCCD, a width (e.g., a CSL width) for inputting and outputting data during reading or writing of data may be determined according to the interval tCCD. In particular, as a clock frequency is increased, the CSL width is reduced, and thus, input/output of data is restricted. According to the present embodiment, whenever a command is input, the column selection signal CSL width may be ideally doubled to obtain a sufficient bandwidth for inputting and outputting data by selectively switching the first and second column selectors NA0 and NB0.

Figure 28A:
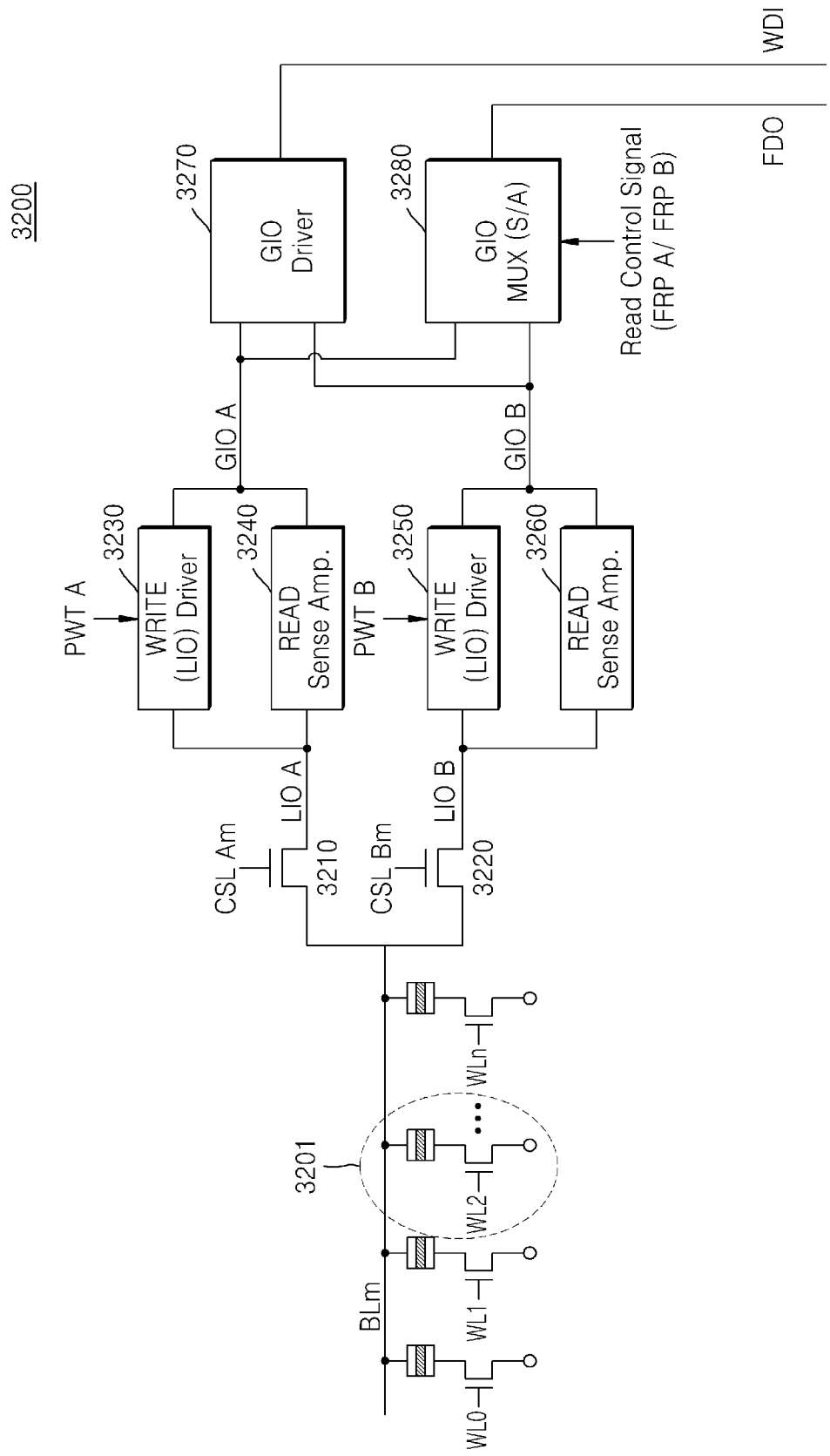
FIGS. 28A and 28B are block diagrams of a data input/output path of a semiconductor memory device, according to an embodiment of the inventive concept.

FIG. 28A is a block diagram of a data input/output path 3200 of a semiconductor memory device, according to an embodiment of the inventive concept. Referring to FIG. 28A, the data input/output path 3200 includes circuits for storing data input from an external source in memory cells 3201, or outputting data stored in the memory cells 3201 to the outside.

The memory cells 3201 are electrically connected to a bit line BLm. The bit line BLm is commonly connected to a first column selector 3210 and a second column selector 3220. When any one of the first and second column selectors 3210 and 3220 is turned on, a read or write operation is performed through the bit line BLm. When the first column selector 3210 is selected in response to a first column selecting signal CSL Am, the bit line BLm, a first local input/output line LIO A, a first local write driver 3230, a first read sense amplifier 3240, and a first global input/output line GIO A are electrically connected to each other. When the second column selector 3220 is selected in response to a second column selecting signal CSL Bm, a second local input/output line LIO B that is electrically connected to the bit line BLm, a second local write driver 3250, a second read sense amplifier 3260, and a second global input/output line GIO B are electrically connected to each other.

When data is stored in the memory cells 3201, data is input to the semiconductor memory device through a data input line WDI. Then, a global input/output driver 3270 transmits data to the first and second global input/output lines GIO A and GIO B. The first local write driver 3230 controls electrical connection between the first global input/output line GIO A and the first local input/output line LIO A in response to a first write control signal PWT A. That is, when the first local write driver 3230 operates, data is transmitted from the first global input/output line GIO A to the first local input/output line LIO A. Similarly, the second local write driver 3250 controls electrical connection between the second global input/output line GIO B and the second local input/output line LIO B in response to a second write control signal PWT B.

When data is read, data from the memory cells 3201 may be provided to a global multiplexer 3280 via the first column selector 3210 and the first read sense amplifier 3240, or may be provided to the global multiplexer 3280 via the second column selector 3220 and the second read sense amplifier 3260. The global multiplexer 3280 may multiplex received data and may output the received data to the outside through a data output line FDO.

Figure 28B:
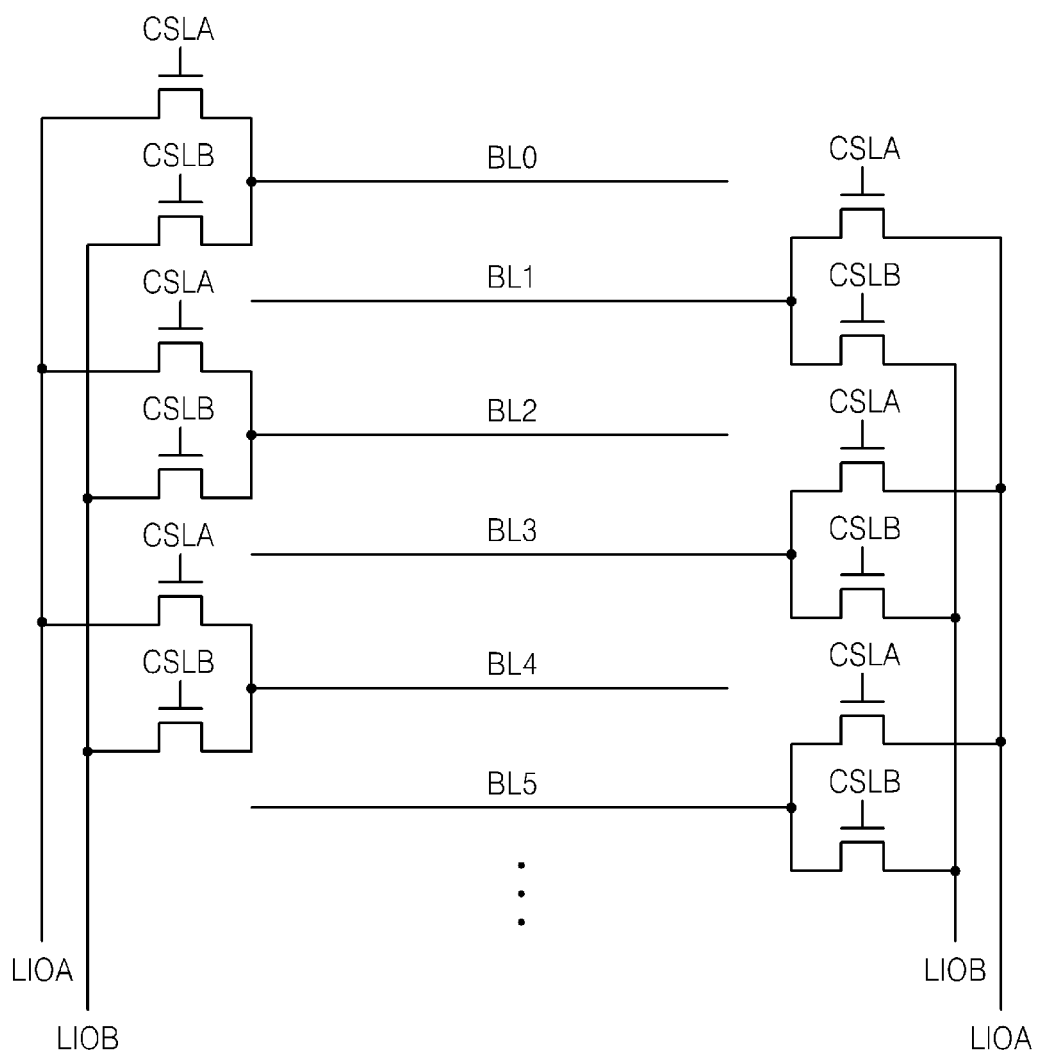

FIG. 28B is a circuit diagram of a case where two column selectors are arranged for each respective bit line of a plurality of bit lines, according to an embodiment of the inventive concept. Referring to FIG. 28B, two column selectors may be connected to each of the bit lines BL0 to BL5. For example, a first bit line BL0 is connected to two column selectors, wherein one column selector is controlled by a first column selecting signal CSL A, and the other column selector is controlled by a second column selecting signal CSL B. In addition, the first and second column selecting signals CSL A and CSL B are commonly provided to column selectors connected to other bit lines.

Whenever a command is input from an external source, the first and second column selecting signals CSL A and CSL B are alternately activated. Thus, regardless of a selected bit line, when the first column selecting signal CSL A is activated, data is transmitted through the first local input/output line LIO A, and when the second column selecting signal CSL B is activated, data is transmitted through the second local input/output line LIO B. Data collision that may occur when the same bit line is consecutively selected will be described later.

Figure 29:
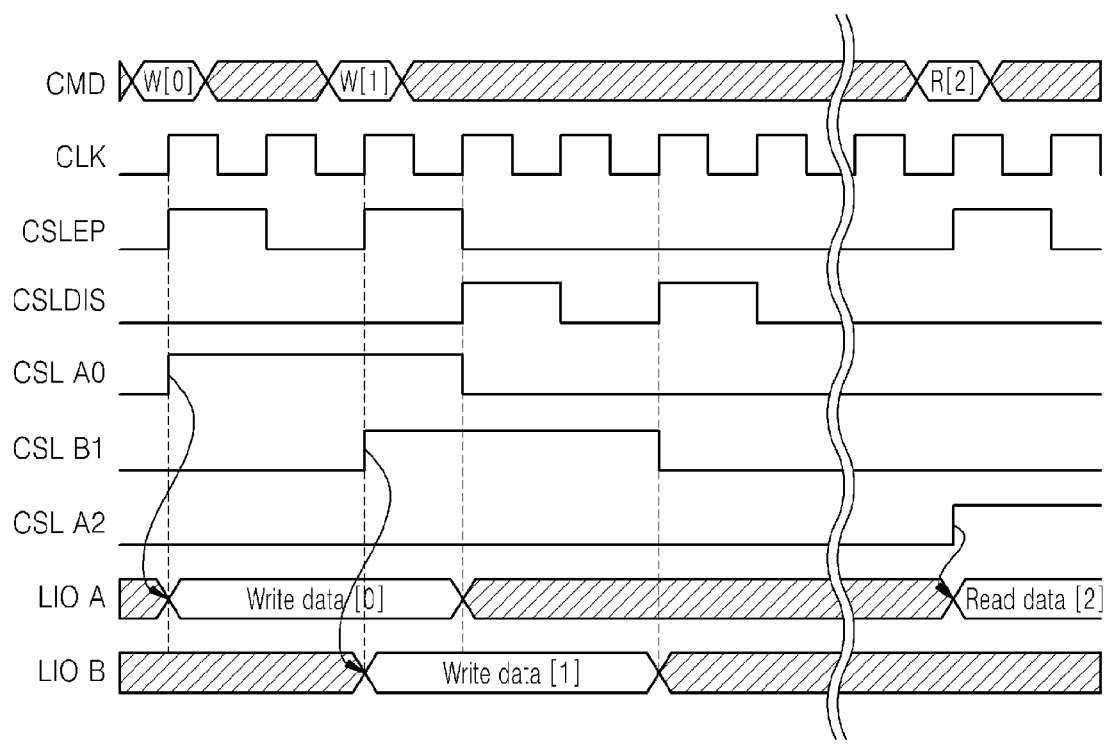
FIG. 29 is an input/output timing diagram of a semiconductor memory device, according to an embodiment of the inventive concept.

FIG. 29 is an input/output timing diagram of a semiconductor memory device, according to an embodiment of the inventive concept. Referring to FIGS. 27 and 29, an data input/output operation is shown when a command is input from an external source to the semiconductor memory device.

When a write command W[0] having a first bit line BL0 as an address is input from an external source, as the write command W[0] is synchronized with a clock signal CLK, the CSL enable signal CSLEP is activated to a logic 'high' level. When the first column selecting signal CSL A0 of the first bit line BL0 is also activated to a logic 'high' level in response to the CSL enable signal CSLEP, the first column selector NA0 connected to the first bit line BL0 is turned on. When the first column selector NA0 is turned on, as the first bit line BL0 and the first local input/output line LIO A are electrically connected to each other, data is transmitted to the memory cells 3121 through the first local input/output line LIO A.

According to the present embodiment, when two column selectors are connected to a single bit line, a pulse width of the first column selecting signal CSL A0 may be increased. Thus, the first column selecting signal CSL A0 is activated to a logic 'high' level during 3CLK from when the CSL enable signal CSLEP is activated until the CSL disable signal CSLDIS is activated 3CLK after the CSL enable signal CSLEP is activated, and data is transmitted through the first local input/output line LIO A.

When the write command W[0] having the first bit line BL0 as an address is input, and after 2CLK elapse, a write command W[1] having a second bit line BL1 as an address may be input. As the write command W[1] is synchronized with the clock signal CLK, the CSL enable signal CSLEP is activated to a logic 'high' level. When a second column selecting signal CSL B1 of the second bit line BL1 is also activated to a logic 'high' level in response to the CSL enable signal CSLEP, a second column selector NB1 connected to the second bit line BL1 is turned on. When the second column selector NB1 is turned on, the second bit line BL1 and the second local input/output line LIO B are electrically connected to each other and data is transmitted to the memory cells 3121 through the second local input/output line LIO B. In this case, since two data transfer paths are provided to correspond to a single bit line, the first column selecting signal CSL A0 and the second column selecting signal CSL B1 may overlap each other for a predetermined period.

That is, if only a single column selector is connected to a single bit line, a pulse width of the column selection signal CSL is limited within 1 to 2CLK. However, according to the present embodiment, since two column selectors are connected to a single bit line, a pulse width of the column selection signal CSL may be increased by as much as three times an original bandwidth. Thus, a bandwidth of a memory may be increased while maintaining a constant operating speed.

When the write command W[1] having the second bit line BL1 as an address is input, and, after several clocks elapse, a read command R[2] having a third bit line BL2 as an address may be input. The read command R[2] may be synchronized with the clock signal CLK and the CSL enable signal CSLEP is activated to a logic 'high' level. When a first column selecting signal CSL A2 of the third bit line BL2 is also activated to a logic 'high' level in response to the CSL enable signal CSLEP, a first column selecting unit NA 2 connected to the third bit line BL2 is turned on. When the first column selecting unit NA 2 is turned on, the third bit line BL2 and the first local input/output line LIO A are electrically connected to each other and data stored in the memory cells 3121 is transmitted to the outside through the first local input/output line LIO A.

Figure 30:
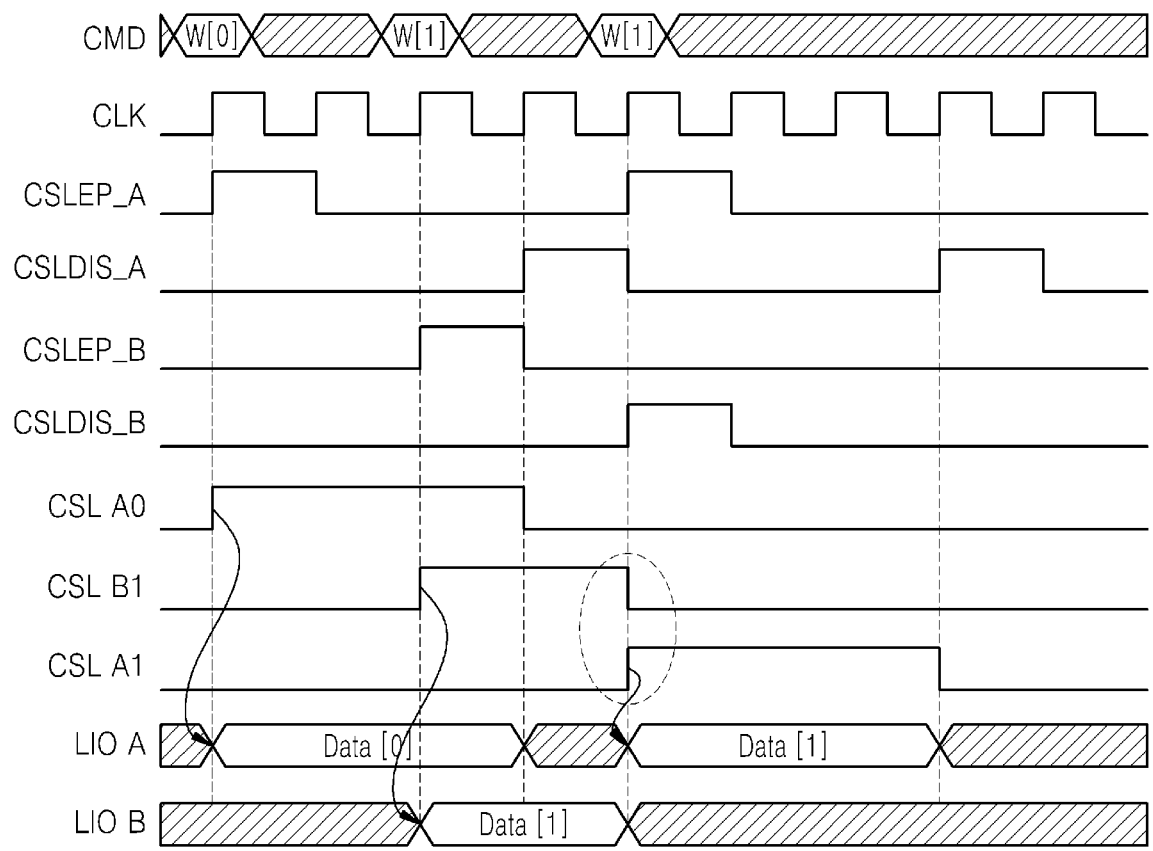
FIG. 30 is a timing diagram showing an operation of a semiconductor memory device when write commands having the same address are consecutively input, according to embodiment of the inventive concept.

FIG. 30 is a timing diagram showing an operation of a semiconductor memory device when write commands having the same address are consecutively input, according to embodiment of the inventive concept.

In the semiconductor memory device described with reference to FIG. 29, commands having different bit line addresses are sequentially input and output. Thus, while signals overlap each other at the first and second local input/output lines LIO A and LIO B, the signals may be separately transmitted. However, as shown in FIG. 30, when write commands having the same bit line address are consecutively input, if pieces of data overlap each other at the first and second local input/output lines LIO A and LIO B, data collision may occur. Thus, in this case, it is necessary to control a pulse width of the column selection signal CSL.

FIGS. 27 and 30 are operation timing diagrams of a semiconductor memory device when the write command W[0] having the first bit line BL0 as an address is input from an external source, and then, the write command W[1] having the second bit line BL1 as an address is consecutively input.

When the write command W[0] having the first bit line BL0 as an address is input from an external source, the write command W[0] is synchronized with the clock signal CLK and a first CSL enable signal CSLEP_A is activated to a logic 'high' level. When the first column selecting signal CSL A0 of the first bit line BL0 is also activated to a logic 'high' level, the first column selector NA0 connected to the first bit line BL0 is turned on. When the first column selector NA0 is turned on, the first bit line BL0 and the first local input/output line LIO A are electrically connected to each other and data is transmitted to the memory cells 3121 through the first local input/output line LIO A. The logic 'high' level of the first column selecting signal CSL A0 is maintained until a first CSL disable signal CSLDIS_A is activated.

When the write command W[0] having the first bit line BL0 as an address is input, and after 2CLK elapse, the write command W[1] having the second bit line BL1 as an address may be input. The write command W[1] is synchronized with the clock signal CLK, and a second CSL enable signal CSLEP_B is activated to a logic 'high' level. When the second column selecting signal CSL B1 of the second bit line BL1 is also activated to a logic 'high' level in response to the second CSL enable signal CSLEP_B, the second column selector NB 1 connected to the second bit line BL1 is turned on. When the second column selector NB1 is turned on, the second bit line BL1 and the second local input/output line LIO B are electrically connected to each other and data is transmitted to the memory cells 3121 through the second local input/output line LIO B.

When the write command W[1] having the second bit line BL1 as an address is input, and after 2CLK elapses, the write command W[1] having the second bit line BL1 as an address may be input again. The write command W[1] may be synchronized with the clock signal CLK and the first CSL enable signal CSLEP_A is activated to a logic 'high' level. During a write operation, data that is lastly input is important. Thus, before a first column selector NA1 is turned on, a second column selector NB1 needs to be turned off. To this end, a second CSL disable signal CSLDIS_B is activated to a logic 'high' level and a second column selecting signal CSL B1 enters a logic 'low' level in response to the second CSL disable signal CSLDIS_B.

The second column selector NB1 is turned off and the first column selector NA1 is turned on. Thus, the second bit line BL1 and the first local input/output line LIO A are electrically connected to each other and data is transmitted to the memory cells 3121 through the first local input/output line LIO A.

Figure 31:
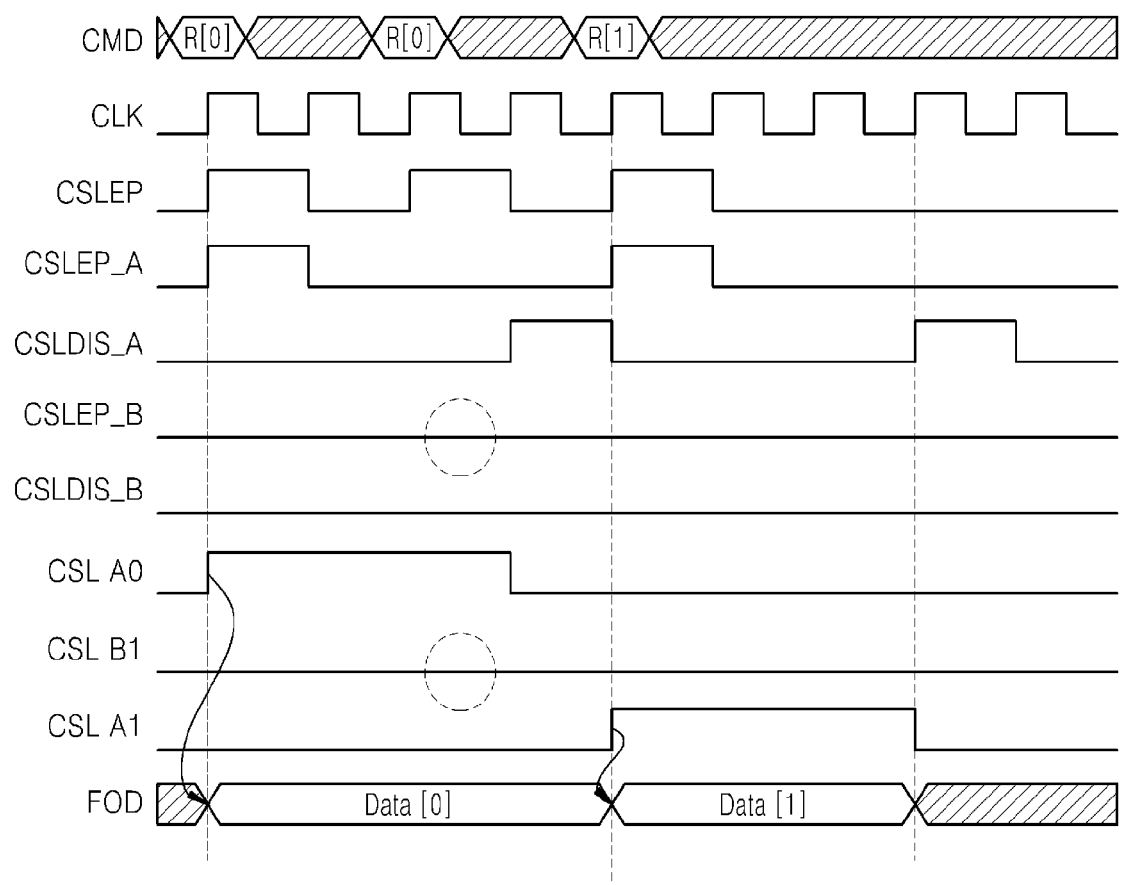
FIG. 31 is a timing diagram showing an operation of a semiconductor memory device when read commands having the same address are consecutively input, according to an embodiment of the inventive concept.

FIG. 31 is a timing diagram showing an operation of a semiconductor memory device when read commands having the same address are consecutively input, according to an embodiment of the inventive concept. When read commands having the same address are consecutively input, data read from a memory cell is transmitted and stored in a peripheral region Peripherals in response to a first read command. Then, when the read command having the same address is input again, the data that is previously stored in the peripheral region Peripherals may be output to the outside.

Referring to FIGS. 27 and 31, when a first read command R[0] having the first bit line BL0 as an address is input, the first read command R[0] is synchronized with the clock signal CLK and the first CSL enable signal CSLEP_A is activated to a logic 'high' level. When the first column selecting signal CSL A0 of the first bit line BL0 is also activated to a logic 'high' level in response to the first CSL enable signal CSLEP_A, the first column selector NA0 connected to the first bit line BL0 is turned on. In this case, until the first CSL disable signal CSLDIS_A is activated, the logic 'high' level of the first column selecting signal CSL A0 is maintained. When the first column selector NA0 is turned on, the first bit line BL0 and the first local input/output line LIO A are electrically connected to each other and data stored in the memory cells 3121 is transmitted through the data output line FDO.

When the first read command R[0] having the first bit line BL0 as an address is input, and after 2CLK elapses, a second read command R[0] having the same bit line as that of the first read command R[0] as an address may be input again. However, in this case, a second CSL enable signal CSLEP_B is not activated. Thus, a second column selecting signal CSL B0 is not activated and a turn-off state of a second column selector NB0 is maintained. Instead, data stored in a peripheral region positioned between the first local input/output line LIO A and the data output line FDO is transmitted to the outside through the data output line FDO in response to the second read command R[0].

Figure 32:
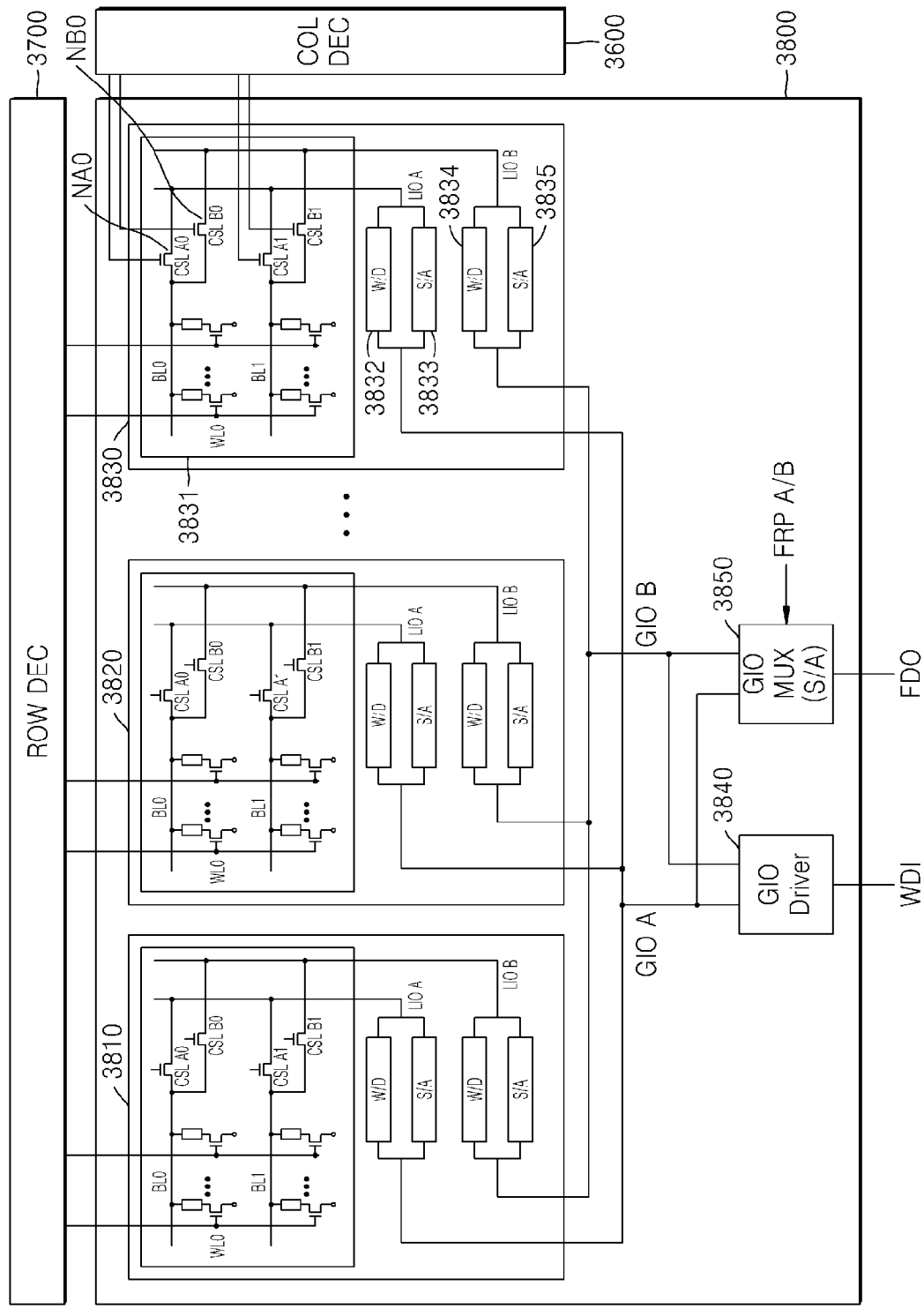
FIG. 32 is a block diagram of a semiconductor memory device according to another embodiment of the inventive concept.

FIG. 32 is a block diagram of a semiconductor memory device according to another embodiment of the inventive concept. The semiconductor memory device according to the present embodiment may include a column decoder 3600, a row decoder 3700, and a bank 3800. The bank 3800 includes a plurality of memory blocks 3810, 3820, and 3830.

Each of the memory blocks 3810, 3820, and 3830 includes a memory cell region 3831 including a plurality of memory cells, first and second local input/output lines LIO A and LIO B, a first local write driver 3832, a first local sense amplifier 3833, a second local write driver 3834, and a second local sense amplifier 3835.

Bit lines BL0 to BLM of the memory cell region 3831 are electrically connected to first and second column selectors NA and NB, respectively. For example, the first bit line BL0 is connected to first and second column selectors NA0 and NB0. When the column decoder 3600 applies the first column selecting signal CSL A0 the first column selector NA0 is turned on and data stored in a memory cell is input and output through the first local input/output line LIO A. In this case, during a write operation, data is input through the first local write driver 3832, and during a read operation, data is output through the first local sense amplifier 3833.

When the column decoder 3600 applies a signal for selecting a second column selecting signal CSL B0, the second column selector NB0 is turned on and data stored in a memory cell is input and output through the second local input/output line LIO B. In this case, during a write operation, data is input through the second local write driver 3834, and during a read operation, data is output through the second local sense amplifier 3835.

In the memory blocks 3810, 3820, and 3830, the first local input/output lines LIO A are electrically connected to the first global input/output line GIO A, and the second local input/output lines LIO B are electrically connected to the second global input/output line GIO B.

The first and second global input/output lines GIO A and GIO B are connected to a global input/output driver 3840 and a global multiplexer 3850, respectively. The global input/output driver 3840 receives data through the data input line WDI, and the global multiplexer 3850 outputs data through the data output line FDO.

Figure 33:
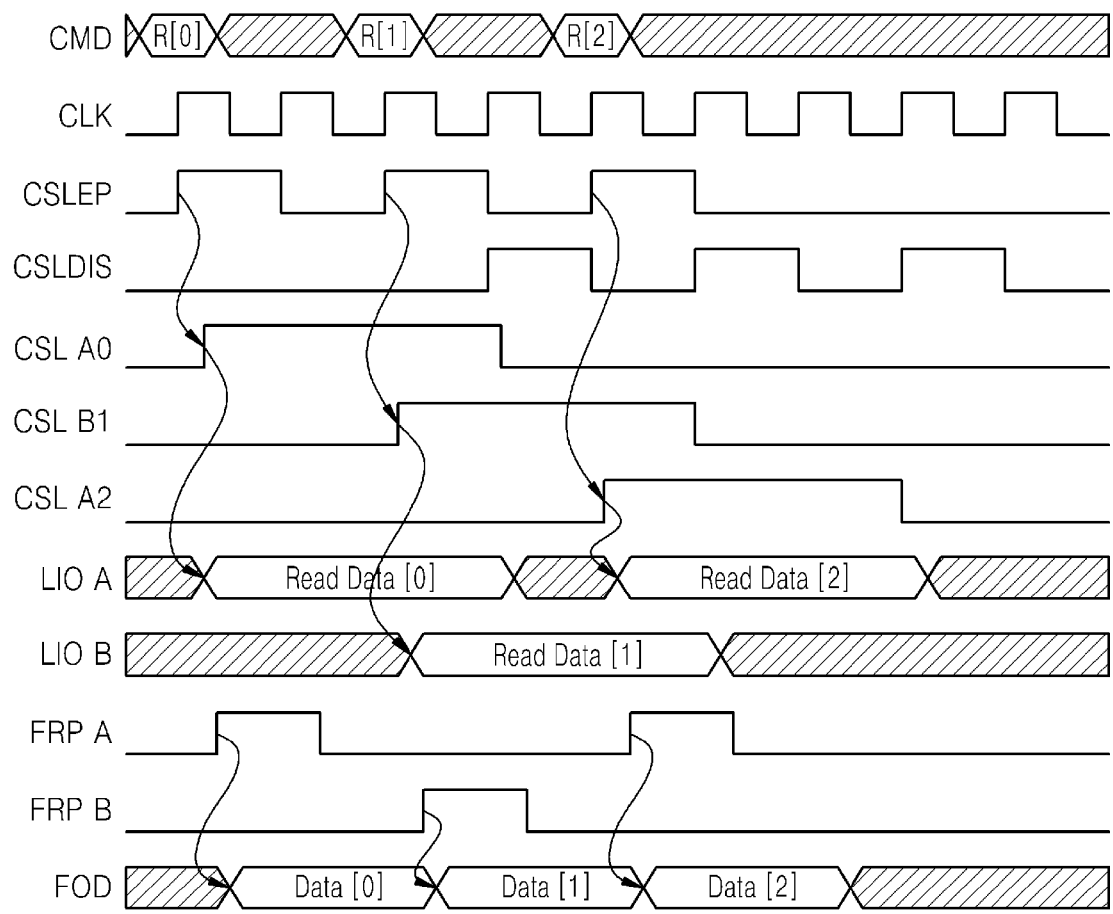
FIG. 33 is a timing diagram showing an operation of a semiconductor memory device when read commands are consecutively input, according to another embodiment of the inventive concept.

FIG. 33 is a timing diagram showing an operation of a semiconductor memory device when read commands are consecutively input, according to another embodiment of the inventive concept. FIGS. 27, 32, and 33 show an input/output path of data when a command is input to the semiconductor memory device from an external source.

Referring to FIG. 33, when a read command R[0] having the first bit line BL0 as an address is input from the external source, the read command R[0] is synchronized with the clock signal CLK and the CSL enable signal CSLEP is activated to a logic 'high' level. When a first column selecting signal CSL A0 of the first bit line BL0 is also activated to a logic 'high' level in response to the CSL enable signal CSLEP, the first column selector NA0 connected to the first bit line BL0 is turned on. When the first column selector NA0 is turned on, the first bit line BL0 and the first local input/output line LIO A are electrically connected to each other and data stored in the memory cells 3121 is transmitted to the outside through the first local input/output line LIO A.

When the read command R[0] having the first bit line BL0 as an address is input, and after 2CLK elapse, a read command R[1] having the second bit line BL1 as an address may be input. The read command R[1] may be synchronized with the clock signal CLK and the CSL enable signal CSLEP is activated to a logic 'high' level. When the second column selecting signal CSL B1 of the second bit line BL1 is also activated to a logic 'high' level in response to the CSL enable signal CSLEP, the second column selector NB 1 connected to the second bit line BL1 is turned on. When the second column selector NB1 is turned on, the second bit line BL1 and the second local input/output line LIO B are electrically connected to each other and data stored in the memory cells 3121 is transmitted to the outside through the second local input/output line LIO B. In this case, signals may overlap each other at the first and second local input/output lines LIO A and LIO B for a predetermined period.

When the read command R[1] having the second bit line BL1 as an address is input, and after 2CLK elapse, the read command R[2] having the third bit line BL2 as an address may be input. The read command R[2] may be synchronized with the clock signal CLK, and the CSL enable signal CSLEP is activated to a logic 'high' level. When the first column selecting signal CSL A2 of the third bit line BL2 is also activated to a logic 'high' level in response to the CSL enable signal CSLEP, the first column selecting unit NA 2 connected to the third bit line BL2 is turned on. When the first column selecting unit NA 2 is turned on, the third bit line BL2 and the first local input/output line LIO A are electrically connected to each other and data stored in the memory cells 3121 is transmitted to the outside through the first local input/output line LIO A. In this case, signals may overlap each other on the first and second local input/output lines LIO A and LIO B for a predetermined period at the first and second local input/output lines LIO A and LIO B.

Data read from the memory blocks 3810, 3820, and 3830 is transmitted to the global multiplexer 3850 through the first and second global input/output lines GIO A and GIO B that are electrically connected to the first and second local input/output lines LIO A and LIO B. The global multiplexer 3850 receives data through the first and second global input/output lines GIO A and GIO B and selectively outputs data in response to first and second read control signals FRP A and FRP B. Whenever the first and second read control signals FRP A and FRP B are activated, data is serially output to the data output line FDO. In this case, an interval at which data is output is tCCD.

Figure 34:
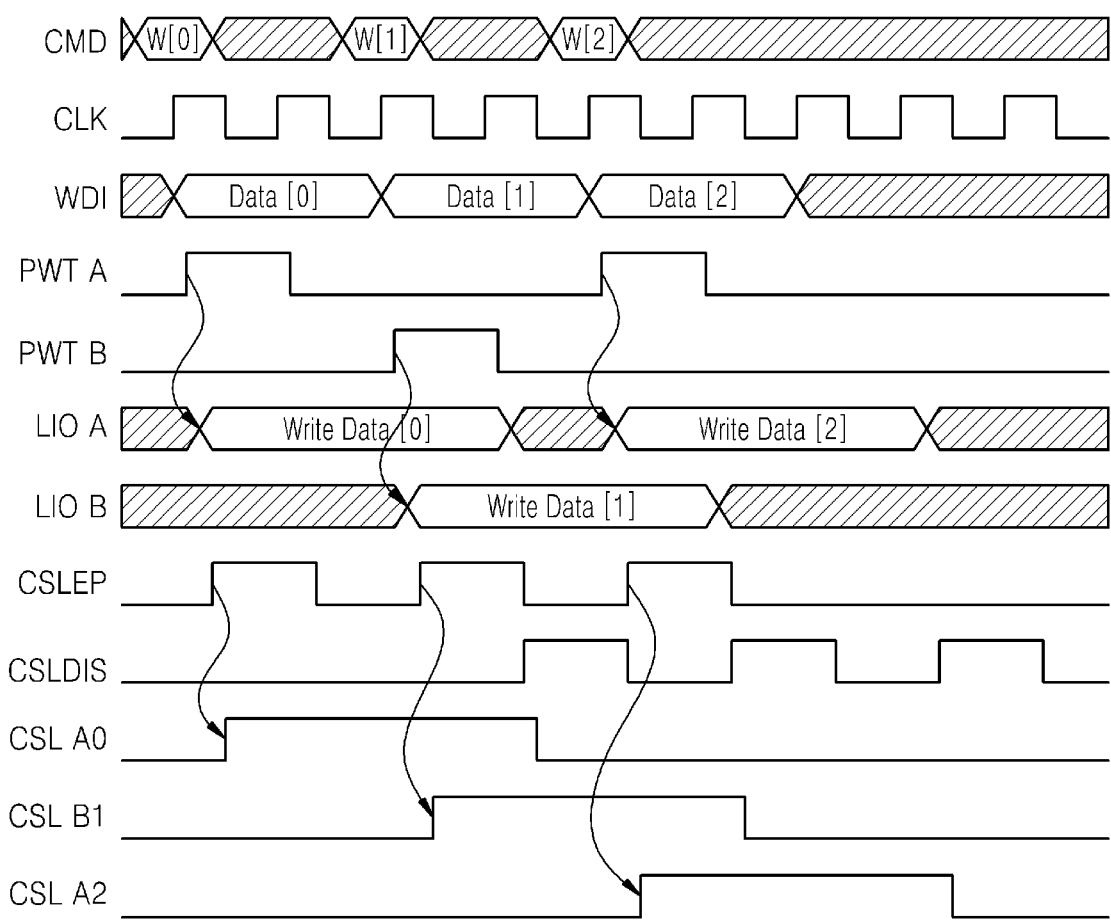
FIG. 34 is a timing diagram showing an operation of a semiconductor memory device when write commands are consecutively input, according to another embodiment of the inventive concept.

FIG. 34 is a timing diagram showing an operation of a semiconductor memory device when write commands are consecutively input, according to another embodiment of the inventive concept. Referring to FIGS. 27, 32, and 34, in the semiconductor memory device, the write command W[0] having the first bit line BL0 as an address, the write command W[1] having the second bit line BL1 as an address, and a write command W[2] having the third bit line BL2 as an address may be sequentially input at an interval of 2CLK. The write commands W[0], W[1], and W[2] are synchronized with the clock signal CLK and data to be stored in the memory cells 3121 is input to the global input/output driver 3840 through the data input line WDI.

The first local write driver 3832 connected to the global input/output driver 3840 transmits first data to the first local input/output line LIO A through the first global input/output line GIO A in response to the first write control signal PWT A. When the CSL enable signal CSLEP is activated to a logic 'high' level, the first column selecting signal CSL A0 of the first bit line BL0 is also activated to a logic 'high' level in response to the CSL enable signal CSLEP. In addition, the first column selector NA0 connected to the first bit line BL0 is turned on. When the first column selector NA0 is turned on, the first bit line BL0 and the first local input/output line LIO A are electrically connected to each other and data is transmitted to the memory cells 3121 through the first local input/output line LIO A.

Then, the second local write driver 3834 connected to the global input/output driver 3840 transmits second data to the second local input/output line LIO B through the second global input/output line GIO B in response to the second write control signal PWT B. When the CSL enable signal CSLEP is activated to a logic 'high' level, the second column selecting signal CSL B1 of the second bit line BL1 is also activated to a logic 'high' level in response to the CSL enable signal CSLEP. The second column selector NB1 connected to the second bit line BL1 is turned on in response to the second column selecting signal CSL B1. When the second column selector NB1 is turned on, the second bit line BL1 and the second local input/output line LIO B are electrically connected to each other and data is transmitted to the memory cells 3121 through the second local input/output line LIO B.

Then, the first local write driver 3832 connected to the global input/output driver 3840 transmits third data to the first local input/output line LIO A through the first global input/output line GIO A in response to the first write control signal PWT A. When the CSL enable signal CSLEP is activated to a logic 'high' level, the first column selecting signal CSL A2 of the third bit line BL2 is also activated to a logic 'high' level in response to the CSL enable signal CSLEP. The first column selecting unit NA 2 connected to the third bit line BL2 is turned on in response to the first column selecting signal CSL A2. When the first column selecting unit NA 2 is turned on, the third bit line BL2 and the first local input/output line LIO A are electrically connected to each other and data is transmitted to the memory cells 3121 through the first local input/output line LIO A.

FIGS. 35 through 44 are diagrams for explaining a data masking operation of a semiconductor memory device including STT-MRAM cells, according to an embodiment of the inventive concept.

Figure 35:
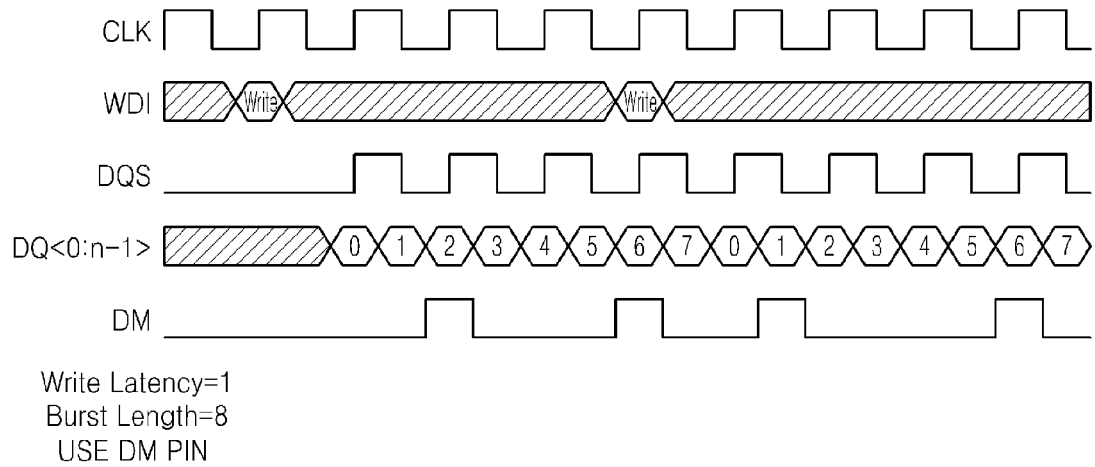
FIG. 35 is a timing diagram showing a data masking operation according to an embodiment of the inventive concept.
Figure 36:
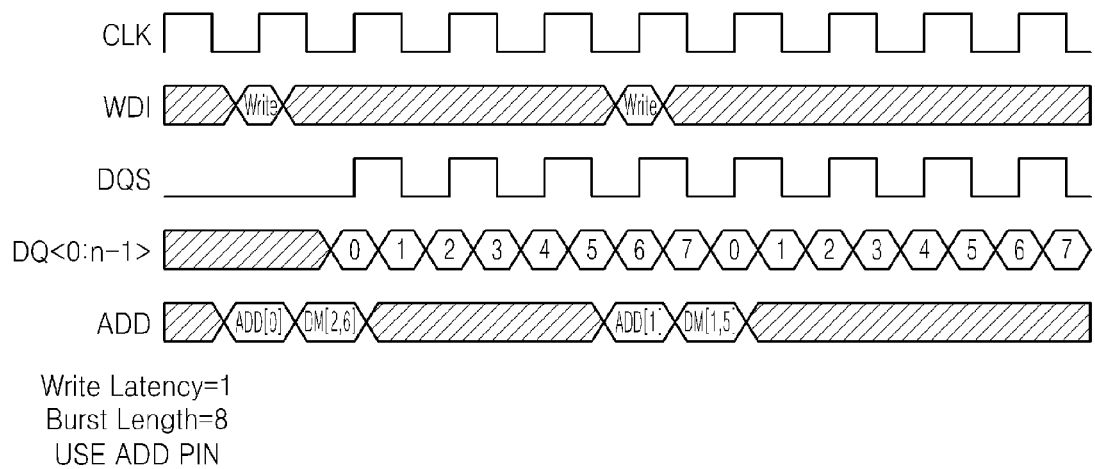
FIG. 36 is a timing diagram showing a data masking operation according to another embodiment of the inventive concept.

FIGS. 35 and 36 are timing diagrams of signals that are input from an external source in order to perform a data masking operation. In the semiconductor memory system 100 of FIG. 1, the memory controller 110 transmits a command signal CMD, a clock signal CLK, and an address signal ADD to the memory device 120, or communicates with the memory device 120 to transmit and receive data DATA.

FIG. 35 is a timing diagram showing a data masking operation, according to an embodiment of the inventive concept. Referring to FIG. 35, the semiconductor memory device 120 may additionally receive a data masking signal DM from the memory controller 110 through a data masking DM pin. When a write command is input at a rising edge of the clock signal CLK, a data strobe signal DQS is activated. In addition, data DQ is input in response to the data strobe signal DQ. In this case, eight pieces of data DQ0 to DQ7 are consecutively input via a burst operation. The data masking signal DM, which is toggled at the same speed as a speed at which the data masking signal DM is input, is received. When data that is subject to masking is input, the data masking signal DM is activated to a logic 'high' level. For example, when a first write command is input, since the data masking signal DM is activated to a logic 'high' level at a point in time when third data DQ 2 and seventh data DQ 6 are input, the third data DQ 2 and the seventh data DQ 6 are not written in the memory device 120.

FIG. 36 is a timing diagram showing a data masking operation according to another embodiment of the inventive concept. Referring to FIG. 36, the memory device 120 may not further include a data masking pin DM Pin and may use an original address pin ADD Pin in order to perform a data masking operation. After a write command CMD and an address ADD that is subject to writing are input from the memory controller 110, data DQ is input in response to the data strobe signal DQ. In this case, eight pieces of data DQ0 to DQ7 are consecutively input via a burst operation. When the data DQ0 to DQ7 is input, the memory device 120 may receive the masking signal DM for masking data from the memory controller 110 through the address pin ADD Pin. For example, when a first write command is input, if a signal DM[2,6] for masking second data DQ 1 and sixth data DQ 5 are input through the address pin ADD Pin, the second and sixth data DQ1 and DQ5 are not written in the memory device 120.

Figure 37:
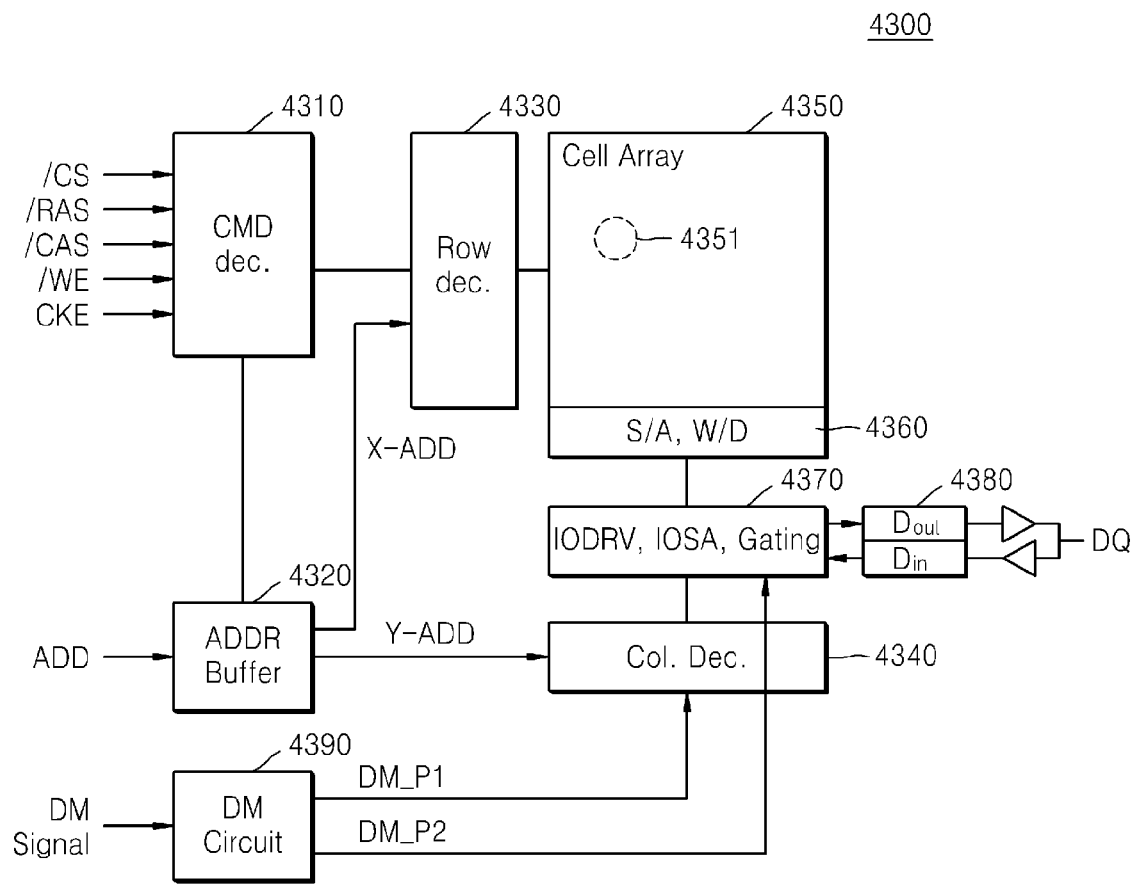
FIG. 37 is a block diagram of a semiconductor memory device according to an embodiment of the inventive concept.

FIG. 37 is a block diagram of a semiconductor memory device 4300 according to an embodiment of the inventive concept. The semiconductor memory device 4300 includes a command decoder 4310, an address buffer 4320, a row decoder 4330, a column decoder 4340, a cell array 4350 including memory cells 4351, a write driver/sense amplifier 4360, an input/output driver unit 4370, and a data input/output unit 4380. The memory cell 4351 may be embodied as an STT-MRAM cell.

The semiconductor memory device 4300 further includes a data masking circuit 4390. The data masking circuit 4390 may mask data in response to the masking signal DM such that at least one piece of input data may not be written in a memory cell. In this case, for example, in order to control a masking operation in the semiconductor memory device 4300, a masking control signal DM_P1 may be transmitted to the column decoder 4340 and data may be masked via a column selection signal CSL (not shown). Alternatively, a masking control signal DM_P2 is transmitted to the input/output driver unit 4370 and data may be masked by controlling input/output of data.

FIG. 37 shows the above-described two examples for masking data. However, the inventive concept is not limited thereto. The method in which data is not written may be changed in a variety of different ways. In addition, FIG. 37 shows a case where the data masking circuit 4390 outputs the masking control signals DM_P1 and DM_P2. However, according to an alternative method of masking data, only one masking control signal may be output.

Data masking using the column selection signal CSL will be described in detail with reference to FIGS. 38 through 41. Data masking using input/output of data will be described in detail with reference to FIGS. 42 through 44.

FIGS. 38 through 41 are a block diagram, a circuit diagram, and timing diagrams, respectively, for explaining a method of masking data when data is input and output via burst access and data is accessed in response to different column selecting signals.

Figure 38:
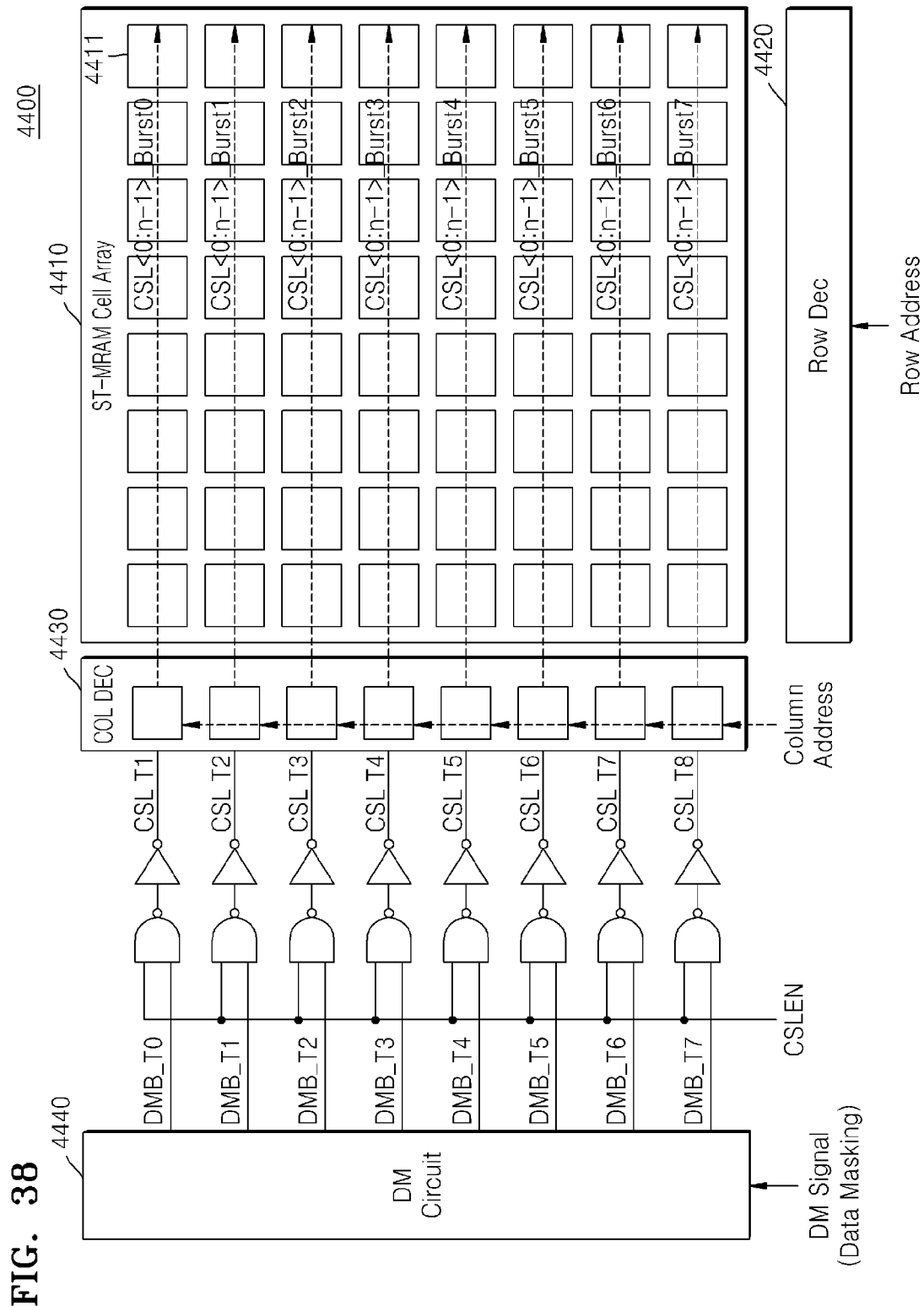
FIG. 38 is a block diagram of a semiconductor memory device including a cell array that is an example of a cell array of FIG. 37, according to an embodiment of the inventive concept.
Figure 39:
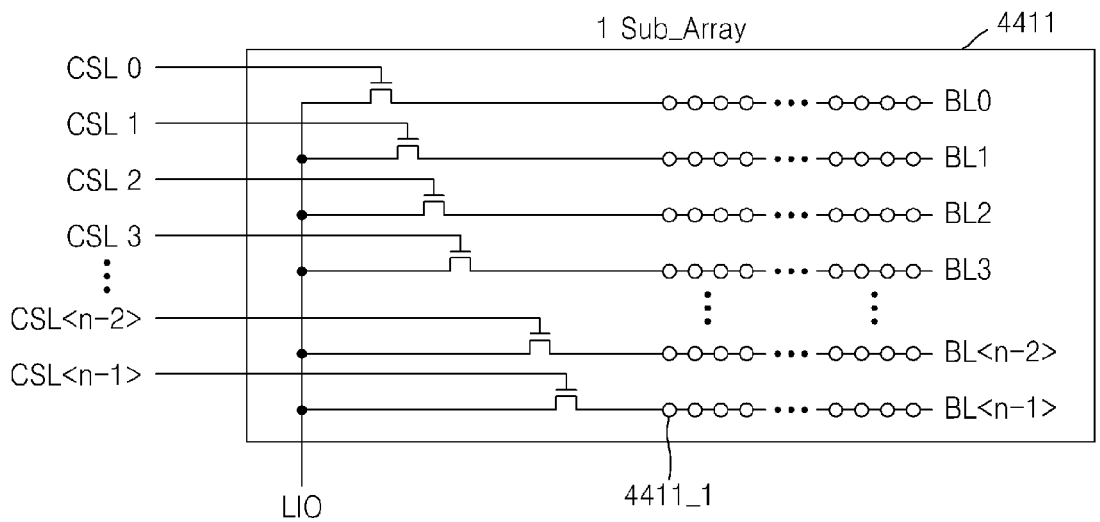
FIG. 39 is a circuit board of a sub array of FIG. 38, according to an embodiment of the inventive concept.

FIG. 38 is a block diagram of a semiconductor memory device 4400 including a cell array 4410 that is an example of the cell array 4350 of FIG. 37, according to an embodiment of the inventive concept. FIG. 39 is a circuit board of a sub array 4411 of FIG. 38, according to an embodiment of the inventive concept. Referring to FIGS. 38 and 39, the semiconductor memory device 4400 includes the cell array 4410, a row decoder 4420, a column decoder 4430, and a data masking circuit 4440. Referring to FIG. 39, the cell array 4410 includes a plurality of sub arrays 4411. Each of the sub arrays 4411 may include a plurality of STT-MRAM cells 4411_1. Data paths of the sub arrays 4411 share a local input/output line LIO. A column selector for controlling electrical connection between bit lines BL0 to BL<n-1> and the local input/output line LIO is disposed at ends of the bit lines BL0 to BL<n-1>. A column selecting signal is applied as a gate voltage of the column selector through the column selecting lines CSL0 to CSL<n-1>.

In this case, the burst access is a method in which data is synchronized with a clock signal in a memory and is consecutively input and output. When an activation command ACT_CMD and a row address are input at a rising edge of the clock signal, the memory enters an activated state and a word line is selected in response to the row address. Then, with regard to a next clock signal, when a write command Write CMD is input and a column address is input, the burst access is performed. That is, after one or more clocks elapse, as the number of input column addresses is increased by as much as 1, data is consecutively input and output.

Referring back to FIG. 38, during a data write operation, the data masking circuit 4440 outputs burst masking signals DMB T0 to DMB T7. A logical operation is performed on the burst masking signals DMB T0 to DMB T7 and a CSL enable signal CSLEN via one or more logical devices (e.g., a NAND gate and an inverter). Column selecting signals CSL T1 to CSL T8 are generated as a result of the logical operation and are provided to the column decoder 4430. Thus, at least one of the column selecting signals CSL T1 to CSL T8, which corresponds to burst data that is subject to masking, is activated such that data may be selectively written in the cell array 4410.

Figure 40:
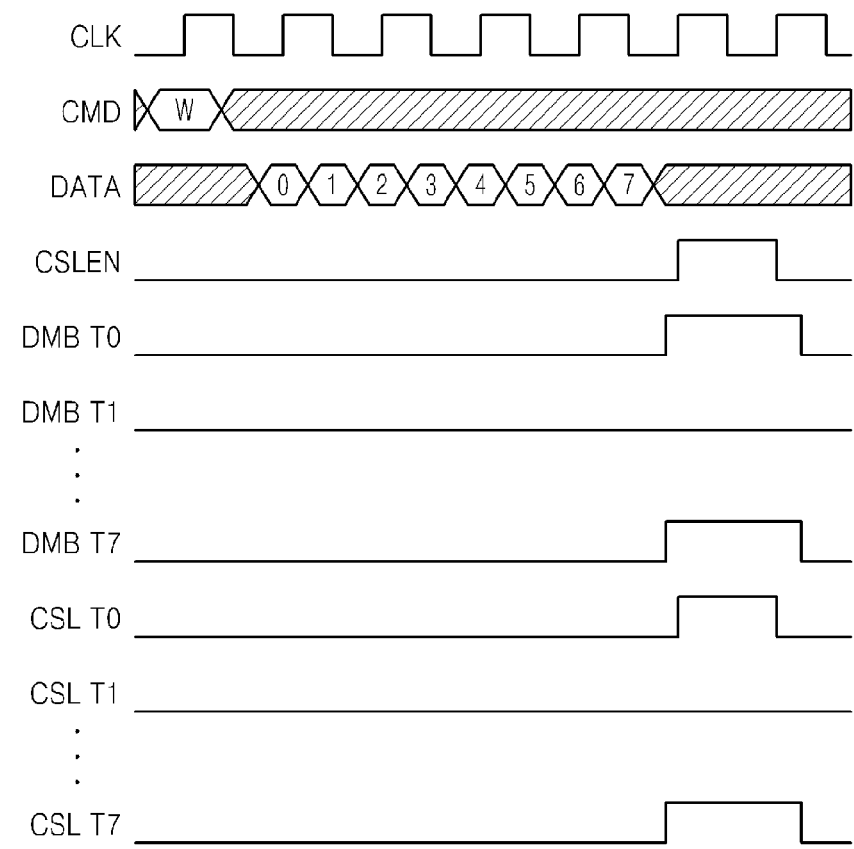
FIG. 40 is a timing diagram for describing a masking operation of a cell array of FIG. 39, according to an embodiment of the inventive concept.

Referring to FIG. 40, when the write command Write CMD is input, eight pieces of data Data 0 to Data 7 are consecutively input and then the CSL enable signal CSLEN is activated to a logic 'high' level. The pieces of data, which are consecutively input, may be provided to the cell array 4410 according to corresponding column addresses. Some of the pieces of data Data 0 to Data 7 are masked by inactivating the column selection signal CSL in response to a burst masking signal DMB. For example, a second column selecting signal CSL T1 is inactivated in response to a second burst masking signal DMB T1, and thus, data (e.g., Data 1) corresponding to the second column selecting signal CSL T1 is masked such that the data is not written in the cell array 4410.

Figure 41:
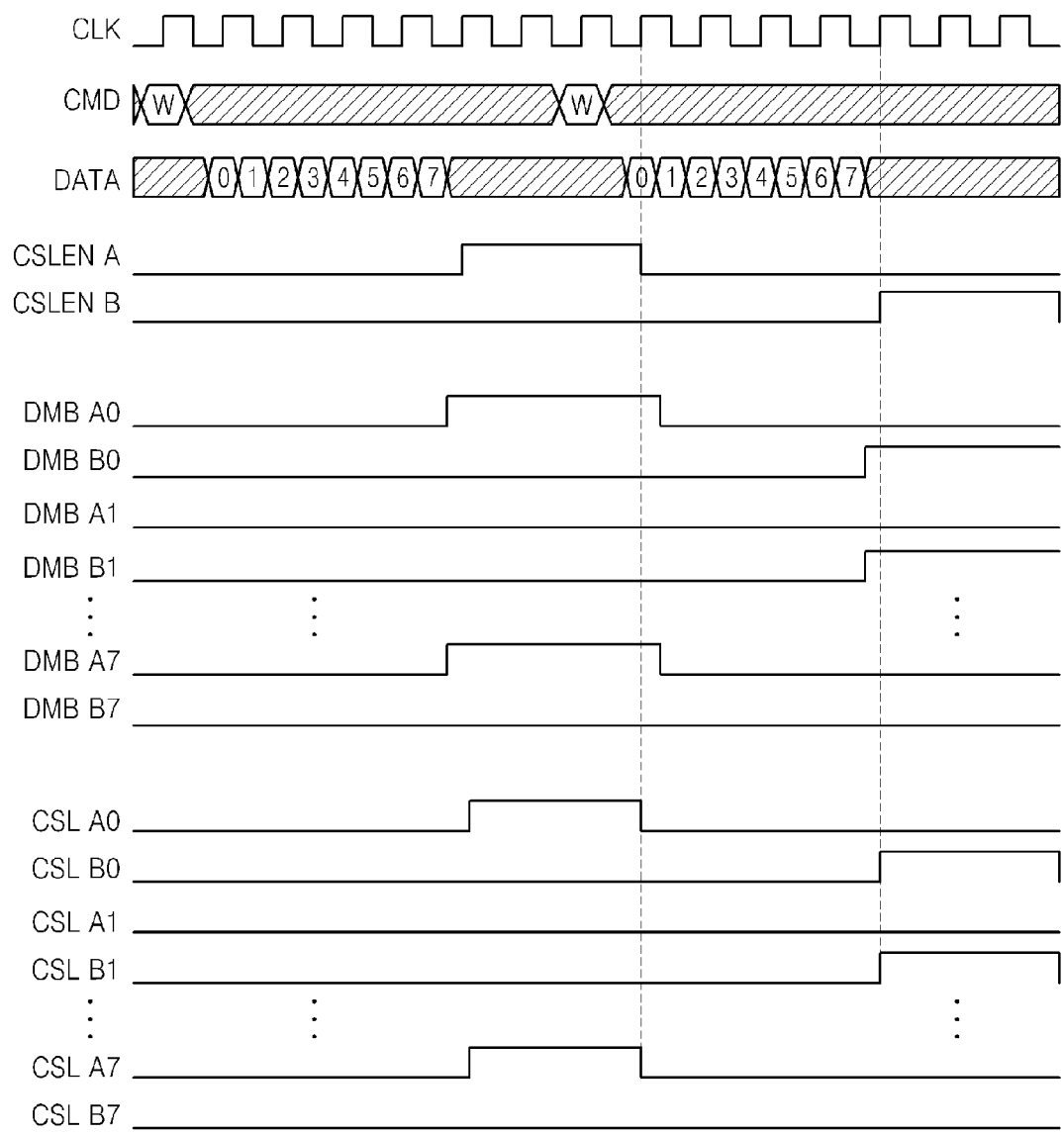
FIG. 41 is a timing diagram showing a data masking operation when a plurality of column selectors are arranged to correspond to a single bit line, according to an embodiment of the inventive concept.

FIG. 41 is a timing diagram showing a data masking operation when a plurality of column selectors (e.g., two column selectors) are arranged to correspond to a single bit line, according to an embodiment of the inventive concept. Referring to FIGS. 37 and 41, whenever a command is input from an external source, first column selecting signals CSL A0 to CSL A7 for operating a first column selector and second column selecting signals CSL B0 to CSL B7 for operating a second column selector are alternately activated.

When the write command Write CMD is input, eight pieces of data are consecutively input via a burst operation and then a first CSL enable signal CSLEN A is activated to a logic 'high' level. The pieces of data, which are consecutively input, may be provided to the cell array 4410 according to corresponding column addresses. Some of the pieces of data are masked by inactivating a column selecting signal CSL A in response to the burst masking signal DMB. For example, a first column selecting signal CSL A1 is inactivated in response to a second burst masking signal DMB A1, and thus, data corresponding to the first column selecting signal CSL A1 is masked such that the data is not written in the cell array 4410.

Then, when the write command Write CMD is input, eight pieces of data Data 0 to Data 7 are consecutively input via a burst operation and then a second CSL enable signal CSLEN B is activated to a logic 'high' level. Some of the pieces of data Data 0 to Data 7 are masked by inactivating the column selecting signal CSL A in response to a burst masking signal DMB B. For example, a second column selecting signal CSL B7 is inactivated in response to a burst masking signal DMB B7, and thus, data corresponding to the second column selecting signal CSL B7 is masked such that the data is not written in the cell array 4410.

Figure 42:
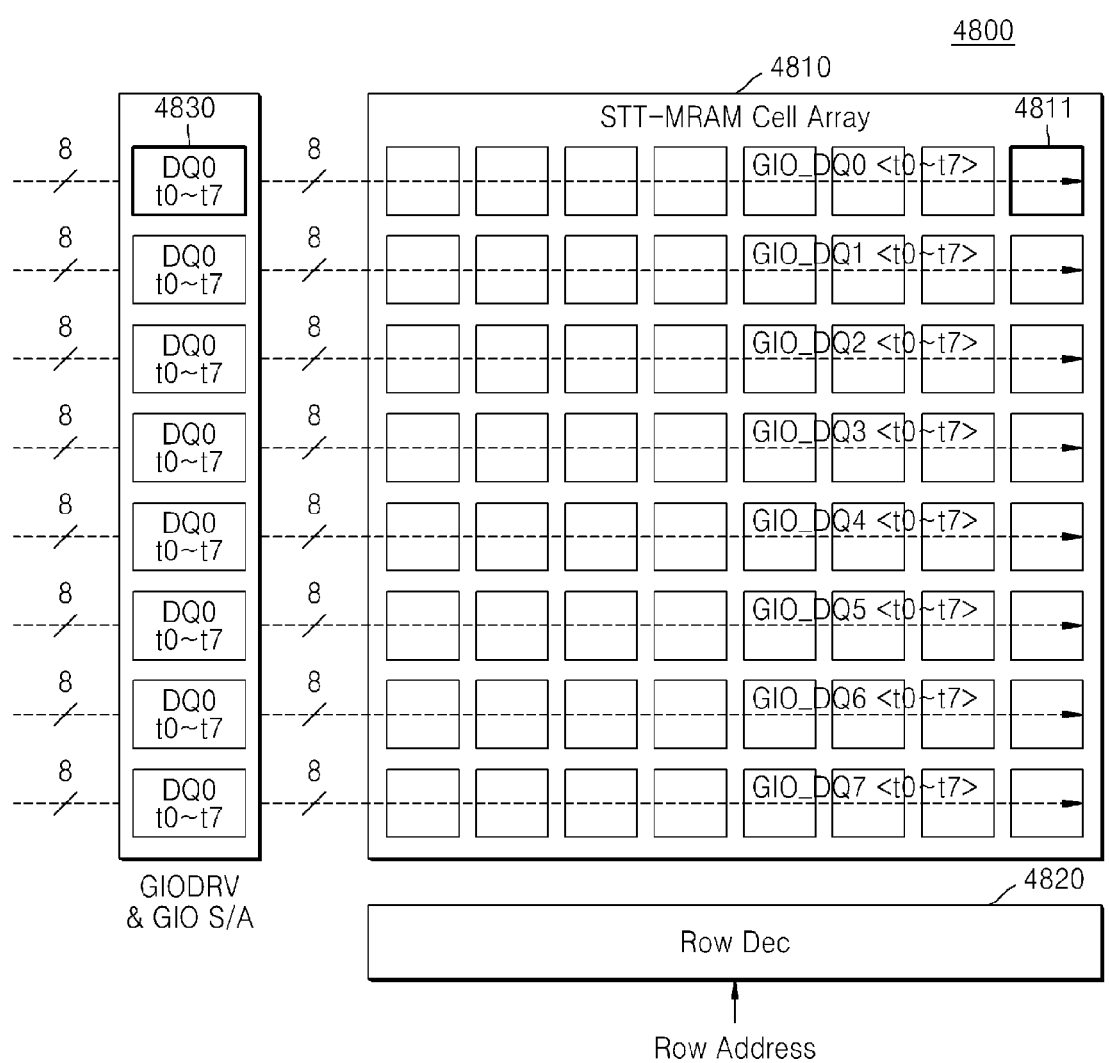
FIG. 42 is a block diagram of a semiconductor memory device according to another embodiment of the inventive concept.
Figure 43:
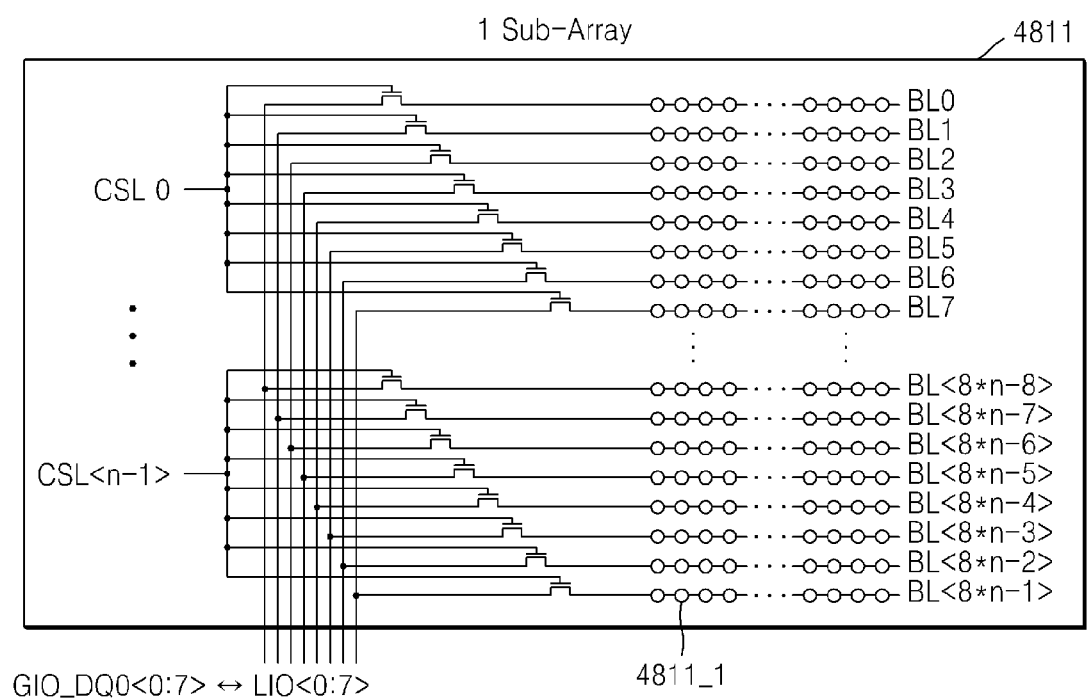
FIG. 43 is a circuit diagram of a sub array of FIG. 42, according to an embodiment of the inventive concept.
Figure 44:
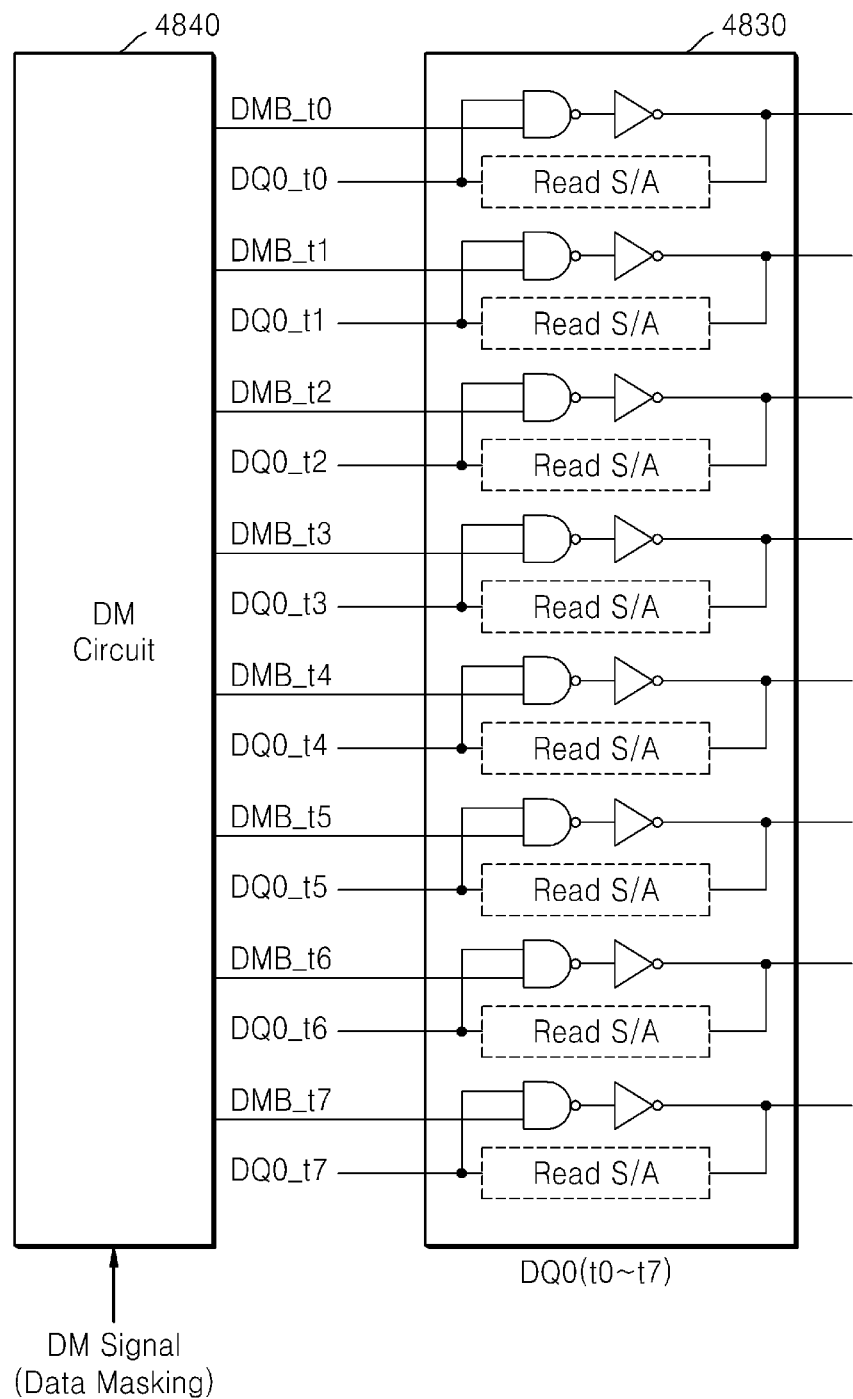
FIG. 44 is a circuit diagram of a global input/output drive/sense amplifier of FIG. 42, according to an embodiment of the inventive concept.

FIGS. 42 through 44 are a block diagram and circuit diagrams for explaining a data masking method of a case where data corresponding to a burst is accessed based on the same column selecting signal when data is input and output via burst access, according to embodiments of the inventive concept.

FIG. 42 is a block diagram of a semiconductor memory device 4800 according to another embodiment of the inventive concept. FIG. 43 is a circuit diagram of a sub array 4811 of FIG. 42, according to an embodiment of the inventive concept. FIG. 44 is a circuit diagram of a global input/output drive/sense amplifier 4830 of FIG. 42, according to an embodiment of the inventive concept.

Referring to FIG. 42, the semiconductor memory device 4800 may include a cell array 4810, a row decoder 4820, and global input/output drive/sense amplifiers 4830. The cell array 4810 includes a plurality of sub arrays 4811. Referring to FIG. 43, the sub array 4811 may include a plurality of STT-MRAM cells 4811_1. A plurality of bit lines (e.g., eight bit lines) from among bit lines of the sub array 4811 may share a single column selection signal CSL. For example, the eight bit lines BL0 to BL7 may share the column selection signal CSL<0>. The bit lines BL0 to BL7 that share the column selection signal CSL<0> may be connected to different local input/output lines LIO<0:7>.

That is, when data is input and output via burst access, if burst data is accessed based on the same column selecting signal, some of a plurality of pieces of data may not be masked by using the column selection signal CSL. Thus, in this case, the data may not be written by controlling the global input/output drive/sense amplifier 4830 connected to a column address of data that is subject to masking.

Referring to FIGS. 42 through 44, during a data write operation, a data masking circuit 4840 outputs the burst masking signals DMB T0 to DMB T7 in response to a masking signal DM. Then, burst masking signals DMB t1 to DMB t7 are provided to a data write path. A logical operation is performed on the burst masking signals DMB t1 to DMB t7 via burst data DQ0_t0 to DQ0_t7 and one or more logical devices (e.g., a NAND gate and an inverter). Thus, data is selectively written in the cell array 4810 by shutting off a data path of a global input/output driver of burst data that is subject to masking.

Figure 45:
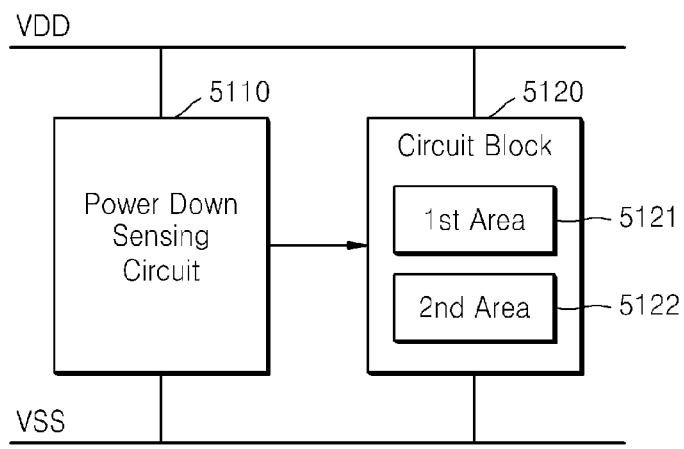
FIG. 45 is block diagram of a semiconductor memory device using a power down mode, according to an embodiment of the inventive concept.
Figure 46:
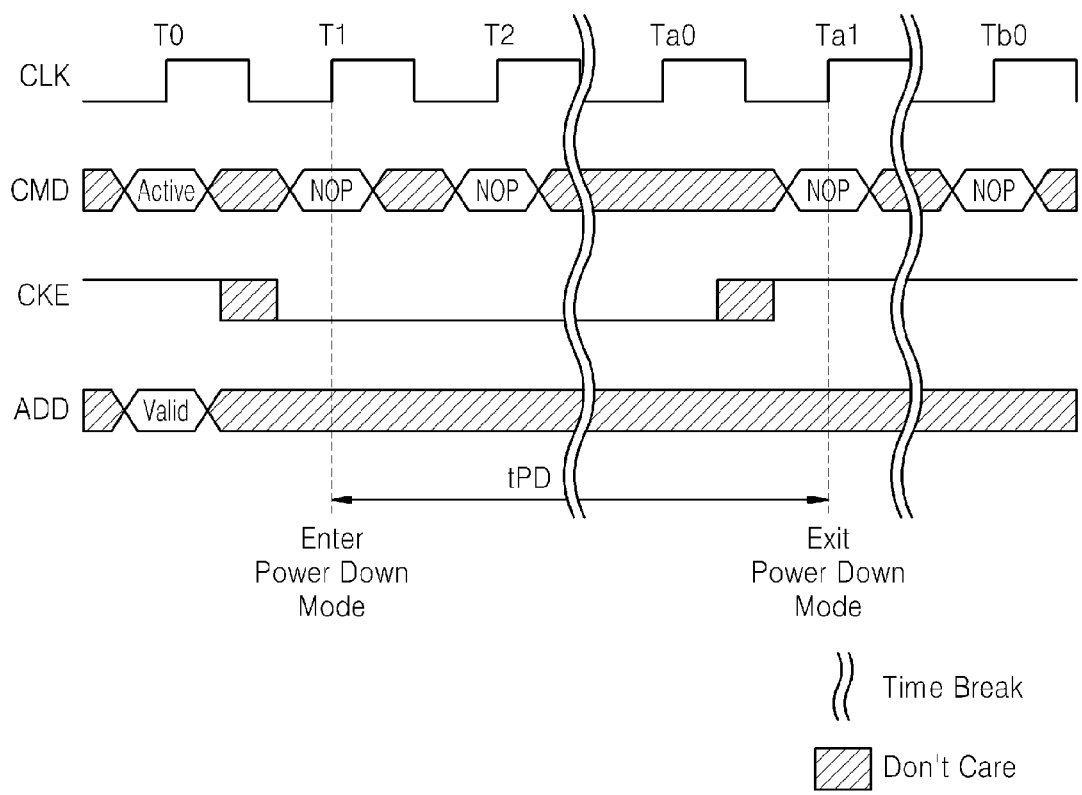
FIG. 46 is a timing diagram of a power down operation according to an embodiment of the inventive concept.

FIGS. 45 through 47 are diagrams for explaining a power down mode that is used in a semiconductor memory device 5100 including an STT-MRAM cell, according to an embodiment of the inventive concept. FIG. 45 is block diagram of the semiconductor memory device 5100 using the power down mode, according to an embodiment of the inventive concept. Referring to FIG. 45, the semiconductor memory device 5100 may operate by using a power voltage VDD and a ground voltage VSS and may include a power down sensing circuit 5110 for sensing the power down mode at a point in time and a circuit block 5120 of which power is adjusted by using the power down mode. The circuit block 5120 may include a first region 5121 that is a cell array region including a memory cell and a second region 5122 including a peripheral circuit and a power adjusting circuit.

Although the semiconductor memory device 5100 including an STT-MRAM cell enters the power down mode, stored data is retained due to nonvolatile properties. Thus, the first region 5121 may easily enter the power down mode and power consumption may be reduced without a loss of stored data.

The semiconductor memory device 5100 may enter or exit from the power down mode by a combination of commands that are applied from external sources or a signal that is received via an external pin such as a CKE pin. Alternatively, the semiconductor memory device 5100 may enter or exit from the power down mode when an idle time corresponding to a predetermined period of time elapses. In this case, a region that is subject to the power down mode may be changed according to a level of the power down mode. For example, when the level of the power down mode is increased, relatively many circuits may enter the power down mode. In addition, when the level of the power down mode is reduced, relatively few circuits may enter the power down mode. When the level of the power down mode is increased, both of the first region 5121 and the second region 5122 may operate in the power down mode. When the level of the power down mode is reduced, only the second region 5122 may operate in the power down mode or only some circuits of the second region 5122 may operate in the power down mode.

In addition, when the semiconductor memory device 5100 enters the power down mode, a voltage is shut off or an operation is not performed on a portion of the semiconductor memory device 5100 in order to minimize power consumption. When the semiconductor memory device 5100 enters the power down mode, the semiconductor memory device 5100 may operate in a different type of power down mode according to an operation condition of the semiconductor memory device 5100 before entering the power down mode.

FIGS. 46, 47A, 47B, and 47C are timing diagrams of a power down operation according to an embodiment of the inventive concept. Referring to FIG. 46, an activation command ACT and a row address are input at a rising edge T0 of a clock signal CLK. When a memory is activated, if a clock enable signal CKE is converted into a logic 'low' level, the semiconductor memory device 5100 may enter a first power down mode. In this case, the semiconductor memory device 5100 may enter different power down modes according to an operation state of the semiconductor memory device 5100 before entering the power down mode. For example, before the semiconductor memory device 5100 enters the power down mode, if the semiconductor memory device 5100 is activated, only the second region 5122 may enter the power down mode.

Figure 47A:
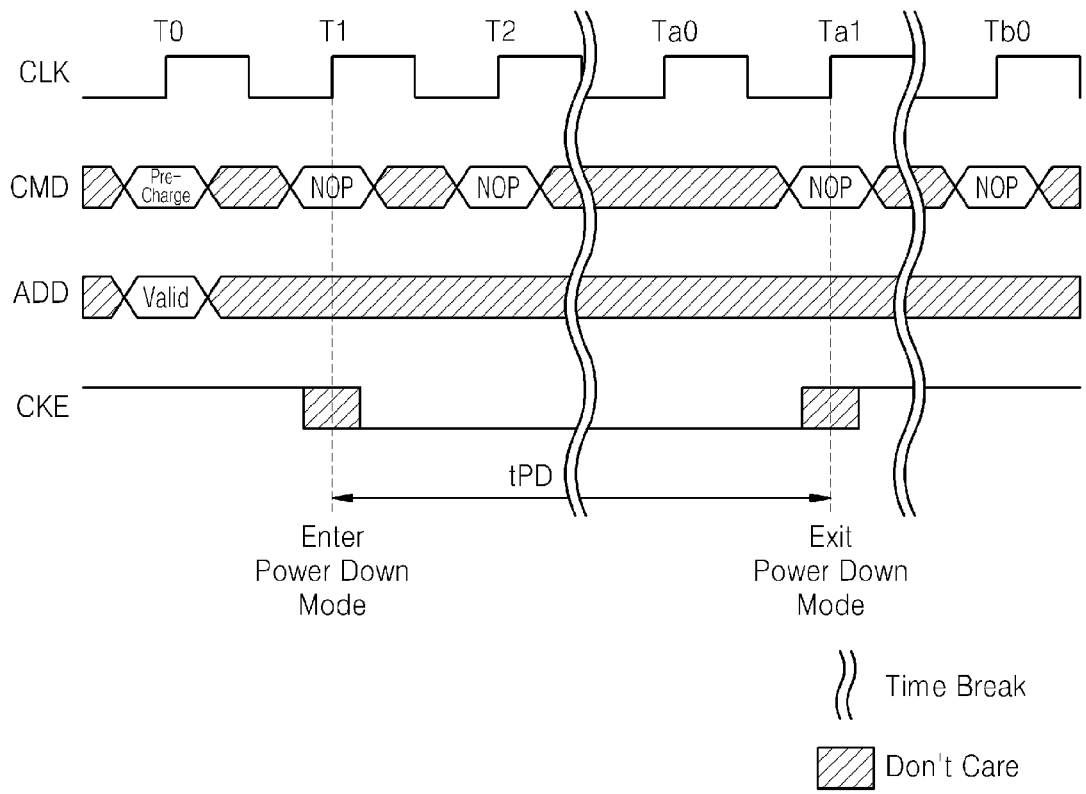
FIGS. 47A, 47B and 47C are timing diagrams of a power down operation according to another embodiment of the inventive concept.

Referring to FIG. 47A, a pre-charge command Pre-charge CMD and a row address are input at a rising edge of the clock signal CLK. Then, when the clock enable signal CKE is converted into a logic 'low' level, the semiconductor memory device 5100 enters a second power down mode. In this case, before the semiconductor memory device 5100 enters the second power down mode, when the semiconductor memory device 5100 is in a pre-charge state, both the first and second regions 5121 and 5122 may enter the power down mode. In this case, power consumption may be reduced in the second power down mode compared with the first power down mode corresponding to only a peripheral circuit. However, in the second power down mode, it takes a longer period of time to exit from the power down mode than the first power down mode.

Figure 47B:
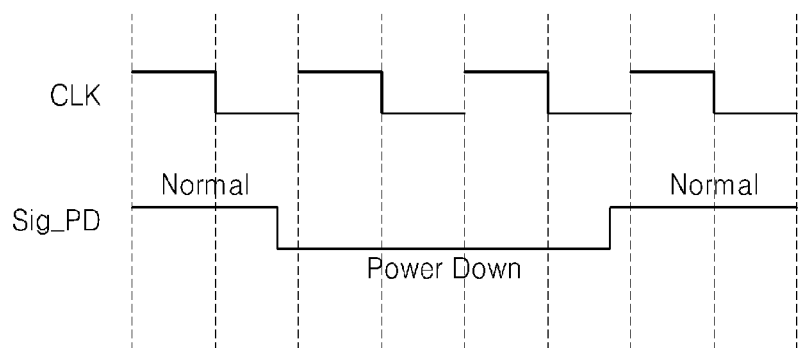

FIG. 47B shows a case where the semiconductor memory device 5100 enters a power down mode in response to a signal that is received via a particular pin included in the semiconductor memory device 5100. A particular pin for receiving a signal Sig_PD indicating entrance into the power down mode may be disposed in the semiconductor memory device 5100. In addition, the signal Sig_PD may be received from an external controller (not shown) and entrance into the power down mode may be adjusted based on the signal Sig_PD. For example, when the signal Sig_PD having a first state is received, the semiconductor memory device 5100 may enter the power down mode. When the signal Sig_PD having a second state is received, the semiconductor memory device 5100 may exit from the power down mode.

Figure 47C:
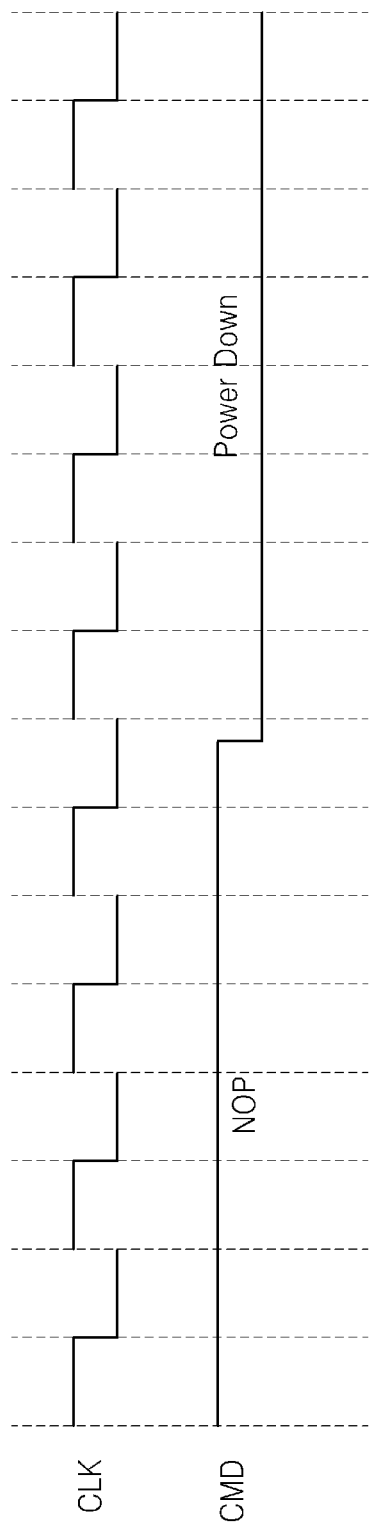

FIG. 47C shows a case where the semiconductor memory device 5100 enters a power down mode according to an operation state of the semiconductor memory device 5100. The semiconductor memory device 5100 may enter a non-operating period NPO according to a command CMD from an external controller (not shown). When the non-operating period NPO is maintained for a predetermined period of time, the semiconductor memory device 5100 may enter the power down mode. Then, when a command related to a normal operation is received from an external command (not shown), the semiconductor memory device 5100 may exit from the power down mode.

FIGS. 48 through 55 are diagrams for explaining a package, a pin, and a module of a semiconductor memory device package including an MRAM cell including an MTJ device, according to embodiments of the inventive concept. The semiconductor memory device package including the MRAM cell may include a pin structure and a package compatible with SDRAM. Also, a module including an MRAM chip may be realized to be compatible with an SDRAM module. In other words, a pin arrangement of the MRAM chip may be realized to be compatible with any one of DDR2 SDRAM, DDR3 SDRAM, and DDR4 SDRAM.

Figure 48:
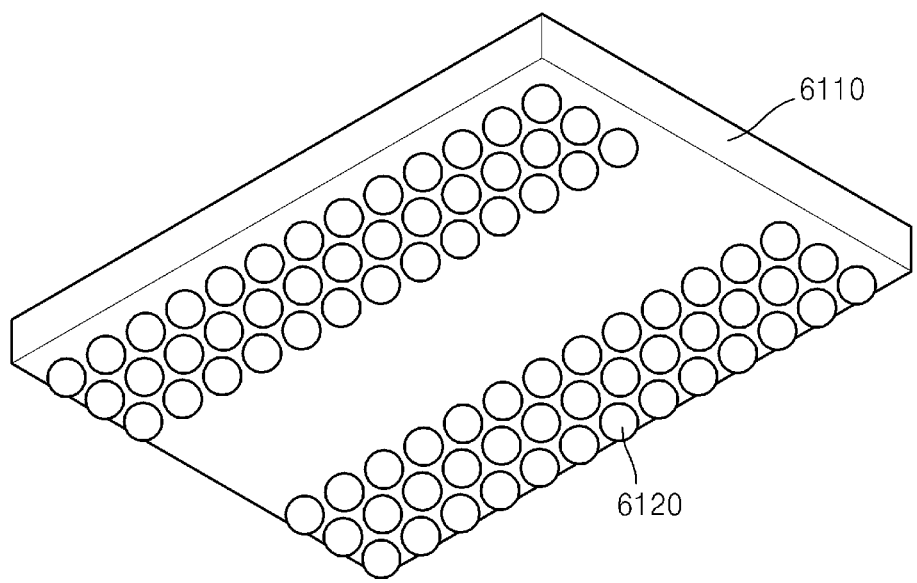
FIG. 48 is a perspective view of a semiconductor memory device package according to an embodiment of the inventive concept.

FIG. 48 is a perspective view of a semiconductor memory device package 6100 according to an embodiment of the inventive concept. Referring to FIG. 48, the semiconductor memory device package 6100 includes a semiconductor memory device body 6110 and a ball grid array (BGA) 6120. The BGA 6120 includes a plurality of solder balls. The plurality of solder balls may connect the semiconductor memory device body 6110 and a printed circuit board (PCB) (not shown). The solder balls may be formed of a conductive material. The semiconductor memory device package 6100 may include an MRAM device.

FIGS. 49A through 49B show arrangements of a BGA of a semiconductor memory device, according to embodiments of the inventive concept. Referring to FIG. 49A, when an MRAM package is used for an X4 or X8 data input/output specification, a BGA may be arranged in 13 rows and 9 columns. The 13 rows are defined as rows A through N and the 9 columns are defined as columns 1 through 9.

The columns 1 through 3 and 7 through 9 of the BGA may be solder ball regions. Solder balls (O) may be provided in the solder ball regions. The columns 4 through 6 of the BGA may be a dummy ball region (+). A solder ball is not provided in the dummy ball region. In other words, in the BGA, 78 solder balls total may be provided.

Referring to FIG. 49B, when an MRAM package is used for an X16 data input/output specification, a BGA may be arranged in 16 rows and 9 columns. The 16 rows are defined as rows A through T and the 9 columns are defined as columns 1 through 9. The columns 1 through 3 and 7 through 9 of the BGA may be solder ball regions, and the columns 4 through 6 of the BGA may be a dummy ball region (+). In the BGA, 96 solder balls total may be provided.

FIGS. 50 and 51 show signals assigned to a semiconductor memory device package. Referring to FIG. 50, pins of an MRAM package may be arranged to be compatible with DDR3 SDRAM. A pin arrangement includes power supply voltages VDD and VDDQ, ground voltages VSS and VSSQ, data input/output signals DQ0 through DQ7, address signals A0 through A14, clock signals CK and CK#, a clock enable signal CKE, and command signals CAS#, RAS#, and WE#.

Referring to FIG. 51, pins of an MRAM package may be arranged to be compatible with DDR4 SDRAM. A pin arrangement includes power supply voltages VDD, VPP, and VDDQ, ground voltages VSS and VSSQ, data input/output signals DQ0 through DQ7, address signals A0 through A17, clock signals CK_t and CK_c, a clock enable signal CKE, and command signals CAS_n, RAS_n, and WE_n.

Figure 52:
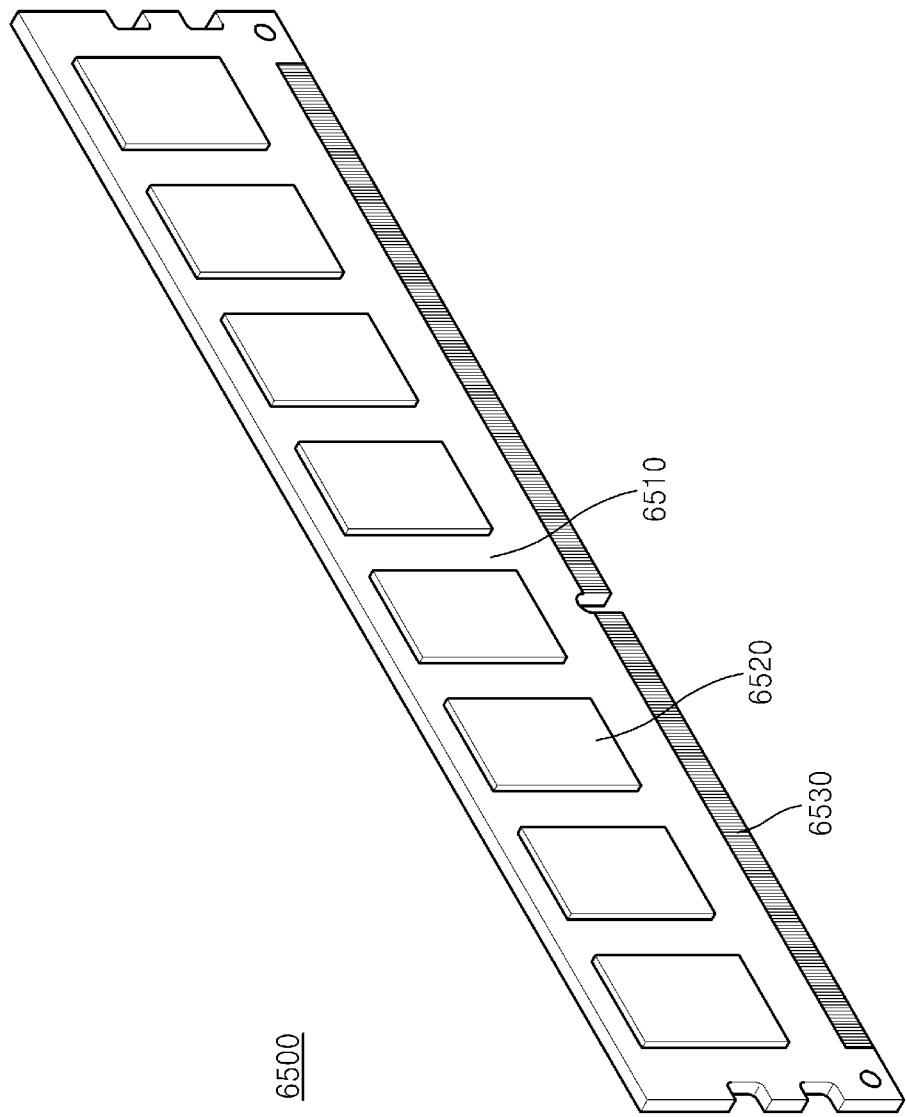
FIGS. 52, 53 and 54 are perspective views of memory modules including a semiconductor memory device, according to embodiments of the inventive concept.
Figure 53:
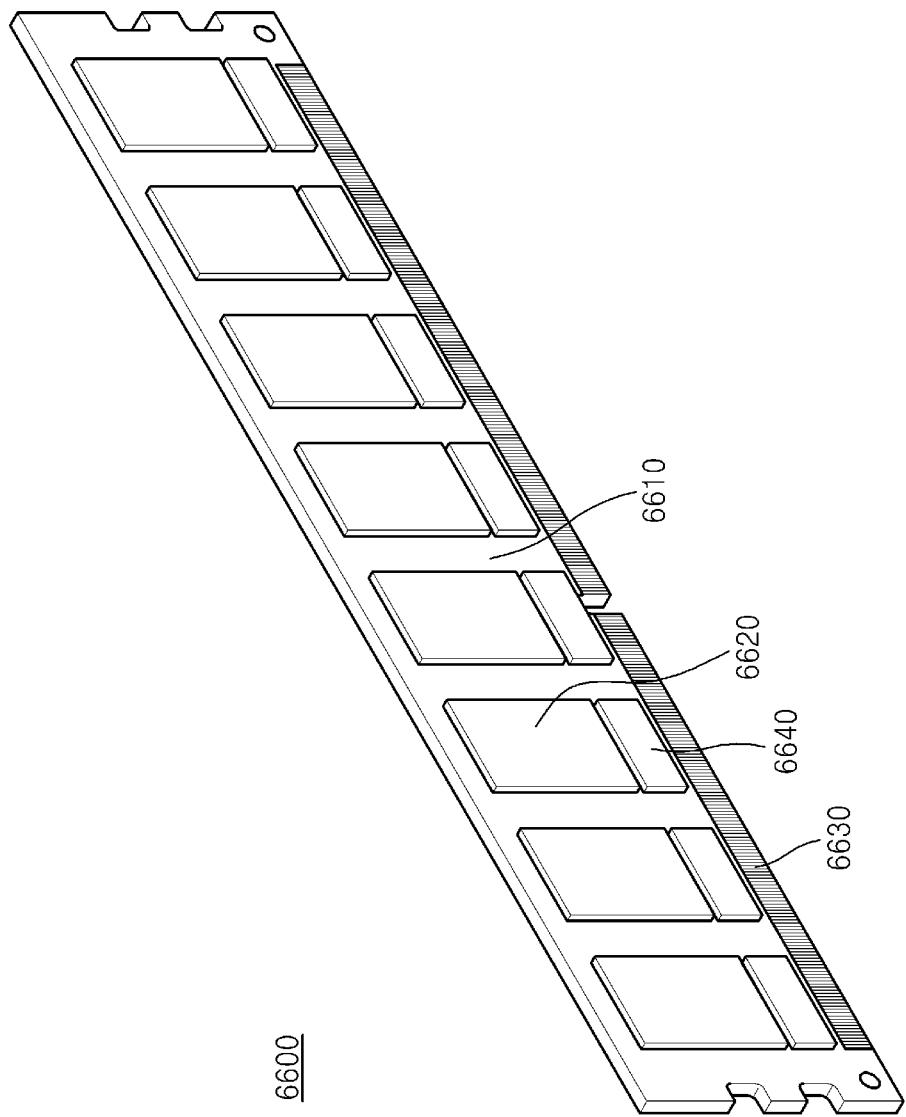
Figure 54:
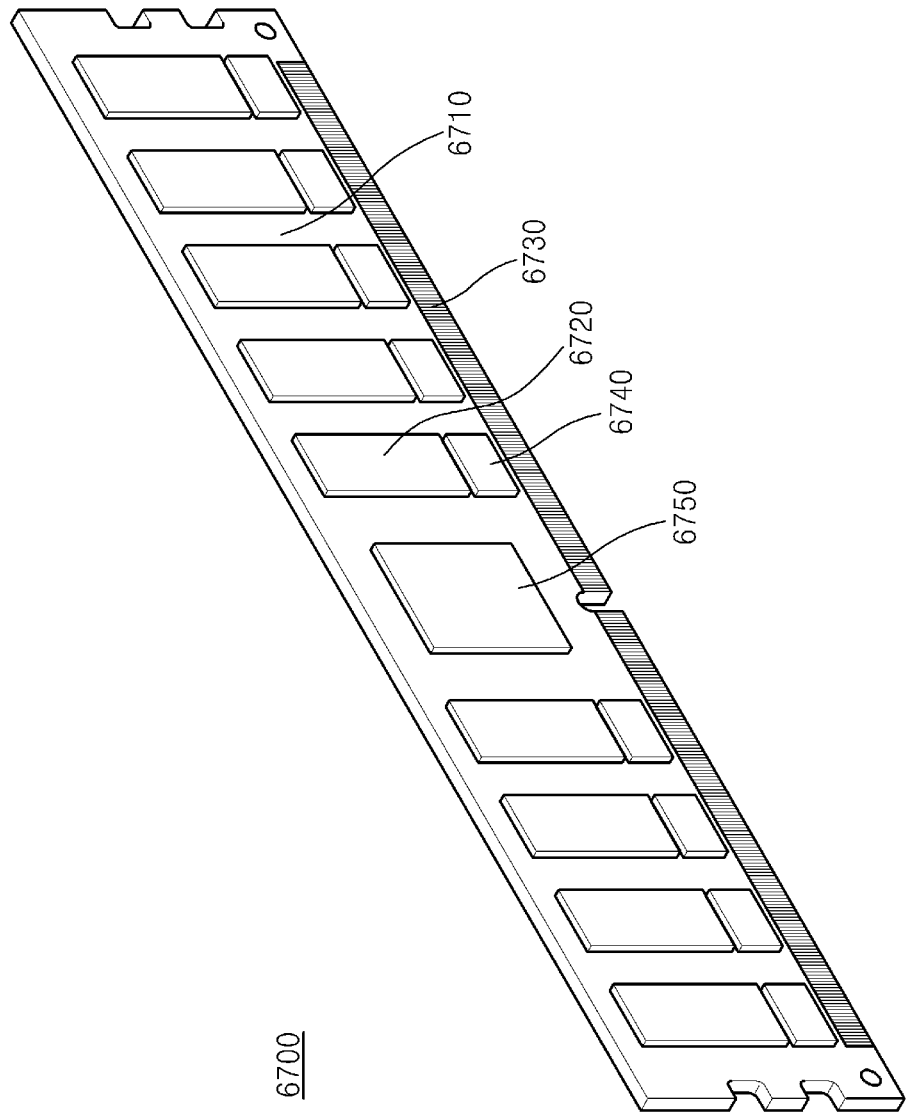

FIGS. 52 through 54 are perspective views of memory modules 6500, 6600, and 6700 including a semiconductor memory device, according to embodiments of the inventive concept.

Referring to FIG. 52, the memory module 6500 includes a PCB 6510, a plurality of MRAM chips 6520, and a connector 6530. The MRAM chips 6520 may be combined to top and bottom surfaces of the PCB 6510. The connector 6530 is electrically connected to the MRAM chips 6520 through conductive lines (not shown). Also, the connector 6530 may be connected to a slot of an external host (not shown).

Although not shown in FIG. 52, each MRAM chip 6520 may include a mode register capable of programming various functions, features, and modes of the corresponding MRAM chip 6520. The mode register may control a burst length, a read burst type, CL, a test mode, a DLL reset, write recovery and read command-to-precharge command features, and DLL use during precharge power down. The mode register may store data for controlling DLL enable/disable, output drive strength, AL, write labeling enable/disable, TDQS enable/disable, and output buffer enable/disable.

In addition, when the MRAM chip 6520 includes a plurality of banks and bank groups, a mode register may store mode data for access to data between the bank groups and mode data for access to data between the banks included in a single bank group. In addition, when at least two column selecting lines are arranged to correspond to a single bit line, the mode register may store mode data for controlling data transfer via the at least two column selection lines when data is input and output, or may store the mode data for masking data by controlling a column selecting signal when data masking is performed or by controlling an input/output driver. In addition, when the power down mode may be applied to the MRAM chips 6520, the mode register may store the mode data for setting various power down modes according to a command from an external source and an operation state of the MRAM chip 6520.

Referring to FIG. 53, the memory module 6600 includes a PCB 6610, a plurality of MRAM chips 6620, a connector 6630, and a plurality of buffers 6640. The buffers 6640 may be disposed between the MRAM chips 6620 and the connector 6630 or may each be embodied as a separate semiconductor chip.

The MRAM chips 6620 and the buffers 6640 may be disposed on upper and lower surfaces of the PCB 6610. The MRAM chips 6620 and the buffers 6640 that are formed on the upper and lower surfaces of the PCB 6610 may be connected via plurality of via holes. As described above, the MRAM chips 6620 may each include a mode register capable of programming various functions, properties, and modes corresponding to a corresponding MRAM chip 6620.

Referring to FIG. 54, the memory module 6700 includes a PCB 6710, a plurality of MRAM chips 6720, a connector 6730, a plurality of buffers 6740, and a controller 6750. The MRAM chips 6720 and the buffers 6740 may be disposed on upper and lower surfaces of the PCB 6710. The MRAM chips 6720 and the buffers 6740 that are formed on the upper and lower surfaces of the PCB 6710 may be connected via a plurality of via holes.

The controller 6750 may communicate with the MRAM chips 6720 and the buffers 6740 and may control an operating mode of the MRAM chips 6720. The controller 6750 may control various functions, properties, and modes by using a mode register of the MRAM chips 6720.

The memory modules 6500, 6600, and 6700 may be applied to a memory module such as a single in-line memory module (SIMM), a dual in-line memory module (DIMM), a small-outline DIMM (SO-DIMM), an unbuffered DIMM (UDIMM), a fully-buffered DIMM (FBDIMM), a rank-buffered DIMM (RBDIMM), a load-reduced DIMM (LRDIMM), a mini-DIMM, and a micro-DIMM.

Figure 55:
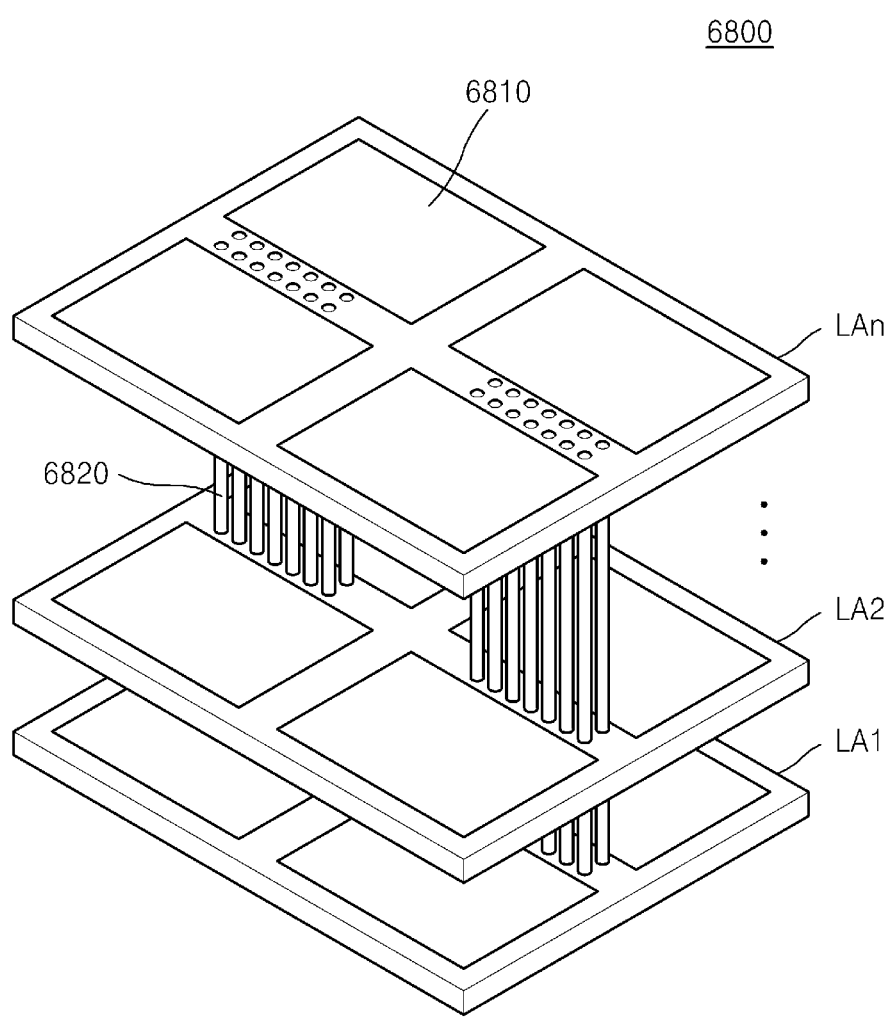
FIG. 55 is a schematic diagram of a semiconductor memory device having a stack structure including a plurality of semiconductor layers, according to an embodiment of the inventive concept.

FIG. 55 is a schematic diagram of a semiconductor memory device 6800 having a stack structure including a plurality of semiconductor layers LA1 to LAn, according to an embodiment of the inventive concept. In a module structure of FIGS. 52 through 54, each MRAM chip 6520, 6620, and 6720 may include a plurality of semiconductor layers LA1 to LAn.

Each of the semiconductor layers LA1 to LAn may be a memory chip including cell arrays 6810 formed of STT-MRAM cells, wherein some of the semiconductor layers LA1 to LAn are master chips performing an interface with an external controller, and the other semiconductor layers LA1 through LAn are slave chips storing data. In FIG. 55, the semiconductor layer LA1 disposed at the bottom may be a master chip and the other semiconductor layers LA2 through LAn may be slave chips.

In the semiconductor memory device 6800, the semiconductor layers LA1 to LAn having a stack structure may be connected to each other via a through silicon via (TSV) 6820.

Alternatively, a signal may be transferred between the semiconductor layers LA1 through LAn using an optical IO connection. As other alternatives, the semiconductor layers LA1 through LAn may be connected to each other via a radiation method using radio frequency (RF) waves or ultrasonic waves, a inductive coupling method using magnetic induction, or a non-radiation method using magnetic field resonance.

The aforementioned radiative method is a method of wirelessly transmitting a signal by using an antenna, such as a monopole or planar inverted-F antenna (PIFA). Radiation is generated as electric fields or magnetic fields changing according to time affect each other, and a signal may be received according to polarization features of incident waves when there is an antenna at the same frequency.

The aforementioned inductive coupling method is a method of generating a strong magnetic field in one direction by winding a coil a plurality of times, and generating coupling by approaching a coil resonating at a similar frequency.

The aforementioned non-radiative method is a method of using evanescent wave coupling that moves electric waves between two media resonating at the same frequency through a short distance electromagnetic field.

Figure 56:
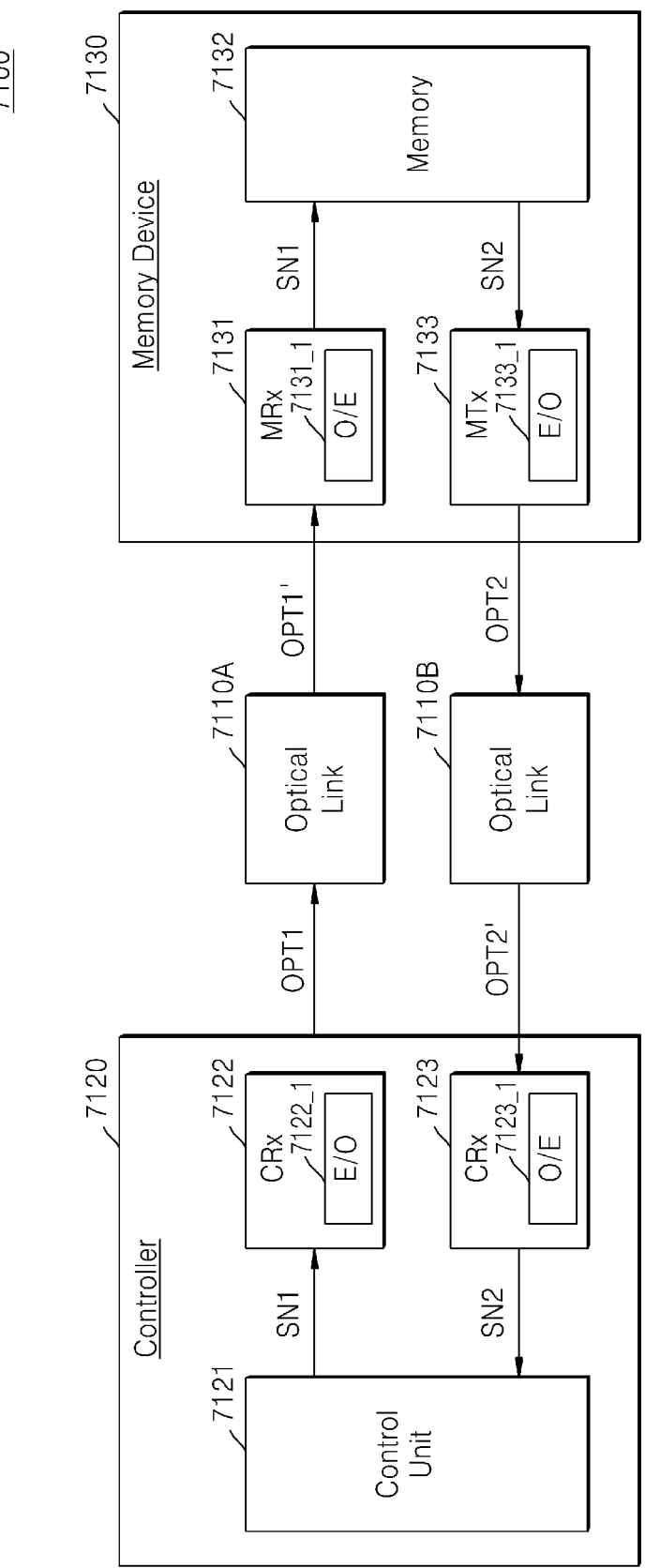
FIG. 56 is a diagram of a memory system including optical links, according to an embodiment of the inventive concept

FIG. 56 is a diagram of a memory system 7100 including optical links 7110A and 7110B, according to an embodiment of the inventive concept. Referring to FIG. 56, the memory system 7100 includes a controller 7120, a semiconductor memory device 7130 including an STT-MRAM cell, and the optical links 7110A and 7110B for interconnecting the controller 7120 and the semiconductor memory device 7130 to each other. The controller 7120 includes a control unit 7121, a first transmitter 7122, and a first receiver 7123. The control unit 7121 transmits a first electric signal SN1 to the first transmitter 7122. The first electric signal SN1 may include command signals, clock signals, address signals, or write data transmitted to the semiconductor memory device 7130.

The first transmitter 7122 may include a first optical modulator 7122_1 that converts the first electric signal SN1 into a first optical transmission signal OTP1 and transmits the first optical transmission signal OTP1 to the optical link 7110A. The first receiver 7123 may include a first demodulator 7123_1 that transmits a second optical reception signal OPT2' received from the optical link 7110B to a second electric signal SN2 and transmits the second electric signal SN2 to the control unit 7121.

The semiconductor memory device 7130 includes a second receiver 7131, a memory region 7132 including an STT-MRAM cell, and a second transmitter 7133. The second receiver 7131 may include a second optical demodulator 7131_1 that converts a first optical reception signal OPT1' received from the optical link 7110A to the first electric signal SN1 and transmits the first optical reception signal OPT1' from the optical link 7110A to the memory region 7132.

Data is written in the memory region 7132 in response to the first electric signal SN1 or data read from the memory region 7132 is transmitted to the second transmitter 7133 as the second electric signal SN2. The second electric signal SN2 may include clock signals and read data transmitted to the controller 7120. The second transmitter 7133 may include a second optical modulator 7133_1 that converts the second electric signal SN2 to a second optical data signal OPT2 and transmits the second optical data signal OPT2 to the optical link 7110B.

Figure 57:
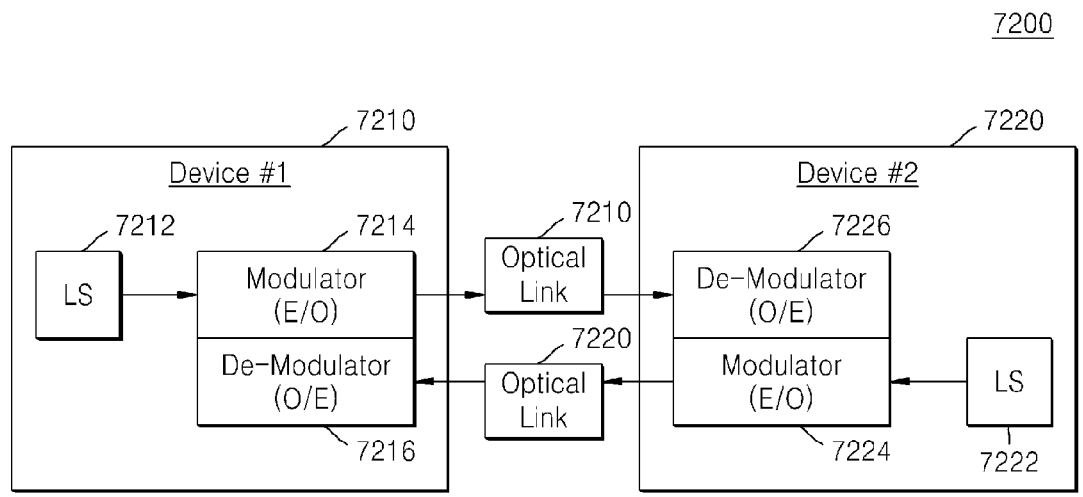
FIG. 57 is a block diagram of a data processing system including optical links, according to another embodiment of the inventive concept.

FIG. 57 is a block diagram of a data processing system 7200 including optical links 7210 and 7220, according to another embodiment of the inventive concept. Referring to FIG. 57, the data processing system 7200 includes a first device 7210, a second device 7220, and the optical links 7210 and 7220. The first device 7210 and the second device 7220 may communicate an optical signal via serial communication.

The first device 7210 may include a first light source 7212, a first optical modulator 7214 for performing an electric to optical conversion operation, and a first optical demodulator 7216 for performing an optical to electric conversion operation. The first device 7210 may further include a memory region (not shown) including an STT-MRAM cell, according to an embodiment of the inventive concept.

The first light source 7212 outputs an optical signal having continuous waves. The first optical demodulator 7216 receives and demodulates an optical signal output from a second optical modulator 7224 of the second device 7220, and outputs the demodulated optical signal.

The second device 7220 includes a second light source 7222, the second optical modulator 7224, and a second demodulator 7226. The second light source 7222 outputs an optical signal having continuous waves. The second device 7220 may further include a memory region (not shown) including an STT-MRAM cell, according to an embodiment of the inventive concept.

The optical links 7210 and 7220 transmit an optical signal output from the first device 7210 to the second device 7220 or transmit an optical signal output from the second device 7220 to the first device 7210.

Figure 58:
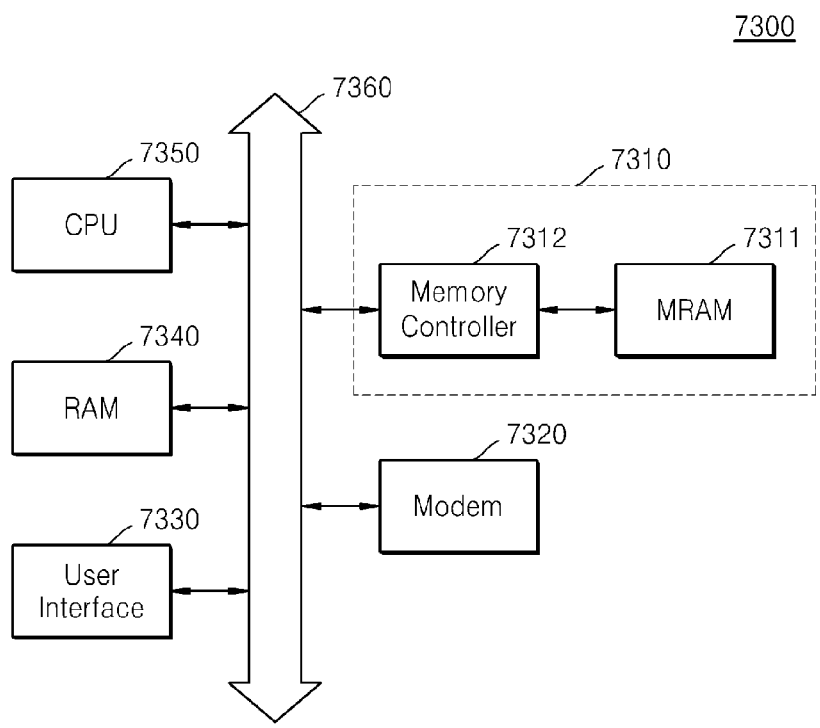
FIG. 58 is a block diagram of an information processing system, that is, a computer system including a semiconductor memory device, according to an embodiment of the inventive concept.

FIG. 58 is a block diagram of an information processing system, that is, a computer system 7300 including a semiconductor memory device 7311, according to an embodiment of the inventive concept. Referring to FIG. 58, the semiconductor memory device 7311 may be installed on the computer system 7300 such as a mobile device, a desktop computer, or the like. The computer system 7300 may include a memory system 7310, a modem 7320, a central processing unit (CPU) 7350, a random access memory (RAM) 7340, and a user interface 7330, which are electrically connected to a system bus 7360. The semiconductor memory device 7311 may be an MRAM chip including an STT-MRAM cell and the memory system 7310 may be an MRAM system including an MRAM chip.

The memory system 7310 may include the semiconductor memory device 7311 and a memory controller 7312. The semiconductor memory device 7311 may store data processed by the CPU 7350 or data input from an external source.

A semiconductor memory device including an STT-MRAM cell may be applied to the semiconductor memory device 7311 for storing a large amount of data required by the computer system 7300 or the RAM 7340 for storing data requiring high speed access, such as system access. Although not shown in FIG. 58, it will be apparent to one of ordinary skill in the art that the computer system 7300 may further include an application chipset, a camera image processor (CIS), an input/output apparatus, or the like.

Figure 59:
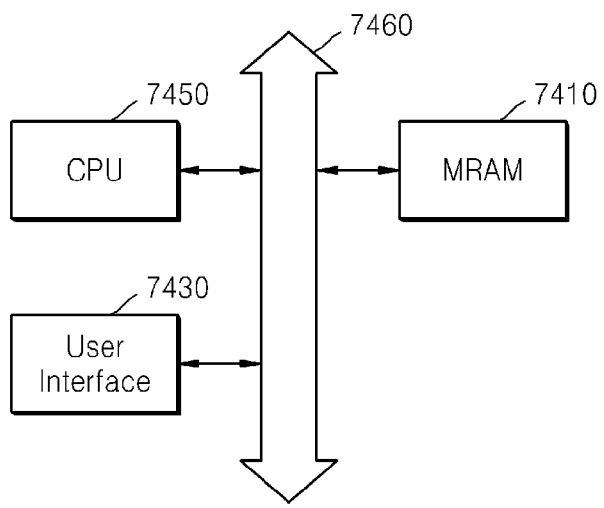
FIG. 59 is a block diagram of an information processing system, that is, a computer system including a semiconductor memory device, according to an embodiment of the inventive concept.

FIG. 59 is a block diagram of an information processing system, that is, a computer system 7400 including a semiconductor memory device 7410, according to an embodiment of the inventive concept. Referring to FIG. 59, the semiconductor memory device 7410 including an STT-MRAM cell may be installed on the computer system 7400 such as a mobile device or a desktop computer, or the like. The computer system 7400 may include the semiconductor memory device 7410, a CPU 7450, and a user interface 7430, which are electrically connected to a system bus 7460.

A STT-MRAM is a next generation memory having the relatively low cost and high memory capacity properties of a DRAM, the high operational speed properties of an SRAM, and the non-volatile properties of a flash memory. A typical system separately includes a cache memory having a quick processing speed, a RAM, and a storage unit for high capacity storage of data. In contrast, according to an embodiment of the inventive concept, these separate memories may be replaced by a single MRAM system. This allows for the benefits associated with a simplified memory structure.

Figure 60:
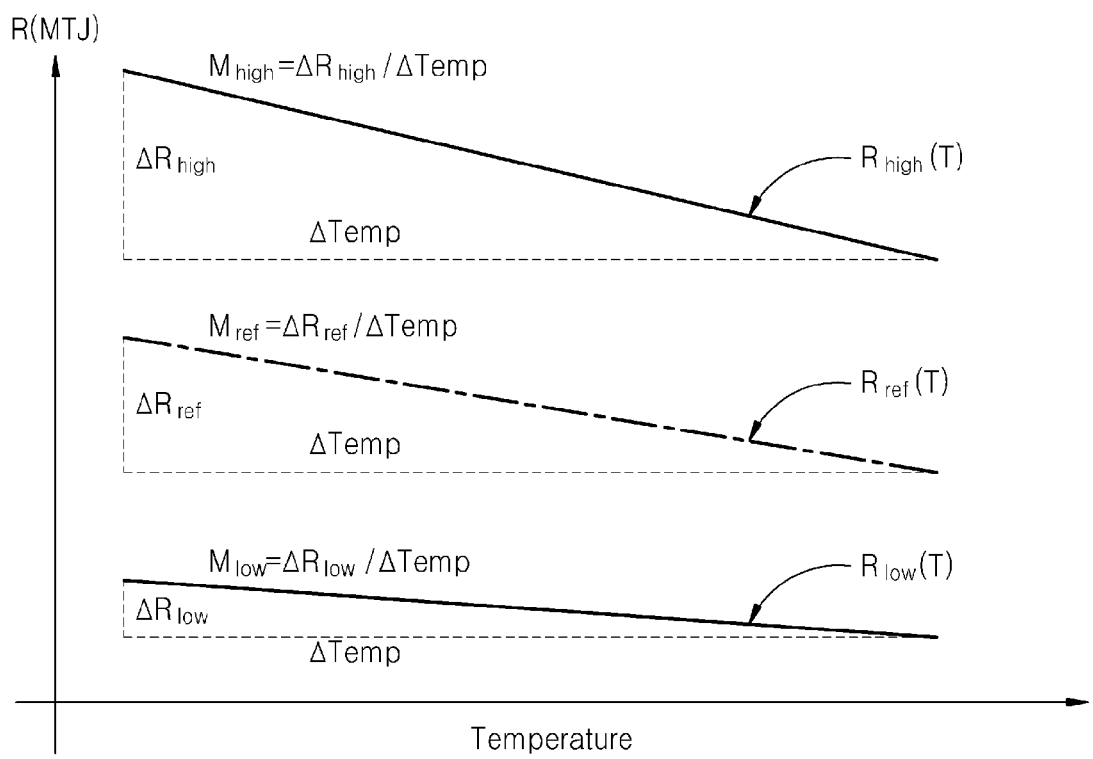
FIG. 60 is a graphical diagram of variations of resistance values relative to changes in temperature of an MTJ in an MRAM according to an embodiment of the inventive concept.

FIG. 60 is a graphical diagram of variations of resistance values of the MTJ in the MRAM, compared to changes in temperature. The MTJ may change the resistance values according to changes in temperature inside the memory device. Thus, when a read power or a write power is provided regardless of changes in temperature during data read or data write, operation of the data read or data write may not be carried out properly. Therefore, the MRAM according to an embodiment of the inventive concept, which supports the operation of the data read or data write based on temperature compensation, is described as follows.

As shown in FIG. 60, when Data 1 is recorded in the MTJ, the MTJ may have a high resistance value. On the contrary, when Data 0 is recorded in the MTJ, the MTJ may have a relatively low resistance value. The resistance value of the MTJ based on Data 1 is defined as a first resistance value (Rhigh(T)), the resistance value of the MTJ based on Data 0 is defined as a second resistance value (Rlow(T)), and a reference resistance value (Rref(T)) may have a median value approximately between the first resistance value Rhigh(T) and the second resistance value Rlow(T). As various parameters according to changes in the resistance values compared to temperature, a coefficient of variation (e.g., Mhigh, Mref, and Mlow) may be identified.

As temperature increases, the resistance value of the MTJ may be reduced. That is, the first resistance value Rhigh(T) which is relatively large may be changed more rapidly for the changes in temperature, whereas the second resistance value Rlow(T) which is relatively small may be changed relatively slowly. For example, when a voltage (e.g., a DC voltage) is supplied to record Data 1 on the MTJ, and an approximately constant current has to be applied to the MTJ. When temperature of the MRAM is high and a certain level of the voltage is supplied, a relatively large current flows through the MTJ, which may cause damage to the MTJ (due to a relatively small resistance value). On the contrary, when temperature of the MRAM is low and a certain level of the voltage is supplied, a relatively small current flows through the MTJ (due to a relatively large resistance value), which may cause an error in the data write operation.

During the data read operation, temperature compensation may be required. That is, when a read current is applied to the MTJ to read data stored in the MTJ and the same level of the current is also applied thereto, a relatively low level of the voltage may be detected (due to a relatively low resistance value) even if the temperature is high. On the contrary, if the temperature is low, a relatively high level of the voltage may be detected (due to a relatively large resistance value). Thereby, an error in the data read operation may occur.

Figure 61A:
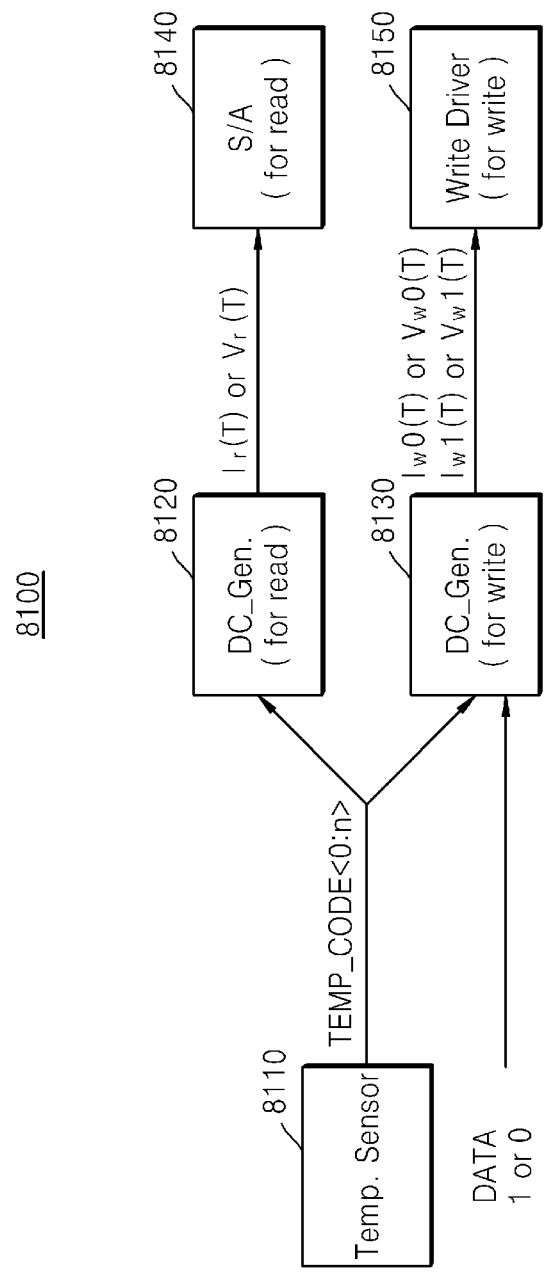
FIGS. 61A and 61B are block diagrams of a MRAM 8100, according to another embodiment of the inventive concept.
Figure 61B:
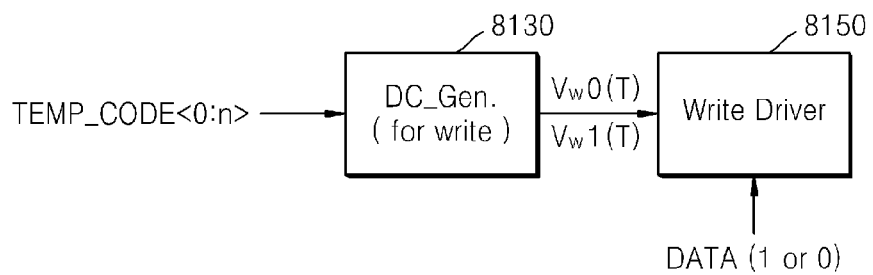

FIGS. 61A and 61B are block diagrams of a MRAM 8100, according to another embodiment of the inventive concept. Referring to FIG. 61A, the MRAM 8100 includes a temperature sensor 8110, a first power generator 8120, a second power generator 8130, a sense amplifier 8140, and a write driver 8150. For example, the first power generator 8120 may be a current generator generating a read current, whereas the second power generator 8130 may be a voltage generator generating a write voltage.

The temperature sensor 8110 outputs a temperature code (TEMP_CODE<0:n>) as a result of sensing the temperature. The first power generator 8120 and the second power generator 8130 each receive the temperature code (TEMP_CODE<0:n>) and generate a power having levels that are adjusted according to the temperature. As described above, it is assumed that the first power generator 8120 generates the read current and the second power generator 8130 generates the write voltage. However, the embodiment of the inventive concept is not limited thereto, and the read and write operations may be performed in various forms. For example, the data stored in the MTJ may be read by using the read voltage, or data may be stored in the MTJ by using the write current.

The first power generator 8120 generates a read current (Ir(T)) having levels that are adjusted according to the temperature code (TEMP_CODE<0:n>), and provides the current to the sense amplifier 8140. The first power generator 8120 may generate the read current Ir (T) having levels that are adjusted according to changes in temperature, and for example, the first power generator 8120 may generate the read current Ir (T) based on variations (or coefficients of variations) of the reference resistance value Rref(T) as shown in FIG. 60.

Similarly, the second power generator 8130 generates a write voltage having levels that are adjusted according to the temperature code (TEMP_CODE<0:n>), and provides the voltage to the write driver 8150. The write voltage may include a first write voltage (Vw0(T)) to record Data 0 and a second write voltage (Vw1(T)) to record Data 1.

In terms of adjusting levels of the write voltage according to the temperature code (TEMP_CODE<0:n), the second power generator 8130 may adjust the levels based on different variations (or coefficients of variations) during the record of the Data 0 and Data 1. For example, as shown in FIG. 60, the level variations of the write voltage may be set to be small according to changes in temperature during the record of the Data 0. Also, the level variations of the write voltage may be set to be large according to changes in temperature during the record of the Data 1. According to an embodiment of the inventive concept, data information to be written may be provided by the second power generator 8130, and accordingly the second power generator 8130 generates the temperature-compensated first write voltage Vw0 (T) and/or the second write voltage Vw1 (T) having temperature based on the temperature code (TEMP_CODE<0:n>) and the data information FIG. 61B, as an another embodiment of the inventive concept, is a diagram of the second power generator 8130 that generates the first write voltage Vw0 (T) and the second write voltage Vw1 (T) regardless of the data information to be recorded. Referring to FIG. 61B, the second power generator 8130 receives the temperature code (TEMP_CODE<0:n>) from the temperature sensor (not shown), and accordingly the temperature-compensated first write voltage Vw0 (T) and the second write voltage Vw1 (T) are generated. The second power generator 8130 includes variation information of the resistance value of the MTJ according to changes in temperature during the record of the Data 1 and the Data 0. The second power generator 8130 supplies the temperature-compensated first write voltage Vw0 (T) and the second write voltage Vw1 (T) to the write driver 8150. Then, the write driver 8150 receives data information to be written, and writes the Data 0 or Data 1 on the MTJ according to the received data information.

Figure 62:
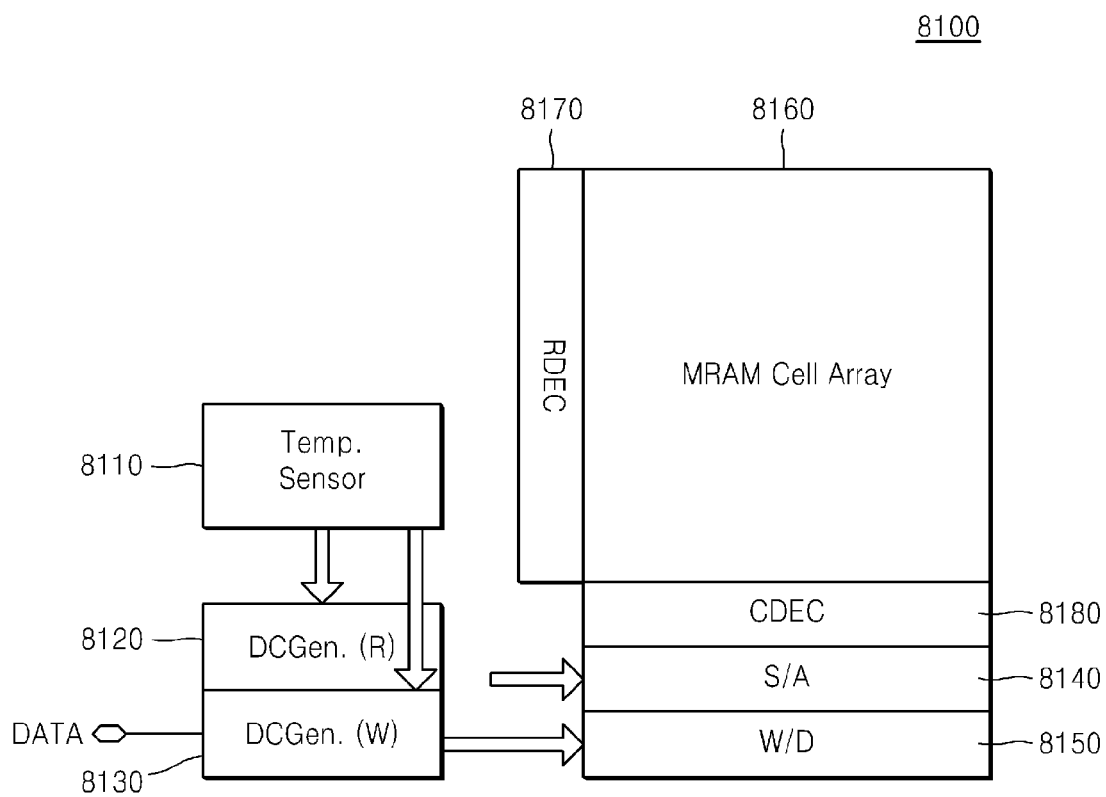
FIG. 62 is a block diagram of a MRAM according to an embodiment of the inventive concept including components of FIGS. 61A and 61B.

FIG. 62 is a block diagram of a MRAM according to an embodiment of the inventive concept including the components of FIGS. 61A and 61B. Referring to FIG. 62, the MRAM 8100 includes a temperature sensor 8110, a first power generator 8120, a second power generator 8130, a sense amplifier 8140, and a write driver 8150. Also, the MRAM 8100 further includes a cell array 8160, a row decoder 8170, and a column decoder 8180.

As the above-described embodiment, the temperature information from the temperature sensor 8110 is provided to each of the first power generator 8120 and the second power generator 8130. Also, in order to perform the temperature compensation by applying different coefficients of variations according to the data information to be recorded, the information of Data 1 or Data 0 may be provided to the second power generator 8130. The first power generator 8120 may supply the temperature-compensated read current to the sense amplifier 8140, whereas the second power generator 8130 may supply the temperature-compensated write voltage to the write driver 8150. According to an address (not shown), the row decoder 8170 selects one or more rows, whereas the column decoder 8180 selects one or more columns. Then, the read or write operation is performed on a memory cell of the selected cell array 8160.

Figure 63A:
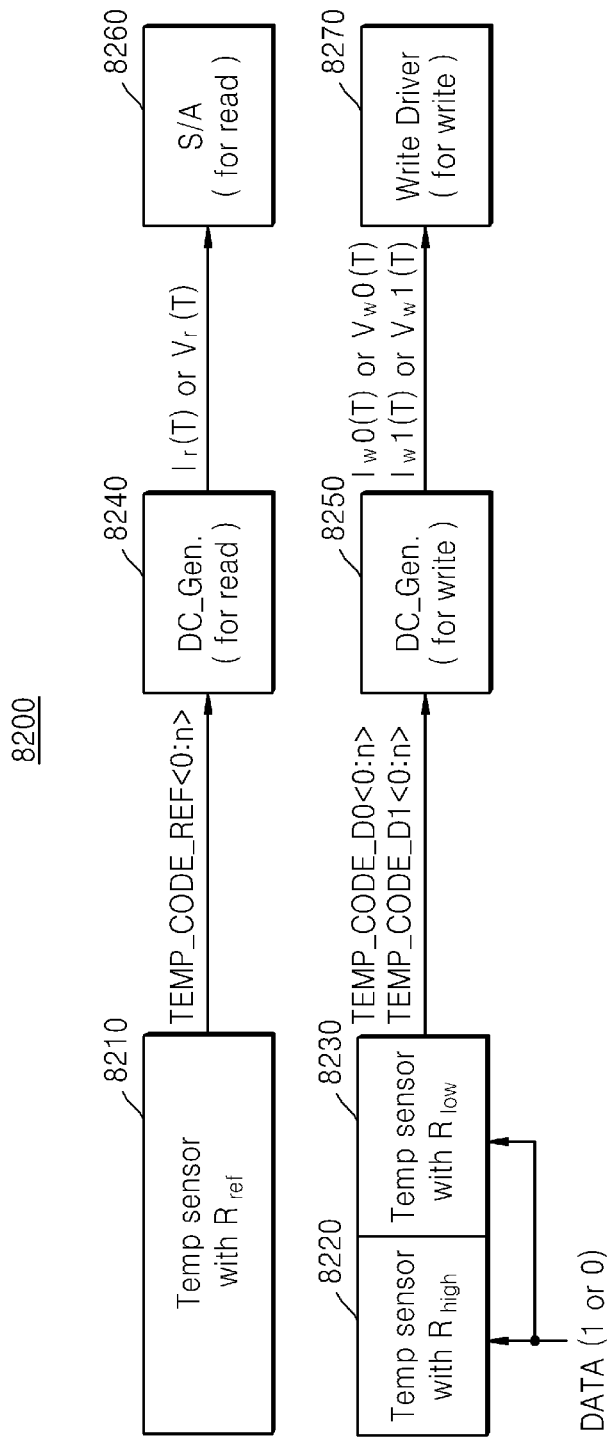
FIGS. 63A and 63B are block diagrams of a MRAM, according to another embodiment of the inventive concept.
Figure 63B:
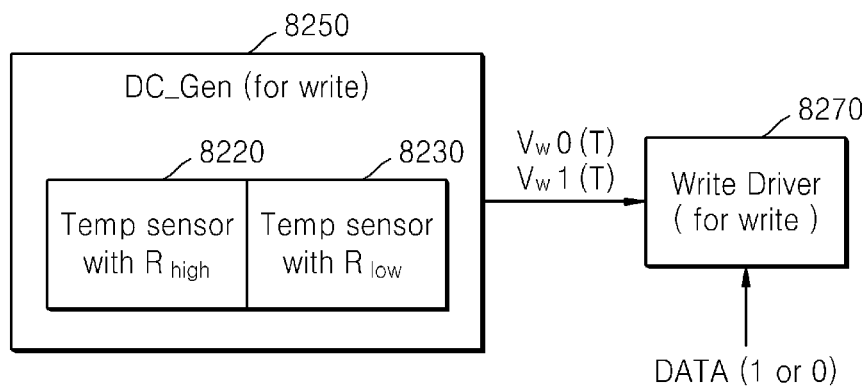

FIGS. 63A and 63B are block diagrams of a MRAM, according to another embodiment of the inventive concept. Referring to FIG. 63A, the MRAM 8200 includes one or more temperature sensors, a first power generator 8240, a second power generator 8250, a sense amplifier 8260, and the write driver 8270. For example, the first power generator 8240 may be a current generator generating a read current, whereas the second power generator 8250 may be a voltage generator generating a write voltage. Also, one or more temperature sensors may include a first temperature sensor 8210 including a resistance value Rref of the MTJ, a second temperature sensor 8220 including a large resistance value (e.g., a resistance value corresponding to Data 1) of the MTJ, and a third temperature sensor 8230 including a small resistance value (e.g., a resistance value corresponding to Data 0) of the MTJ.

Each of the first temperature sensor 8210, the second temperature sensor 8220, and the third temperature sensor 8230 includes the MTJ therein, and in terms of outputting a temperature code, the temperature code applying variations of the resistance values of the MTJ is output. That is, temperature inside the device is sensed, and the temperature code applying variations of the resistance values of the MTJ therein is output to generate the temperature-compensated read current and write voltage during the data read and write operations.

Since each of the first temperature sensor 8210, the second temperature sensor 8220, and the third temperature sensor 8230 includes the MTJ having different coefficients of variations, different values of the temperature codes according to the temperature thereof may be generated. For example, the first temperature sensor 8210 generates a first temperature code (TEMP_CODE_REF<0:n>) and supplies the code to the first power generator 8240, wherein the first temperature code applies variations of the resistance values according to changes in temperature of the MTJ having a reference value Rref. The first power generator 8240 corresponds to the first temperature code (TEMP_CODE_REF<0:n>), generates a read power (that is, a read current Ir(T)), and supplies it to the sense amplifier 8260. The levels of the read current Ir(T) are adjusted by the temperature code that applies variations of the resistance values of the MTJ. Therefore, in terms of data read operation, the variations of the resistance values of the MTJ in the memory cell may be compensated Similarly, the second temperature sensor 8220 generates a second temperature code (TEMP_CODE_D1<0:n>) and a third temperature code (TEMP_CODE_D0<0:n>), and supplies the codes to the second power generator 8250, wherein the second temperature code applies variations of the resistance values according to changes in temperature of the MTJ having a relatively large first resistance value Rhigh and the third temperature code applies variations of the resistance values according to changes in temperature of the MTJ having a relatively small second resistance value Rlow. According to an embodiment of the inventive concept, data information to be written may be provided to the second and third temperature sensors 8220 and 8230, and when data 1 is written, the second temperature code (TEMP_CODE_D1<0:n>) applying variations of the first resistance value Rhigh may be provided to the second power generator 8250. When data 0 is written, the third temperature code (TEMP_CODE_D0<0: n>) applying variations of the second resistance value Rlow may be provided to the second power generator 8250. The second power generator 8250 generates a write voltage (that is, Vw0(T) and Vw1(T)) and supplies the voltage to the write driver 8270, according to the second and third temperature codes applying variations of resistance values of the MTJ.

FIG. 63B is a block diagram of a temperature sensor that is included inside the power generator, according to another embodiment of the inventive concept in. In FIG. 63B, the temperature sensor and the power generator are shown in a separate block from each other, but as shown therein, the power generator may include the temperature sensor or may have a circuit designed in a combination of the power generator and the temperature sensor. Also, in FIG. 63B, only second power generator 8230, which includes the second and third temperature sensors 8220 and 8230, is illustrated, but the first power generator 8240 of FIG. 63A may be designed to include the first temperature sensor 8210.

The second power generator 8250 may include a means of generating the first write voltage Vw1(T) to write data 1 (hereinafter, referred to as the first voltage generator) and a means of generating the second write voltage Vw0(T) to write data 0 (hereinafter, referred to as the second voltage generator). The temperature code from the second temperature sensor 8220 applies variations of the first resistance value Rhigh, and the first voltage generator generates the first write voltage Vw1(T) based on the temperature code from the second temperature sensor 8220. Also, the temperature code from the third temperature sensor 8230 applies variations of the second resistance value Rlow, and the second voltage generator generates the second write voltage Vw0(T) based on the temperature code from the third temperature sensor 8230. The write driver 8270 receives the first and second write voltages Vw1(T) and Vw0(T). The write driver 8270 may receive data information to be written, and may write data 1 or 0 in the memory cell of the cell array according to the received data information.

Figure 64A:
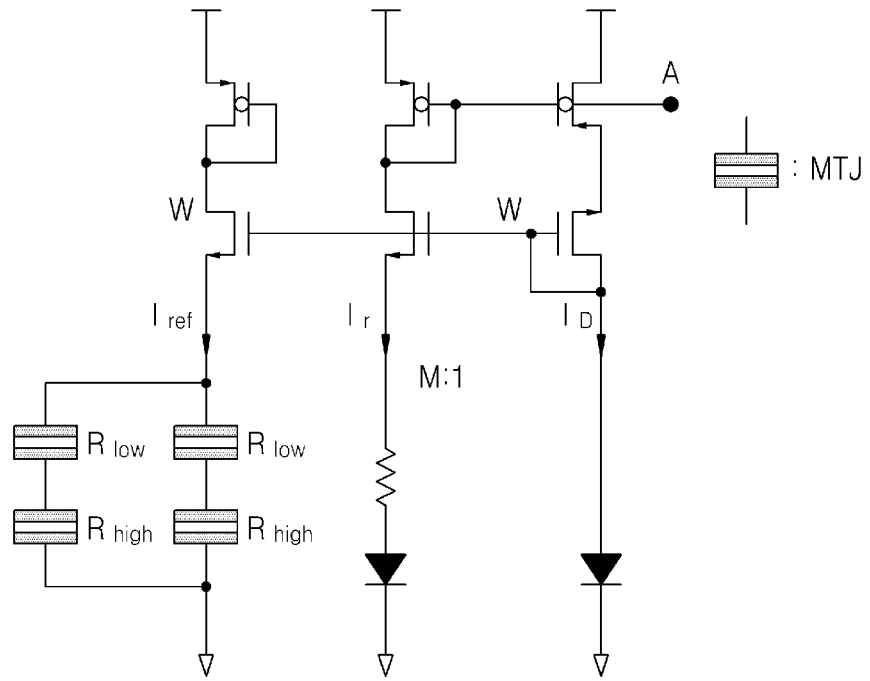
FIGS. 64A, 64B and 64C are circuit diagrams of temperature sensors according to embodiments of the inventive concept.
Figure 64B:
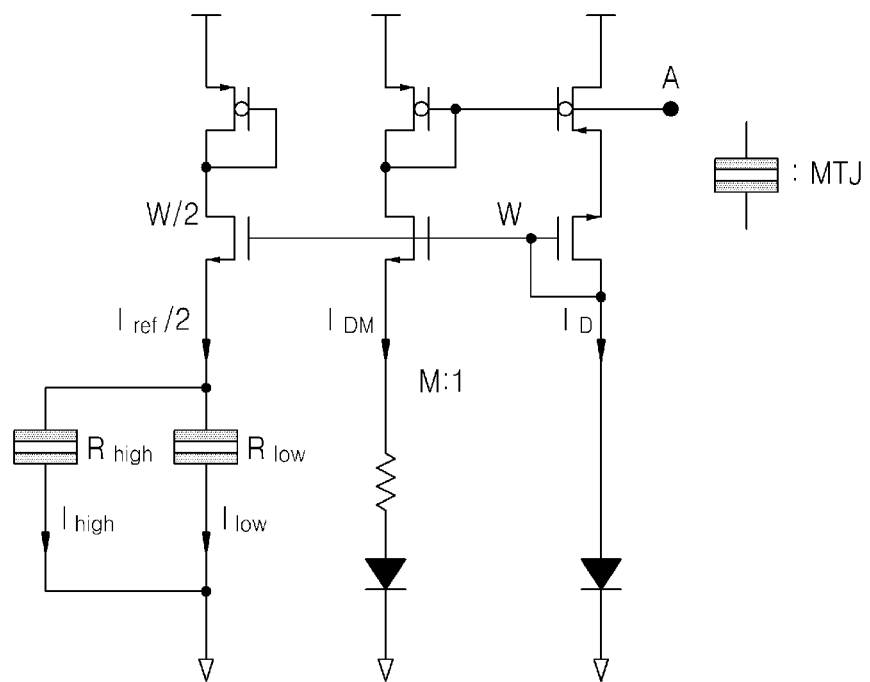
Figure 64C:
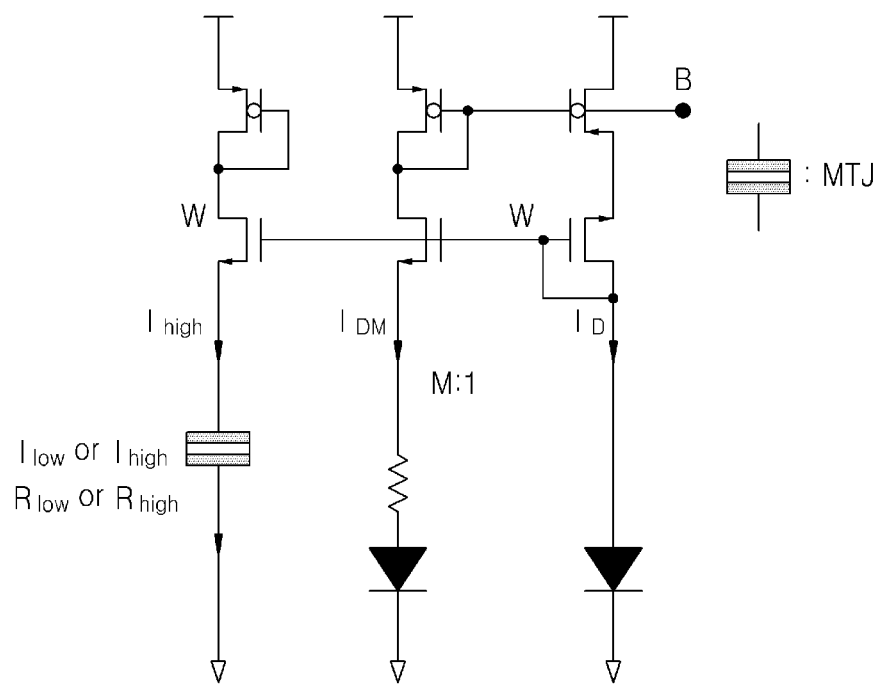

FIGS. 64A through 64C are circuit diagrams of the temperature sensor including the MTJ. FIGS. 64A through 64C may include at least a portion of the circuit consisting the power generator and the temperature sensor.

FIGS. 64A and 64B are circuit diagrams including the first temperature sensor 8210, wherein the first temperature sensor 8210 may include the MTJ having the reference resistance value Rref (or a value related to the reference resistance value Rref). As shown in FIGS. 64A and 64B, the MTJs having the first resistance value Rhigh and the second resistance value Rlow may implement a MTJ having changes in temperature of the reference resistance value Rref. Through any one node A of the circuits shown in FIGS. 64A and 64B, a read current to read data may be generated.

On the contrary, FIG. 64C is a circuit diagram including the second temperature sensor 8220, wherein the second temperature sensor 8220 may include the MTJ having the first resistance value Rhigh. Although not illustrated, the third temperature sensor 8230 may be implemented the same or similarly to the circuit of FIG. 64C. For example, the MTJ having the first resistance value Rhigh in the second temperature sensor 8220 may be replaced by the MTJ ahving the second resistance value Rlow. Through any one node B of the circuit shown in FIG. 64C, a write current to write data may be generated.

Figure 65:
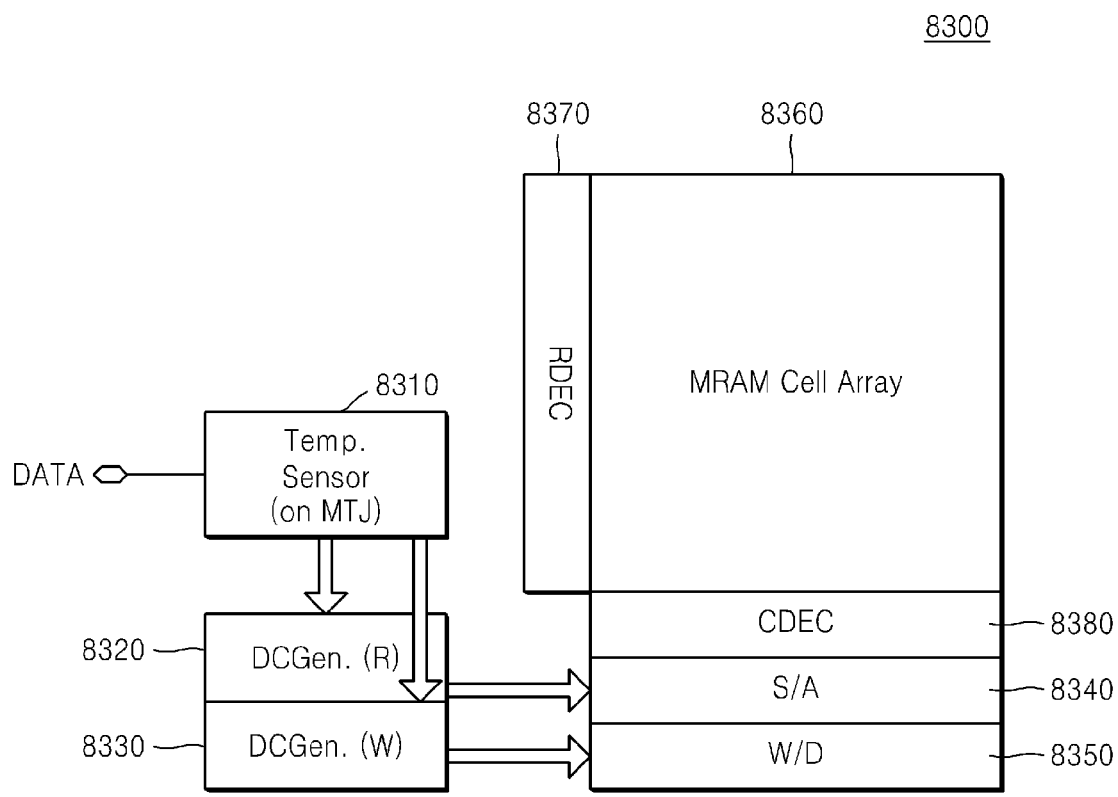
FIG. 65 is a block diagram of a MRAM, according to another embodiment of the inventive concept.

FIG. 65 is a block diagram of a MRAM, according to another embodiment of the inventive concept. Referring to FIG. 65, the MRAM 8300 inlcudes a temperature sensor 8310, a first power generator 8320, a second power generator 8330, a sense amplifier 8340, and a write driver 8350. Also, the MRAM 8300 further includes a cell array 8360, a row decoder 8370, and a column decoder 8380.

As the above-described embodiment, the temperature sensor 8310 includes a MTJ having a resistance value changing according to changes in temperature. Also, the temperature sensor 8310 includes a sensor (i.e., a first sensor) generating a temperature code to compensate for the data read operation, and one or more sensors (i.e., a second sensor and a third sensor) generating a temperature code to compensate for the data write operation. The first sensor generates a temperature code applying a MTJ having a reference resistance value Rref, and the first power generator 8320 generates and supplies the temperature-compensated read current to the sense amplifier 8340. Similarly, the second sensor generates a temperature code applying a MTJ having a first resistance value Rhigh, and the third sensor generates a temperature code applying a MTJ having a second resistance value Rlow. The second power generator 8330 generates and supplies the temperature-compensated write voltage to the write driver 8350. According to an address (not shown) to select a memory cell, the row decoder 8370 selects one or more rows, whereas the column decoder 8380 selects one or more columns, to perform data read or write operation in the selected memory cell of the cell array 8360.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
   a cell array comprising a plurality of non-volatile memory cells;
   a plurality of bit lines connected to the plurality of non-volatile memory cells;
   first and second column selectors connected to the plurality of bit lines and configured to be respectively controlled by first and second column selecting signals,
   wherein each of the plurality of bit lines are connected to respective different pairs of one of the first column selectors and one of the second column selectors;
   a first local input/output line that is electrically connected to the plurality of bit lines via the first column selectors responsive to activation of the first column selecting signals; and
   a second local input/output line that is electrically connected to the plurality of bit lines via the second column selectors responsive to activation of the second selecting signals,
   wherein the first and second selectors are alternately selected responsive to external commands.

2. The semiconductor memory device of claim 1, wherein the first column selecting signals and the second column selecting signals have a period that the first column selecting signals and the second column selecting signals are simultaneously activated.

3. The semiconductor memory device of claim 1, wherein the non-volatile memory cells are spin transfer torque magneto resistive random access memory (STT-MRAM) cells.

4. The semiconductor memory device of claim 1, wherein data is transmitted via the first local input/output line responsive to activation of the first column selectors, and wherein data is transmitted via the second local input/output line responsive to activation of the second column selectors.

5. The semiconductor memory device of claim 1, wherein responsive to selection of different bit lines by commands that are consecutively received, the first column selecting signals and the second column selecting signals have a period that the first column selecting signals and the second column selecting signals are simultaneously activated.

6. The semiconductor memory device of claim 1, wherein responsive to selection of a same bit line by commands that are consecutively received, the first column selecting signals and the second column selecting signals do not have a period that the first column selecting signals and the second column selecting signals are simultaneously activated.

7. The semiconductor memory device of claim 1, wherein each of the first and second selectors comprise a transistor configured to receive one of the first column selecting signals and the second column selecting signals via a gate.

8. The semiconductor memory device of claim 1, wherein the first local input/output line is connected to each of a first write driver and a first sense amplifier, and
   wherein the second local input/output line is connected to each of a second write driver and a second sense amplifier.

9. The semiconductor memory device of claim 8, wherein the cell array comprises a plurality of banks,
   wherein each of the plurality of banks comprises a plurality of blocks, and
   wherein each of the blocks include corresponding first and second local input/output lines, first and second write drivers, and first and second sense amplifiers.

10. The semiconductor memory device of claim 9, further comprising:
    a first global input/output line that is commonly connected to the first write drivers and the first sense amplifiers of the plurality of blocks; and
    a second global input/output line that is commonly connected to the second write drivers and the second sense amplifiers of the plurality of blocks.

11. The semiconductor memory device of claim 10, further comprising a global multiplexer connected to the first and second global input/output lines,
    wherein the global multiplexer outputs data read from the non-volatile memory cells via a data output line.

12. The semiconductor memory device of claim 11, further comprising a global input/output driver connected to the first and second global input/output lines,
    wherein the global input/output driver provides data that is input from an external source via a data input line to the non-volatile memory cells.

13. The semiconductor memory device of claim 12, wherein the first and second global input/output lines, the global multiplexer, and the global input/output driver are arranged to correspond to each of the plurality of blocks.

14. A semiconductor memory device comprising:
    a bit line connected to a plurality of non-volatile memory cells;
    first and second column selectors connected to the bit line and configured to be respectively controlled by first and second column selecting signals;
    a first local input/output line electrically connected to the bit line via the first column selector responsive to activation of the first column selecting signal; and
    a second local input/output line electrically connected to the bit line via the second column selector responsive to activation of the second selecting signal,
    wherein the first and second selectors are alternately selected responsive to external commands.

15. The semiconductor memory device of claim 14, wherein the first column selecting signal and the second column selecting signal have a period that the first column selecting signal and the second column selecting signal are simultaneously activated.

16. The semiconductor memory device of claim 14, wherein the non-volatile memory cells are spin transfer torque magneto resistive random access memory (STT-MRAM) cells.

17. The semiconductor memory device of claim 14, wherein data is transmitted via the first local input/output line responsive to activation of the first column selector, and wherein data is transmitted via the second local input/output line responsive to activation of the second column selectors.

18. The semiconductor memory device of claim 14, wherein each of the first and second selectors comprise a transistor configured to respectively receive the first column selecting signal and the second column selecting signal.

* * * * *